(12) United States Patent
Ausserlechner et al.

(10) Patent No.: US 9,013,890 B2
(45) Date of Patent: Apr. 21, 2015

(54) SEMICONDUCTOR PACKAGES AND METHODS FOR PRODUCING THE SAME

(75) Inventors: Udo Ausserlechner, Villach (AT);
Carsten von Koblinski, Bodensdorf (AT); Sigrid Wabnig, Villach (AT); Volker Strutz, Tegernheim (DE); Robert Grünberger, Nandlstadt (DE)

(73) Assignee: Infineon Technologies AG, Neubiberg (DE)

( * ) Notice: Subject to any disclaimer, the term of this patent is extended or adjusted under 35 U.S.C. 154(b) by 516 days.

(21) Appl. No.: 13/348,531

(22) Filed: Jan. 11, 2012

(65) Prior Publication Data

US 2012/0112365 A1   May 10, 2012

Related U.S. Application Data

(63) Continuation-in-part of application No. 12/732,470, filed on Mar. 26, 2010, now Pat. No. 8,400,139.

(51) Int. Cl.
| | |
|---|---|
| *H05K 7/00* | (2006.01) |
| *G01R 15/20* | (2006.01) |
| *G01R 33/07* | (2006.01) |
| *H01L 23/16* | (2006.01) |
| *H01L 23/31* | (2006.01) |
| *H01L 23/00* | (2006.01) |

(52) U.S. Cl.
CPC .............. *G01R 15/20* (2013.01); *G01R 33/072* (2013.01); *H01L 23/16* (2013.01); *H01L 23/3107* (2013.01); *H01L 2224/32111* (2013.01); *H01L 2224/32237* (2013.01); *H01L 2224/48105* (2013.01); *H01L 2224/48177* (2013.01); *H01L 2224/48227* (2013.01); *H01L 2224/48257* (2013.01); *H01L 2224/49171* (2013.01); *H01L 2224/49177* (2013.01); *H01L 2924/15153* (2013.01); *H01L 24/48* (2013.01); *H01L 24/49* (2013.01); *H01L 2224/32245* (2013.01); *H01L 2224/73265* (2013.01); *H01L 2924/01079* (2013.01); *H01L 2924/01087* (2013.01); *H01L 2224/32257* (2013.01); *H01L 2924/3011* (2013.01)

(58) Field of Classification Search
CPC ................ H01L 2924/00; H01L 2224/32245; H01L 2224/48227; H01L 2224/73265; H01L 2224/48257
USPC ........... 361/760, 783, 749; 174/250; 257/414; 324/117 H, 126, 127, 117 R
See application file for complete search history.

(56) References Cited

U.S. PATENT DOCUMENTS

| | | |
|---|---|---|
| 5,041,780 A | 8/1991 | Rippel |
| 6,404,180 B1 | 6/2002 | Haensgen |
| 6,424,018 B1 | 7/2002 | Ohtsuka |
| 6,504,356 B2 | 1/2003 | Yao et al. |
| 6,759,841 B2 | 7/2004 | Goto et al. |

(Continued)

FOREIGN PATENT DOCUMENTS

DE    10 2006 026 148 A1    12/2007

*Primary Examiner* — Yuriy Semenenko
(74) *Attorney, Agent, or Firm* — Slater & Matsil, L.L.P.

(57) ABSTRACT

In one embodiment, a semiconductor package includes an isolating container having a recess, which forms an inner membrane portion and an outer rim portion. The rim portion is thicker than the membrane portion. The package includes a semiconductor chip disposed in the recess and a backplane disposed under the membrane portion of the isolating container.

24 Claims, 36 Drawing Sheets

(56) References Cited

U.S. PATENT DOCUMENTS

| | | |
|---|---|---|
| 6,995,315 B2 | 2/2006 | Sharma et al. |
| 7,166,807 B2 | 1/2007 | Gagnon et al. |
| 7,816,905 B2 | 10/2010 | Doogue et al. |
| 2005/0189635 A1* | 9/2005 | Humpston et al. ............ 257/678 |
| 2006/0001055 A1* | 1/2006 | Ueno et al. .................... 257/257 |
| 2006/0091993 A1 | 5/2006 | Shoji |
| 2007/0013036 A1* | 1/2007 | Zhe et al. ...................... 257/659 |
| 2008/0297138 A1 | 12/2008 | Taylor et al. |

* cited by examiner

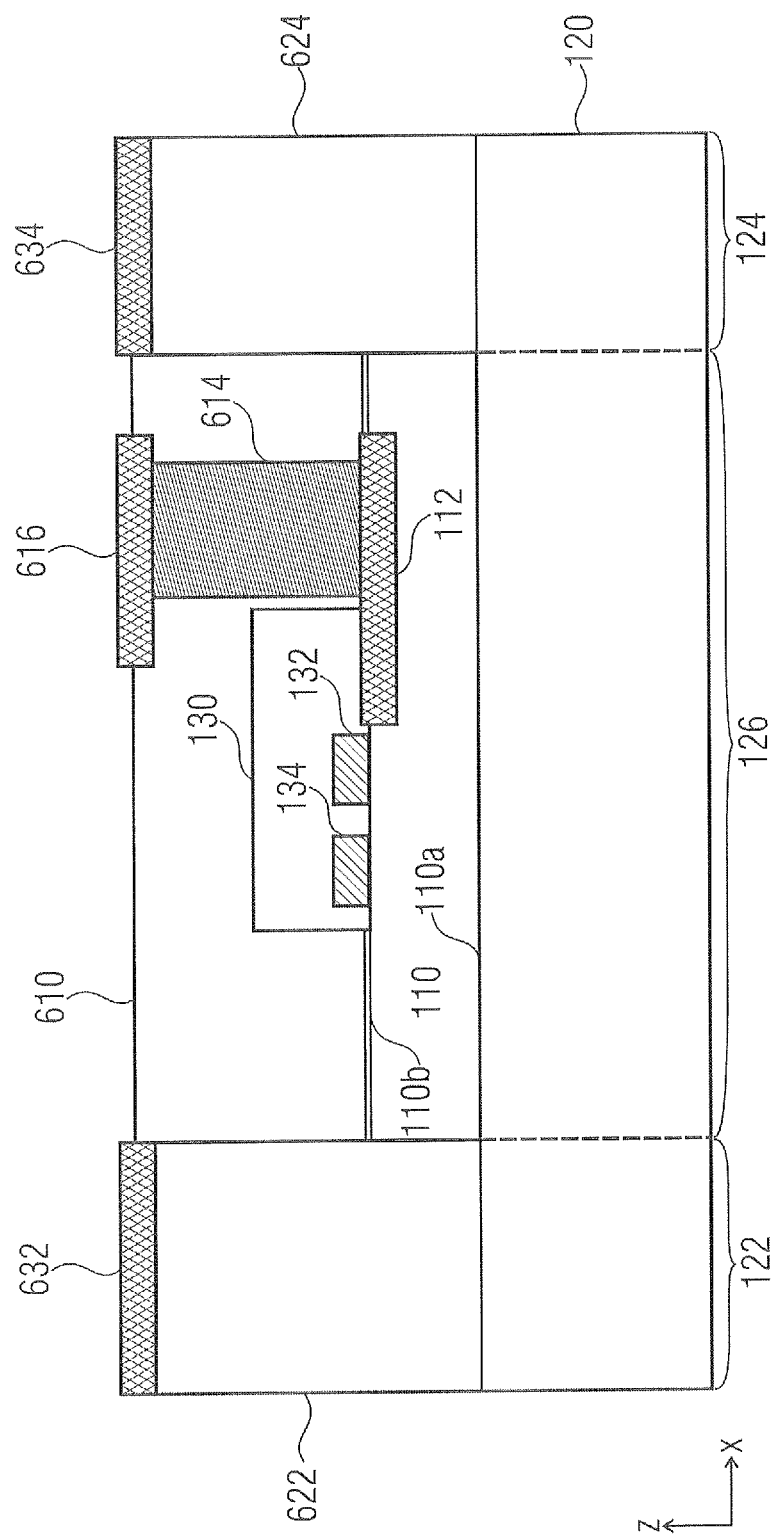

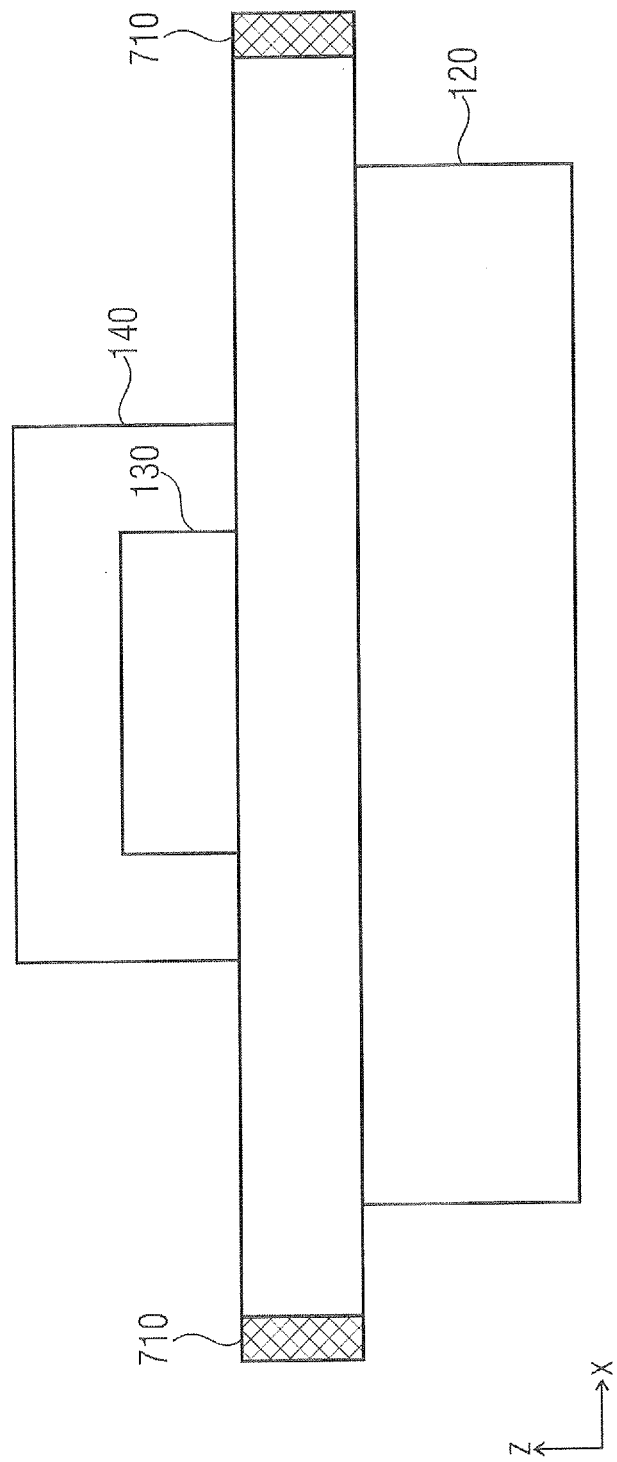

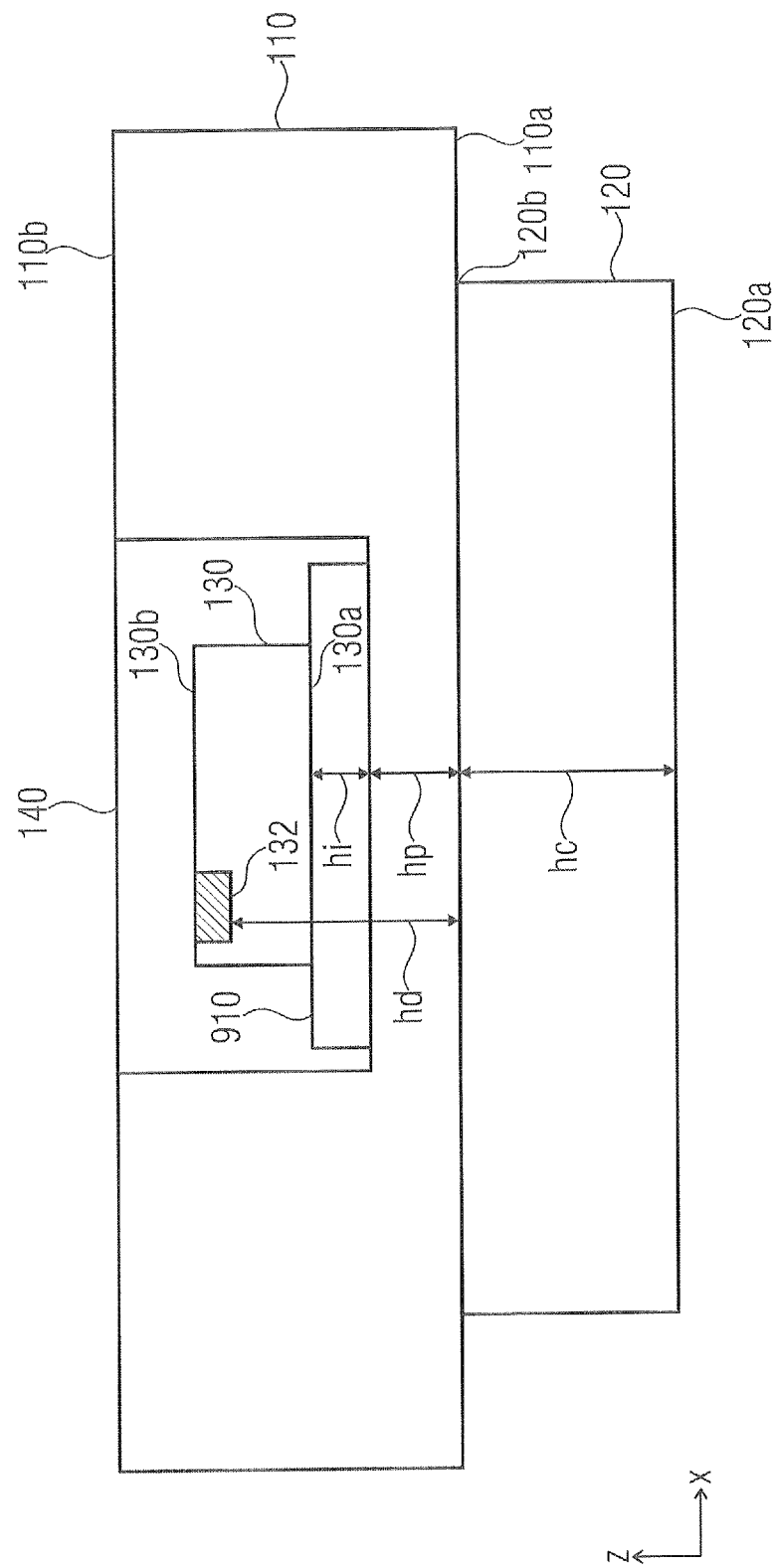

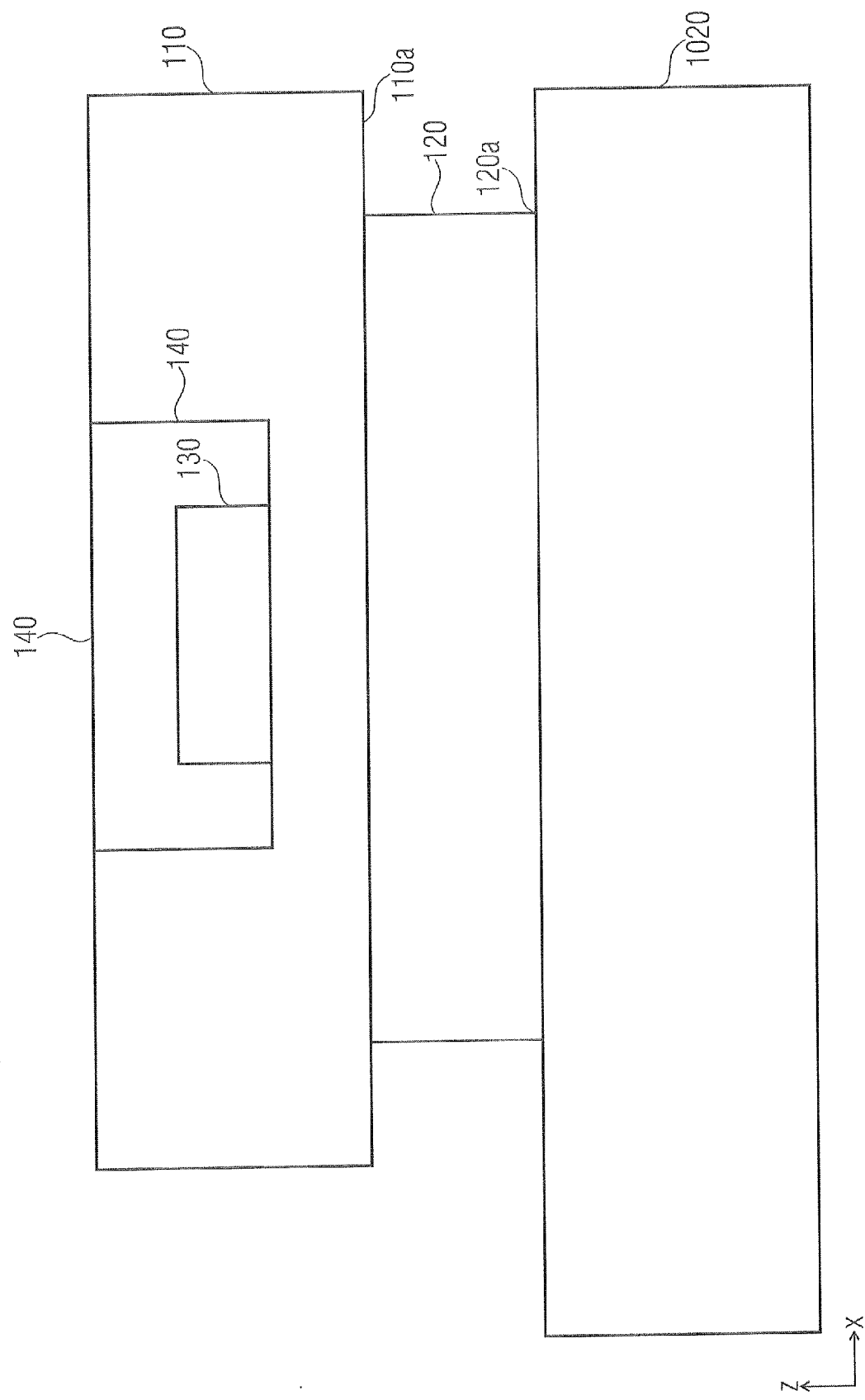

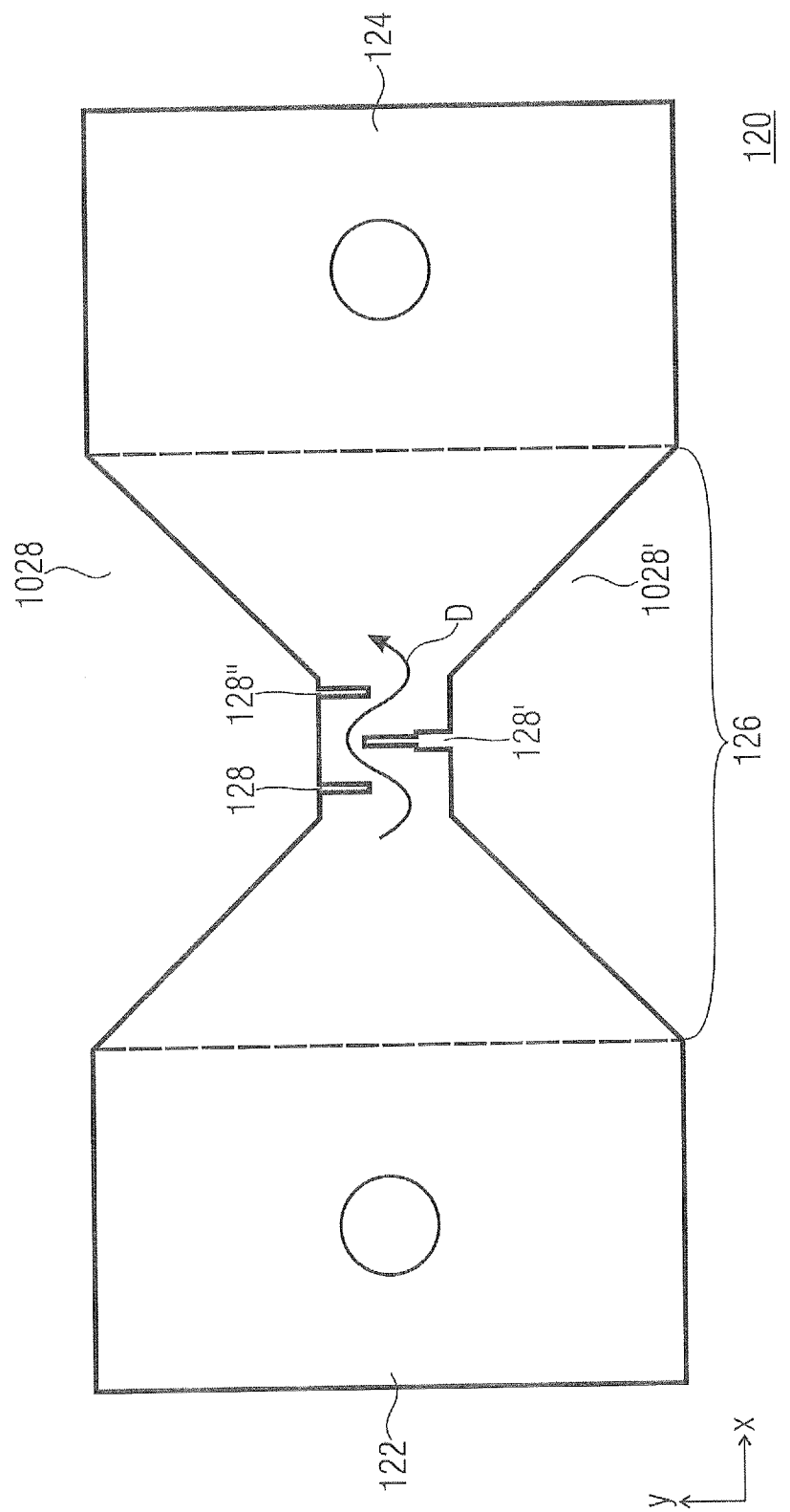

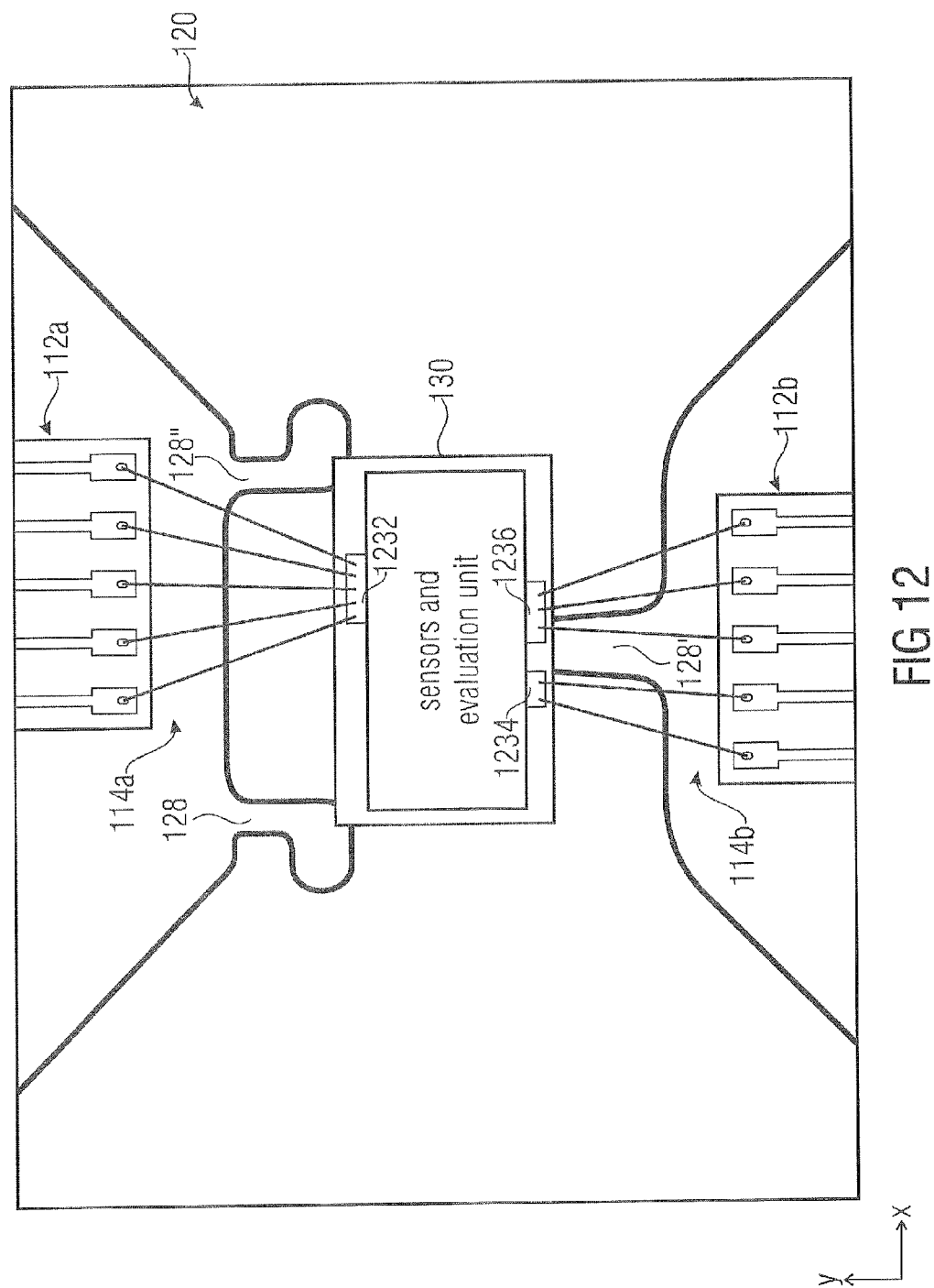

SEMICONDUCTOR PACKAGES AND METHODS FOR PRODUCING THE SAME

This application is a Continuation in Part of U.S. application Ser. No. 12/732,470, filed on Mar. 26, 2010, entitled "Sensor Package and Method For Producing a Sensor Package," which application is hereby incorporated herein by reference.

TECHNICAL FIELD

The present invention relates generally to semiconductor packages, and more particularly to semiconductor packages and methods for producing the same.

BACKGROUND

Sensors are used for a variety of applications such as thermal sensors, current sensors, magnetic field sensors, radiation sensors, light sensors etc. Many of these types of sensors are fabricated within a semiconductor die. The sensitivity of the sensor may depend on the distance between the physical source to the sensor within the semiconductor die. For example, current sensors may be used for over-current protection or for monitoring current flowing through a conductor. For such applications, Hall-sensors or similar sensors are widely used. Hall-sensors sense the magnetic field of the current and provide a voltage (Hall voltage) proportional to the intensity of the current. As the magnetic field decreases with increasing distance between the magnetic field sensor and the conductor carrying the current, the Hall-sensor has to be brought close to the conductor to improve the sensitivity to the magnetic field. Similarly, for a thermal sensor, the distance of the heat source to the sensor must be minimized to increase the sensitivity and reliability of the sensor.

SUMMARY OF THE INVENTION

These and other problems are generally solved or circumvented, and technical advantages are generally achieved, by illustrative embodiments of the present invention.

In one embodiment, a semiconductor package includes an isolating container having a recess, which forms an inner membrane portion and an outer rim portion. The rim portion is thicker than the membrane portion. The package includes a semiconductor chip disposed in the recess and a backplane disposed under the membrane portion of the isolating container.

In accordance with an alternative embodiment of the invention, a semiconductor package comprises a glass container, a sensor chip, and a backplane. The glass container has a recess and therefore forms an inner membrane portion and an outer rim portion within the glass container. The rim portion is at least three times thicker than the membrane portion. The sensor chip is disposed in the recess and the backplane is disposed under the membrane portion of the glass container.

In yet another embodiment of the invention, a method of forming a semiconductor package comprises forming a recess in a glass substrate thereby forming an inner membrane portion and an outer rim portion in the glass substrate and forming a top conductive layer over a top surface of the glass substrate. A semiconductor chip is attached to the top conductive layer and a backplane is attached under the inner membrane portion of the glass substrate.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIGS. 6A-6C show schematic cross-sectional views and a top-view of alternative embodiments of the sensor package for connecting the sensor chip and the current conductor on the same side;

FIGS. 7A and 7B show schematic cross-sectional views of embodiments of the sensor package similar to FIG. 1A with enhanced protection against lateral ingress of moisture into the printed circuit board package;

FIG. 9B illustrates a schematic cross-sectional view of an embodiment of the sensor package with a face-up mounted sensor chip and an additional insulation layer between the sensor chip and the printed circuit board;

FIG. 10 illustrates a schematic cross-sectional view of an embodiment of the sensor package with an additional conducting layer arranged below the conductive layer;

FIG. 11 illustrates a schematic top-view of a further embodiment of the current conductor with three slots;

FIG. 12 illustrates a schematic top-view of a prototype of an embodiment of the sensor package;

FIG. 14, which includes FIGS. 14A-14E, illustrates a sensor package comprising an isolating container in accordance with an embodiment of the invention, wherein FIG. 14A illustrates a projection view of a semiconductor die, the isolating container, and a backplane within a mold body, wherein FIGS. 14B and 14C illustrate projection views from different angles without the mold body, and FIGS. 14D and 14E illustrate cross-sectional views;

FIG. 15, which includes FIGS. 15A-15C, illustrates an embodiment of a semiconductor package having an isolating container, wherein FIG. 15A illustrates a top view and FIGS. 15B and 15C illustrate cross-sectional views;

FIG. 18, which includes

FIG. 20, which includes FIGS. 20A and 20B, illustrates an embodiment of the semiconductor package having an isolating container with a conductive layer coupled to a constant potential node through a semiconductor chip, wherein FIG. 20A illustrates a top view and FIG. 20B illustrates a cross-sectional view;

FIG. 21, which includes

FIG. 23, which includes FIGS. 23A-23G, illustrates various stages in fabricating a semiconductor package in accordance with embodiments of the invention, wherein FIGS. 23A-23B illustrate dicing steps, FIGS. 23C-23D illustrate steps in forming an isolating container.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely a current sensor. The invention may also be applied, however, to other sensors including thermal sensors, radiation sensors, electromagnetic wave sensors, magnetic sensor etc.

Figure 1A:
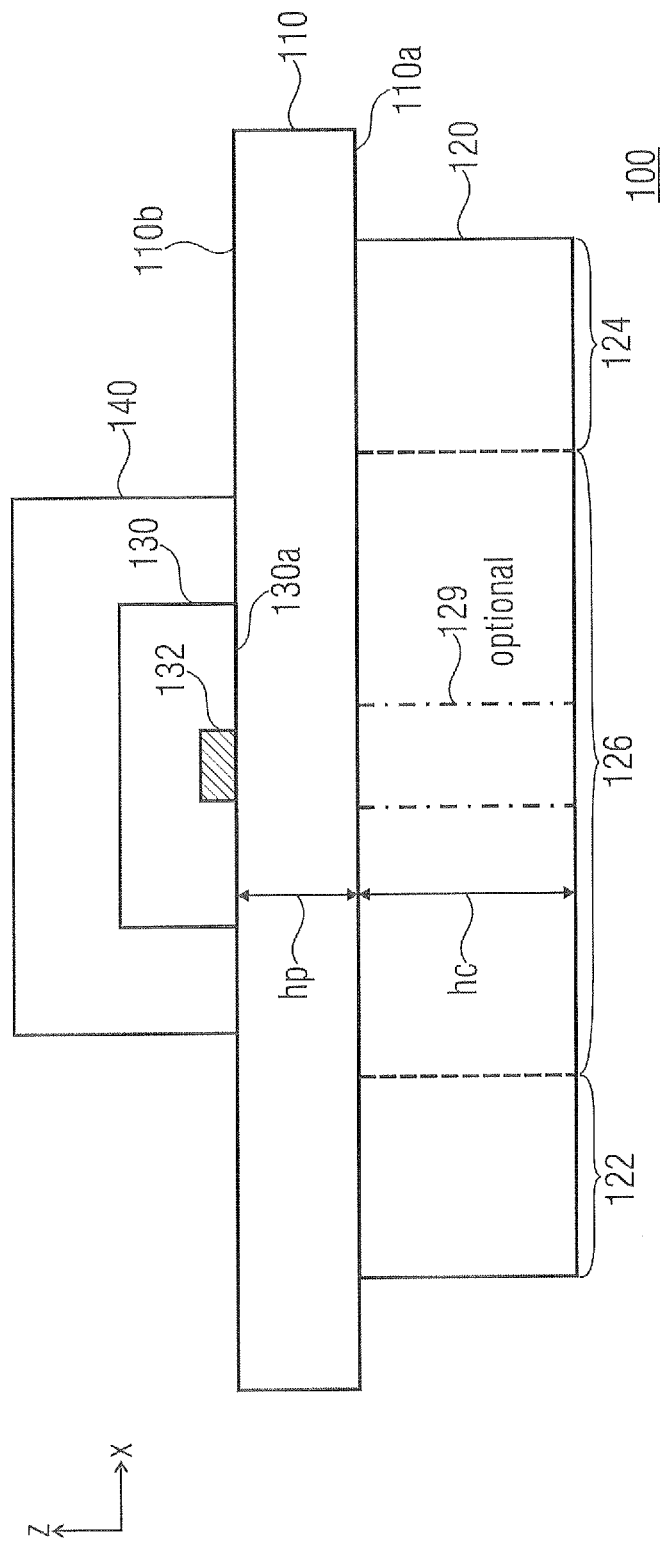
FIG. 1A illustrates a schematic cross-section of an embodiment of a sensor package, wherein the sensor chip is hermetically sealed between the printed circuit board and a mold body.

FIG. 1A shows a schematic cross-sectional view of an embodiment of a sensor package 100 comprising a printed circuit board 110 with a laminar current conductor 120 arranged on a first main surface 110a of the printed circuit board, wherein a sensor chip 130 is adapted to measure a current flowing through the laminar current conductor 120. The sensor chip 130 comprises a magnetic field sensor 132 and optionally an evaluation unit (not shown). The sensor chip 130 is arranged on a second main surface 110b of the printed circuit board opposite to the first main surface 110a. The surfaces of the sensor chip 130 not covered by the printed circuit board 110 (in FIG. 1A the side surfaces and the main surface facing away from the printed circuit board) are covered by a mold body 140 comprising a mold material. Thus, the sensor chip 130 is arranged between the mold body 140 and the printed circuit board 110, wherein the mold body 140 and the printed circuit board 110 are arranged such around the sensor chip that the sensor chip 130 is hermetically sealed from the environment. In other words, the mold body 140 is arranged on the second main surface 110b of the printed circuit board and/or around the sensor chip 130 such that the sensor chip 130 is arranged between the mold body 140 and the printed circuit board and is completely surrounded by the mold body 140 and the printed circuit board 110. The current conductor 120 comprises, for example, a first contact region 122, a second contact region 124 and a magnetic field producing region 126 arranged between the first contact region 122 and the second contact region 124 and electrically connecting both. The sensor chip 130 and the magnetic field sensor 132 are associated to the current conductor 120 or the magnetic field producing region 126 and are adapted to measure a current flowing through the current conductor 120, for example from the first contact region 122 via the magnetic field producing region 126 to the second contact region 124, by measuring the magnetic field produced by the current. The current conductor 120 is also referred to as primary conductor and the current flowing through the current conductor is also referred to as primary current. Note also that PCB 110 overlaps the sensor chip or die 130 along its entire perimeter by several tenths of a milli-meter in order to guarantee a long enough creepage distance between conductor 120 and die 130 for the purpose of voltage isolation.

Embodiments of the sensor package can be easily mounted on external and conventional circuit boards and connected to the conductors to be measured via the first and second contact region.

FIGS. 1A to 1D and the other figures show the respective axis 5' of an x-y-z coordinate-system, wherein the x-axis and the y-axis define a lateral plane or lateral dimensions parallel to the first main surface 110a of the printed circuit board, and wherein the z-axis defines a vertical dimension vertical to the first main surface 110a of the printed circuit board.

Figure 1B:
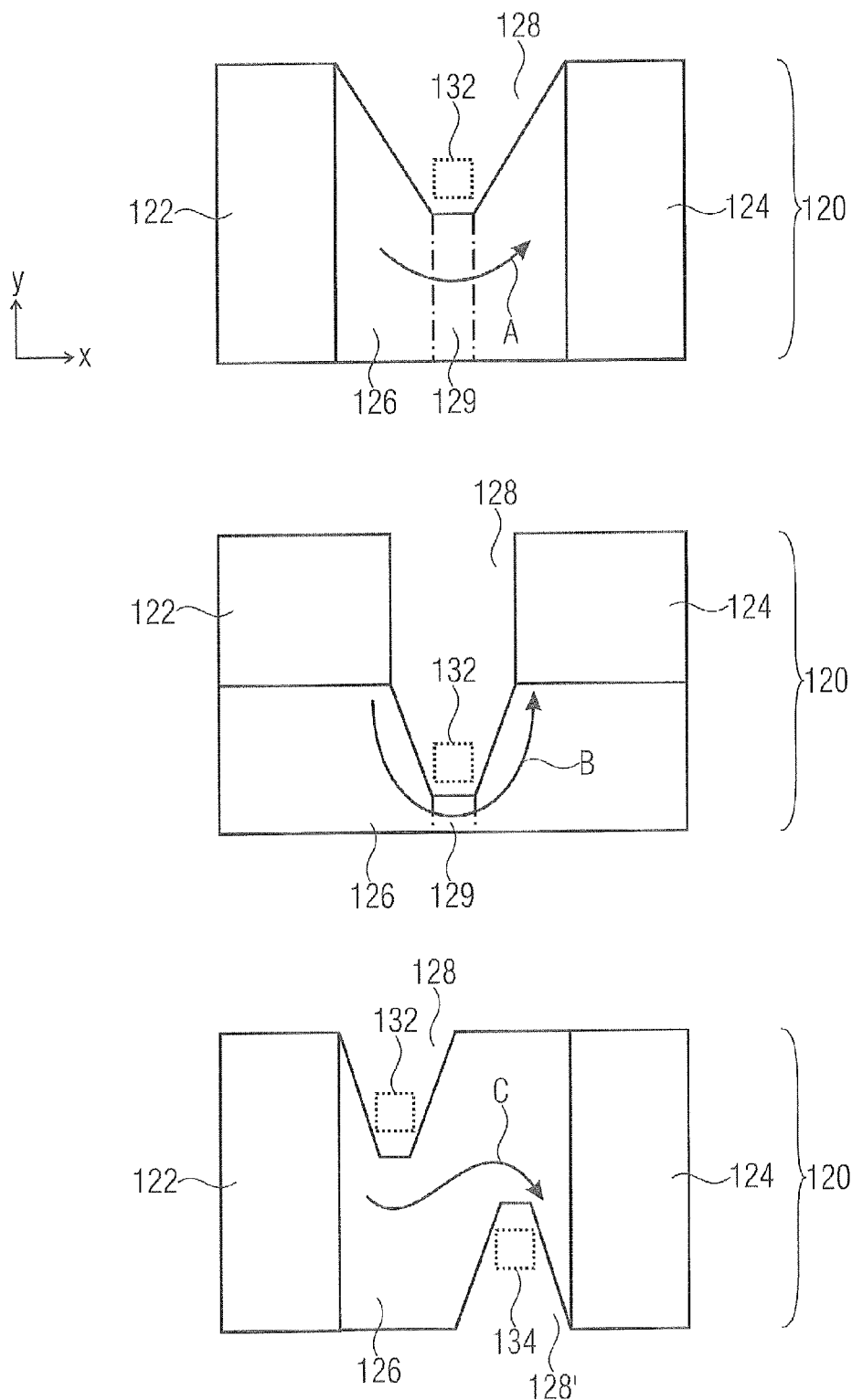
FIG. 1B illustrates top-views of structured current conductors comprising a reduced cross section.

FIG. 1B shows schematic top-views of three different embodiments of a structured current conductor 120. The embodiment of the current conductor 120 shown in the top of FIG. 1B shows a patterned current conductor 120 with a lateral notch 128 in the magnetic field producing region 126 defining a laterally reduced cross-section 129 (note that 126 is larger than 129, actually 129 is a part of 126). The reduced cross-section forms an area within the magnetic field producing region 126 which has a reduced cross-section forcing the current flowing from the first contact region 122 to the second contact region 124 to flow "I"-shaped (see arrow A). The reduced cross-section and the bending of the current flow A caused by the notch 128 increases the current density at the reduced cross-section (in particular at the inner side of the curve arranged nearer to magnetic field sensor 132) and, thus, the magnetic field strength of the magnetic field produced by the current at the reduced cross-section. This allows to increase the sensitivity of the current measurement. A possible lateral position of a magnetic field sensor element 132 of the sensor chip 130 for measuring the magnetic field of the current is shown by dotted lines.

The embodiment of the current conductor 120 shown in the middle of FIG. 1B shows a "U"-shaped current flow (see arrow B). Similar to the aforementioned embodiment, the current conductor comprises a lateral notch 128 in the magnetic field producing region and between the first contact region and the second contact region. However, in this embodiment the first and second contact region 122 and 124 are arranged only on an opposite half of the current conductor, opposite to the reduced cross-section 129 in the magnetic field producing region 126. Thus, the current flowing from the first contact region 122 to the second contact region 124 is even more bent than in the aforementioned embodiment. In addition, the cross-section 129 of the embodiment shown in the middle of FIG. 1B is smaller than the cross-section 129 of the embodiment shown on the top of FIG. 1B, and, thus, even further increases the magnetic field strength of the magnetic field produced by the current. Again an exemplary position of a magnetic field sensor 132 is shown.

The embodiment shown in the bottom of FIG. 1B shows a current conductor with an "S"-shaped current flow (see arrow C). To achieve the S-shaped current flow the magnetic field producing region 126 comprises two notches arranged on opposite sides of the magnetic field producing region 126 relative to the flow direction of the current and displaced or offset to each other in flow direction. In each of the notches 128, 128' a magnetic field sensor 132, 134 can be arranged to measure the magnetic field of the current. The use of two or more magnetic field sensors 132, 134 allows to use differential magnetic field measurements which compared to single magnetic field sensor measurements provide improved sensitivity and signal robustness.

As can be seen from FIGS. 1A and 1B, the global direction of the current flow of the patterned conducting layer 120 may be horizontal with regard to FIG. 1A or into the drawing plane of FIG. 1A or in any other direction parallel to the first main surface 110a of the printed circuit board and parallel to the first main surface 130a of the sensor chip 130 facing towards the printed circuit board and the current conductor 120. In other words, a current to be measured flows within the x-y plane parallel to the first main surface 130a of the sensor chip 130 from the first contact region to the second contact region. The arrows A to C in FIG. 1B show the flow of the current when the current or primary current is input at the first contact region 122 and is output at the second contact region 124.

Even further embodiments of the current conductor 120 may comprise other patterns and/or any number of and any form of slots or notches arranged on any of the two opposite sides (with regard to the flow direction) of the magnetic field producing area 126 to bend the current and/or to provide reduced cross-sections to increase the current density. The important aspect is that at least one notch 128 is present in the primary conductor and that at least one magnetic field sensor element 132 is to be aligned with high precision (e.g. +/−150 µm or preferably even down to +/−10 µm in lateral direction and +/−5 µm or preferably down to +/−50 µm in vertical direction) with respect to the notch.

Although such structured magnetic field producing regions 126 allow to improve the sensitivity of the current measurement, simple embodiments of the current conductor may also comprise a rectangular magnetic field producing region 126 without any notches or other structures which combines the first contact region 122 and the second contact region 124.

The first and second contact regions 122, 124 may have the same thickness or vertical dimension (thickness of the conductor layer or height hc) as the magnetic field producing region 126, or may have a different height. Embodiments of the sensor package can comprise, for example thicker contact regions 122, 124 (larger vertical dimension) and a thinner magnetic field producing region 126 (smaller vertical dimension) in order to increase the current intensity in the magnetic field producing region 126 and, thus, the magnetic field onto the magnetic field sensors while keeping the internal resistance at a minimum.

Embodiments of the sensor chip may comprise only one single magnetic field sensor 132 as a single magnetic field sensor 132 is sufficient to detect a magnetic field of a current flowing through a conducting layer 120. Other embodiments comprise at least two magnetic field sensors 132, 134 to realize a differential measuring principle which allows to suppress magnetic background disturbances.

As shown in FIG. 1A, the sensor chip 130 can be protected from the environment by over-molding it. According to an alternative embodiment the sensor chip 130 can be protected from the environment by embedding it into the printed circuit board 110' as shown in FIG. 10. FIG. 10 shows a cross-sectional view of the alternative embodiment, wherein the sensor chip is arranged in the printed circuit board 110 and is hermetically sealed by the printed circuit board. The embedding into the printed circuit board 110 can, for example, be achieved by providing a base printed circuit board 110 as shown in FIG. 1A and arranging one or several other printed circuit boards on the base printed circuit board 110 of FIG. 1A (multi-layer printed circuit board), wherein the printed circuit board layer or printed circuit board abutting on the second main surface 110b comprises a cavity on the surface facing towards the base printed circuit board 110 to incorporate the sensor chip 130. Thus, the semiconductor die or sensor chip 130 is embedded between several layers of printed circuit board material as shown in FIG. 10.

Figure 1C:
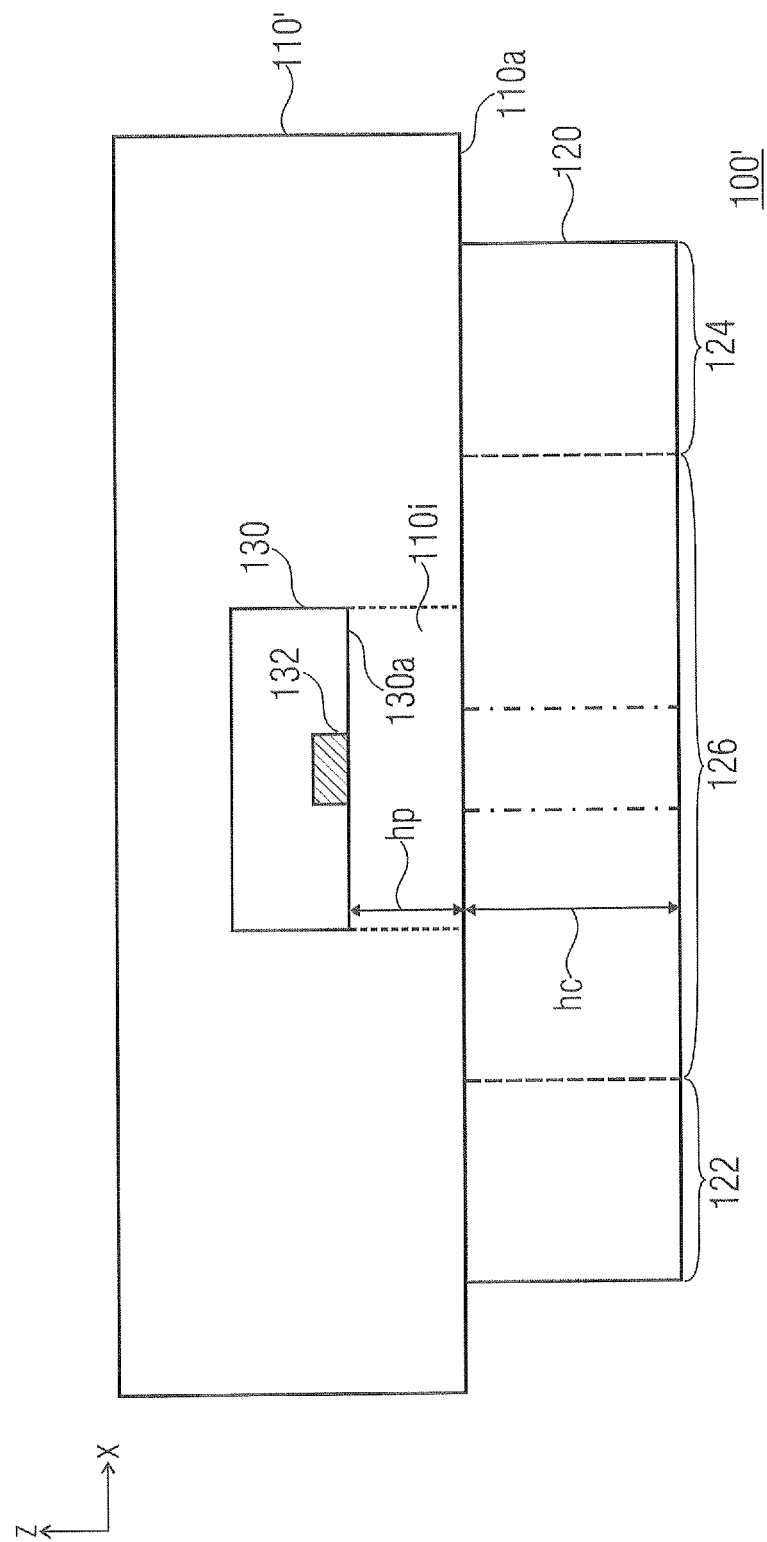
FIG. 1C illustrates a schematic cross-section of an embodiment of a sensor package, wherein the sensor chip is hermetically sealed by the printed circuit board package.
Figure 1D:
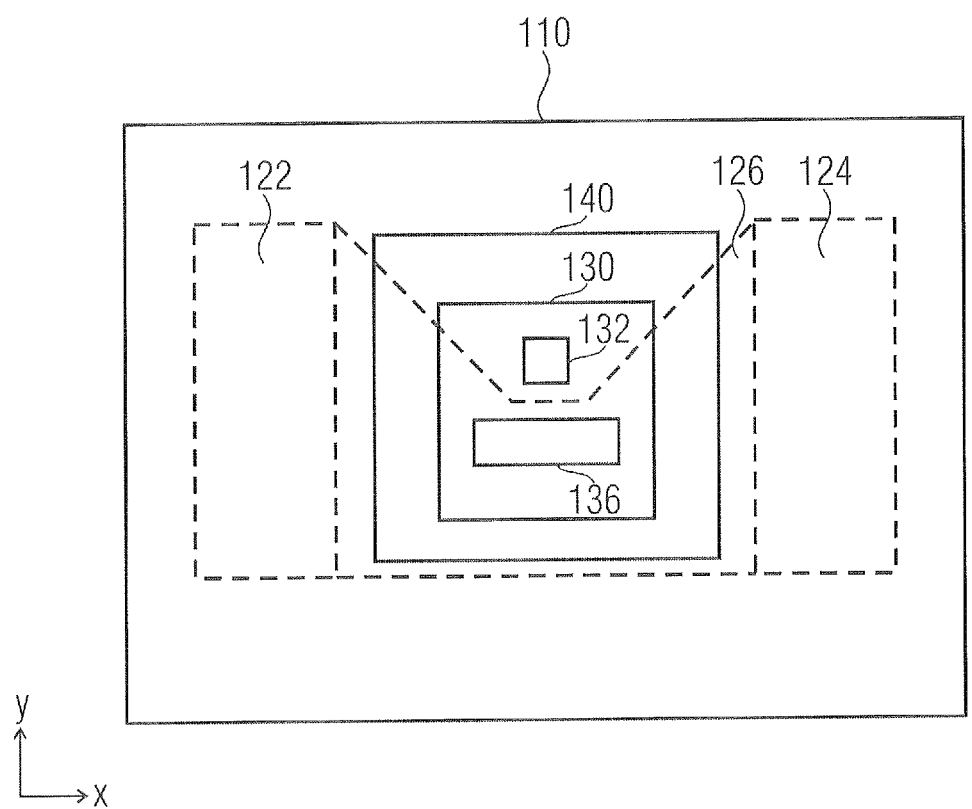
FIG. 1D illustrates a schematic top-view of a sensor package according to FIG. 1A and a current conductor for an I-shaped current flow.

FIG. 1D shows a schematic top-view of an embodiment according to FIG. 1A with a structured current conductor 120 according to the embodiment shown in the top of FIG. 1B. FIG. 1D shows the printed circuit board 110 with the sensor chip 130 and the mold body 140 arranged on the second main surface (upper main surface according to the orientation of FIG. 1A) and the current conductor 120 (broken lines) arranged on the first main surface (lower surface according to the orientation of FIG. 1A). The current conductor 120 comprises the first contact region 122, the second contact region 124 and the magnetic field producing region 126 with a notch 129 on one side along the current flow direction defining a reduced cross-section 129, as explained based on FIG. 1B. The sensor chip 130 comprises a single magnetic field sensor 132 arranged above the notch 129 and laterally aligned to the notch 129, and the evaluation unit 136 electrically coupled to the magnetic field sensor 132 to evaluate the measurement signals of the magnetic field sensor (connecting lines between the magnetic field sensor 132 and the evaluation unit 136, or supply lines and signal lines for outputting the measured signals by the evaluation unit 136 are not shown).

When a current flows through the current conductor 120, the current produces a radial magnetic field (radial to the current flow direction) which is measured by the magnetic field sensor. The magnetic field sensor can be for example, a Hall-sensor or magnetoresistive transducer, which provides, for example, a voltage signal proportional to the magnetic field strength. As the relation between the current, the magnetic field produced by the current and the voltage signal provided by the magnetic fields sensor based on the measured magnetic field is known, the voltage signal provided by the magnetic field sensor 132 can be mapped to a corresponding current value by the evaluation unit 136, in certain embodiments using a calibrations means, e.g. a calibration table or a calibration function, or in general a calibration information or calibration data, to reduce a deviation between the measured current intensity value according to the signal provided by the magnetic field sensor and the actual current intensity value of the current. The calibration data can, e.g., include values indicating how many mT (T=Tesla) magnetic field are produced by a current of 1 A.

To achieve an optimum measurement, the magnetic field sensor 132 is arranged near to the reduced cross-section, preferably vertically above the notch and near to the reduced cross-section (see also FIG. 1A showing in hash-dotted lines the optional reduced cross-section and the lateral alignment of the magnetic field sensor 132 with regard to the notch or reduced cross-section). FIG. 1D shows the PCB overlapping both the sensor chip and the primary conductor. In other embodiments the PCB overlaps only the sensor chip, yet not the conductor: the PCB may be small enough that both contact areas 122, 124 extend beyond it so that they may be contacted on their top or bottom surfaces (or even on both).

In certain embodiments, the thickness or vertical dimension hp of the printed circuit board 110 right underneath the sensor chip 130, or in other words, the vertical dimension of the insulating area of the printed circuit board 110 arranged between the sensor chip 130 and the current conductor 120 for insulating both from each other, is smaller than a vertical dimension hc (thickness or height) of the current conductor or the magnetic field producing region 126 right underneath the sensor chip 130. It has been found that the magnetic field of the current conductor decays versus the vertical distance between the current conductor and the magnetic field sensor or sensor chip and the spatial rate of decay scales with the thickness or vertical dimension of the conducting layer hc. Therefore, embodiments of the sensor body comprise printed circuit boards with a vertical dimension hp of the printed circuit board (at least in the area arranged between the sensor chip and the current conductor insulating the two from each other) being smaller than a vertical dimension hc of the magnetic field producing region 126 of the current conductor, so that a significant amount of magnetic field reaches up to the magnetic field sensors 132, 134.

Figure 9A:
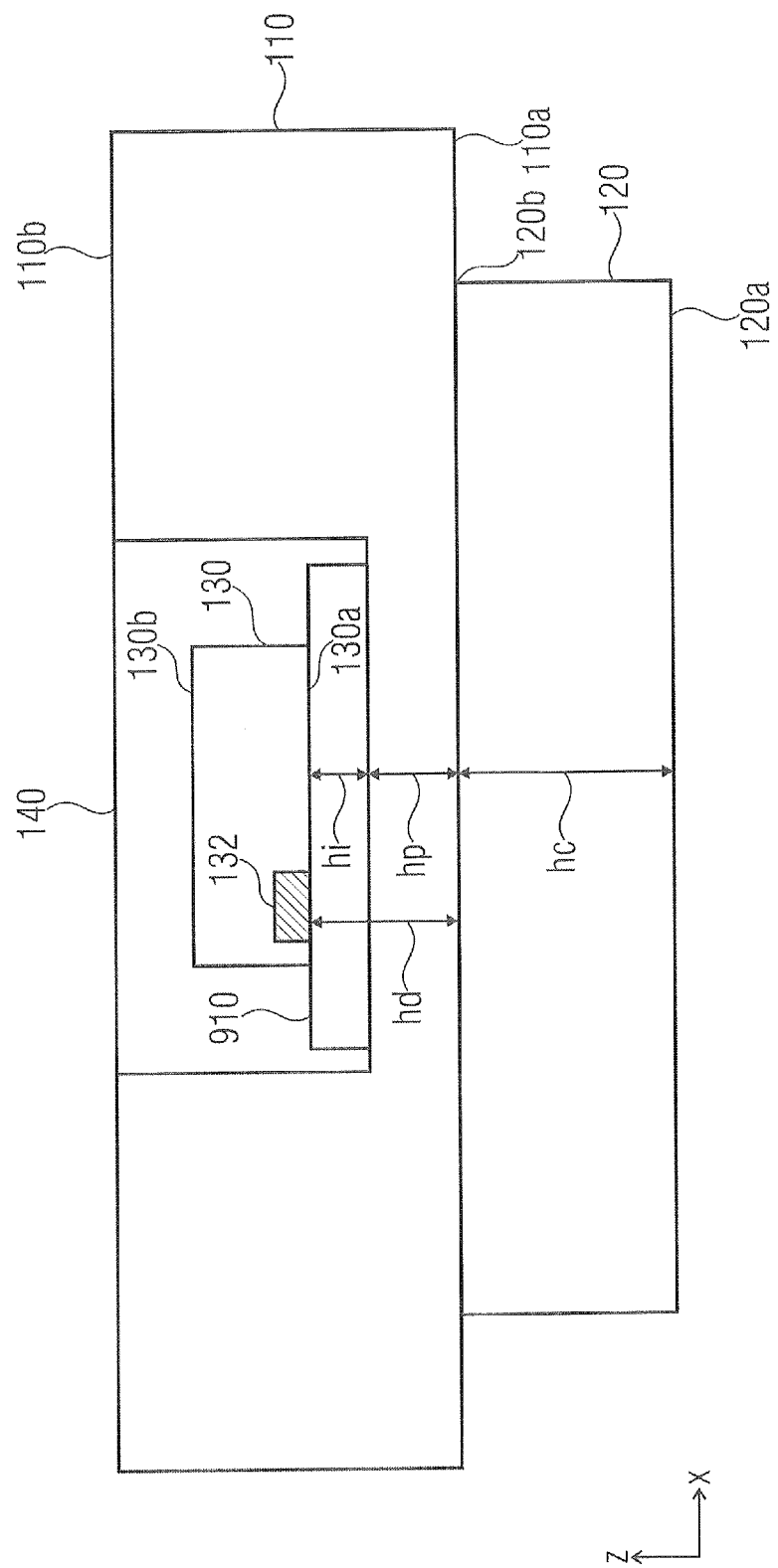
FIG. 9A illustrates a schematic cross-sectional view of an embodiment of the sensor package with a flip-chip mounted sensor chip and an additional insulation layer between the sensor chip and the printed circuit board.

Embodiments of the sensor package, however, may comprise not only the printed circuit board as insulating layer between the sensor chip and the current conductor (like in FIGS. 1A, 1C and 2) but may also comprise further insulating layers or other layers arranged between the sensor chip and the current conductor (see FIGS. 9A and 9B). In addition, the current sensors may be flip-chip mounted (top-down, e.g. with the magnetic field sensor arranged near or at the main surface of the sensor chip facing toward the current conductor) or face-up (e.g. with the magnetic field sensor arranged near or at the main surface of the sensor chip facing away from the current conductor). Therefore, in general, for certain embodiments the vertical dimension hc of the magnetic field producing region vertical to the first main surface of the printed circuit board is larger than a vertical distance hd vertical to the first main surface of the printed circuit board between one or all magnetic field sensors associated to the current conductor and comprised in the sensor chip and a surface of the current conductor, and in particular of the magnetic field producing region, facing towards the sensor chip or magnetic field sensor. The vertical dimension hc of the magnetic field producing region can be more than 1.5 times larger or more than 2 times larger than the vertical distance hd between the magnetic field sensor and the current conductor. In further embodiments of the current sensor the magnetic field sensor is arranged such that a vertical distance between the magnetic field sensor and the magnetic field producing region is larger than 50 µm and the vertical dimension of the magnetic field producing region is larger than 100 µm. In even further embodiments of the current sensor the magnetic field sensor is arranged such that a vertical distance between the magnetic field sensor and the magnetic field producing region is larger than 100 µm and the vertical dimension of the magnetic field producing region is larger than 200 µm. In other embodiments, the vertical distance hd between the magnetic field producing region and the magnetic field sensor can be in a range between 50 µm to 200 µm and a vertical dimension of the magnetic field producing region in a range between 70 µm and 400 µm. The aforementioned dimensions and relations apply independent of whether the sensor chip is only insulated from the current conductor by the printed circuit board or by the printed circuit board and one or more other insulating layers, and independent of the vertical position of the magnetic field sensor within the sensor chip relative to the current conductor (see FIGS. 9A and 9B).

In further embodiments, as shown in FIGS. 9A and 9B, the current conductor can be electrically insulated from the sensor chip by an insulating area of the printed circuit board arranged between the sensor chip and the current conductor and an additional insulating layer arranged between the sensor chip and the current conductor, wherein the vertical dimension hc of the magnetic field producing region can be larger than a total vertical dimension hi+hp (see FIGS. 9A and 9B) of the insulating area of the printed circuit board and the additional insulating layer.

The vertical dimension hp of the printed circuit board in an area of the printed circuit board arranged between the magnetic field producing region and the sensor chip and the magnetic field producing region can be larger than 50 µm and a vertical dimension of the current conductor larger than 100 µm. In further embodiments, the vertical dimension hp of the printed circuit board in an area of the printed circuit board arranged between the magnetic field producing region and the sensor chip can be larger than 100 µm and the vertical dimension of the current conductor larger than 200 µm. In other embodiments, the vertical dimension hp of the printed circuit board in an area of the printed circuit board arranged between the magnetic field producing region and the sensor chip can be in a range between 50 µm to 200 µm and a vertical dimension of the current conductor in a range between 70 µm and 400 µm.

A current conductor 120 or magnetic field producing region 126 with a vertical dimension hc that is larger than a vertical dimension hp of the printed circuit board (see FIG. 1A, wherein the printed circuit board has everywhere the same vertical dimension hp) may lead—over the whole lifetime of the package—to warpage of the whole package and the associated mechanical stress may lead to reliability problems. The risk of warpage can be reduced by keeping the thin part or region 110i of the printed circuit board arranged between the sensor chip 130 and the current conductor 120 as small as possible, or in other words, by keeping the lateral dimensions of the thin intermediate or insulating area 110i of the printed circuit board 110 as small as possible.

Figure 2:
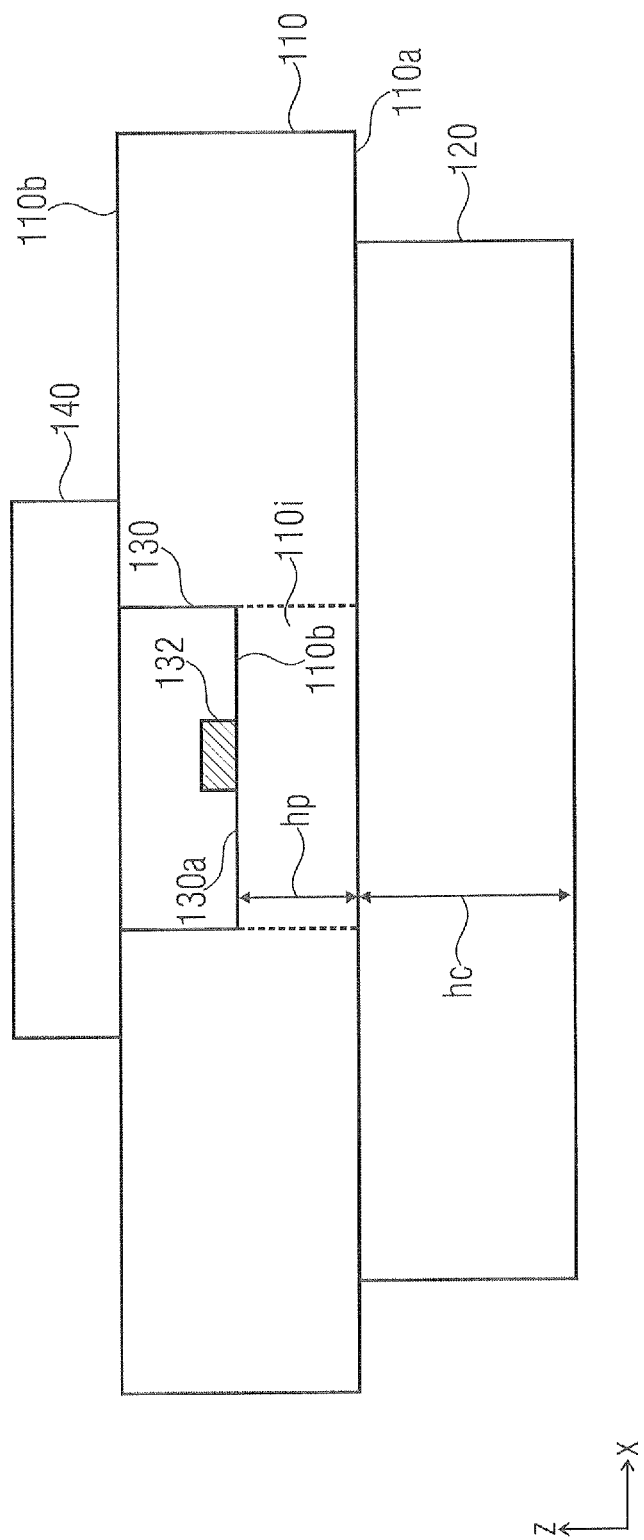
FIG. 2 illustrates a cross-section of an embodiment of a sensor package similar to the one of FIG. 1A, wherein the sensor chip is partially embedded in the printed circuit board and covered by a mold body.

FIG. 2 shows a schematic cross-sectional view of an embodiment, wherein the printed circuit board 110 comprises at its second main surface 110b a recess to accommodate or contain the sensor chip 130. Thus, the printed circuit board comprises only a small thin insulating area 110i, insulating the sensor chip 130 from the current conductor 120, keeping the distance between the sensor chip and the current conductor at a minimum (defined by the desired insulating voltage and depending on the printed circuit board material) or as small as possible. Thus the position the magnetic field sensor is as close as possible to the current conductor and at the same time, the remaining areas or parts of the printed circuit board 110 (e.g. all parts or regions except 110i) comprise a vertical dimension (thickness or height) sufficient to prevent or at least reduce the risk of warpage of the whole sensor package.

Warpage is even more effectively reduced in FIG. 1C. In this example, if the thickness of the PCB-material above the sensor chip is similar to the thickness hp of the PCB-material below the sensor chip, then the forces of both parts are balanced and the package remains straight.

Figure 3:
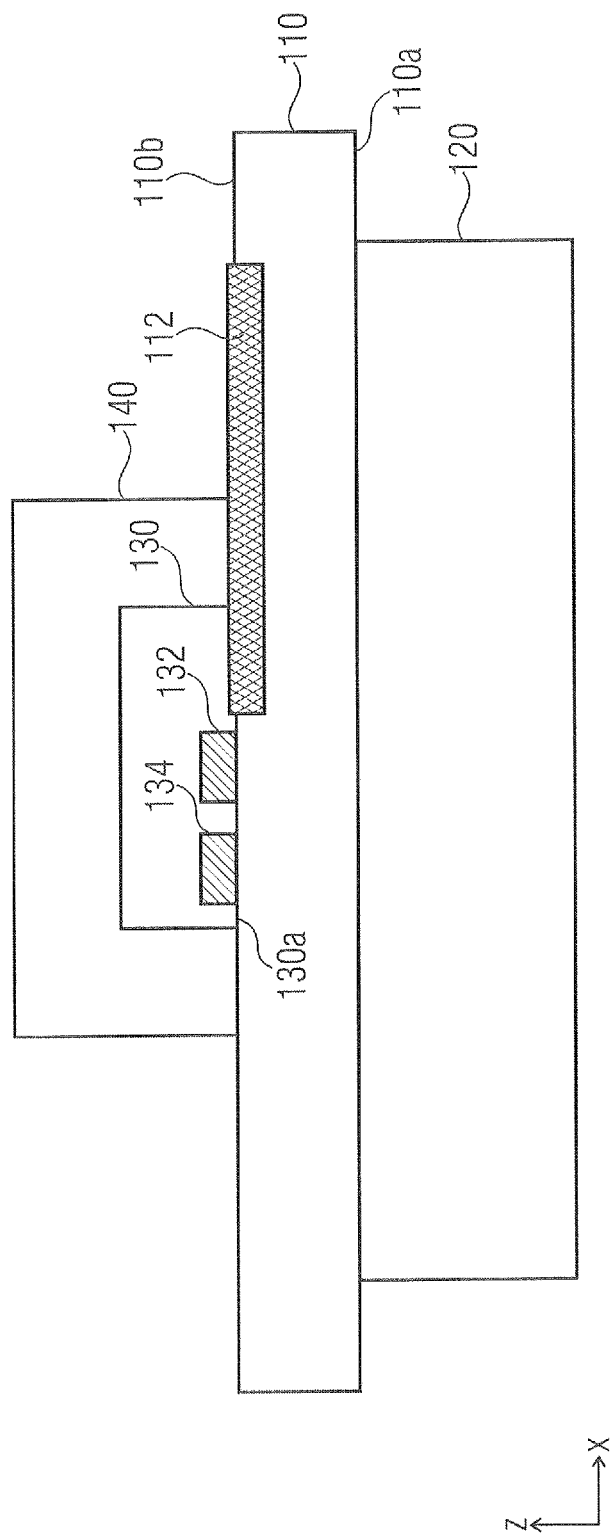
FIG. 3 illustrates a schematic cross-section of an embodiment according to FIG. 1A with the sensor chip flip-chip mounted on the printed circuit board package.
Figure 4:
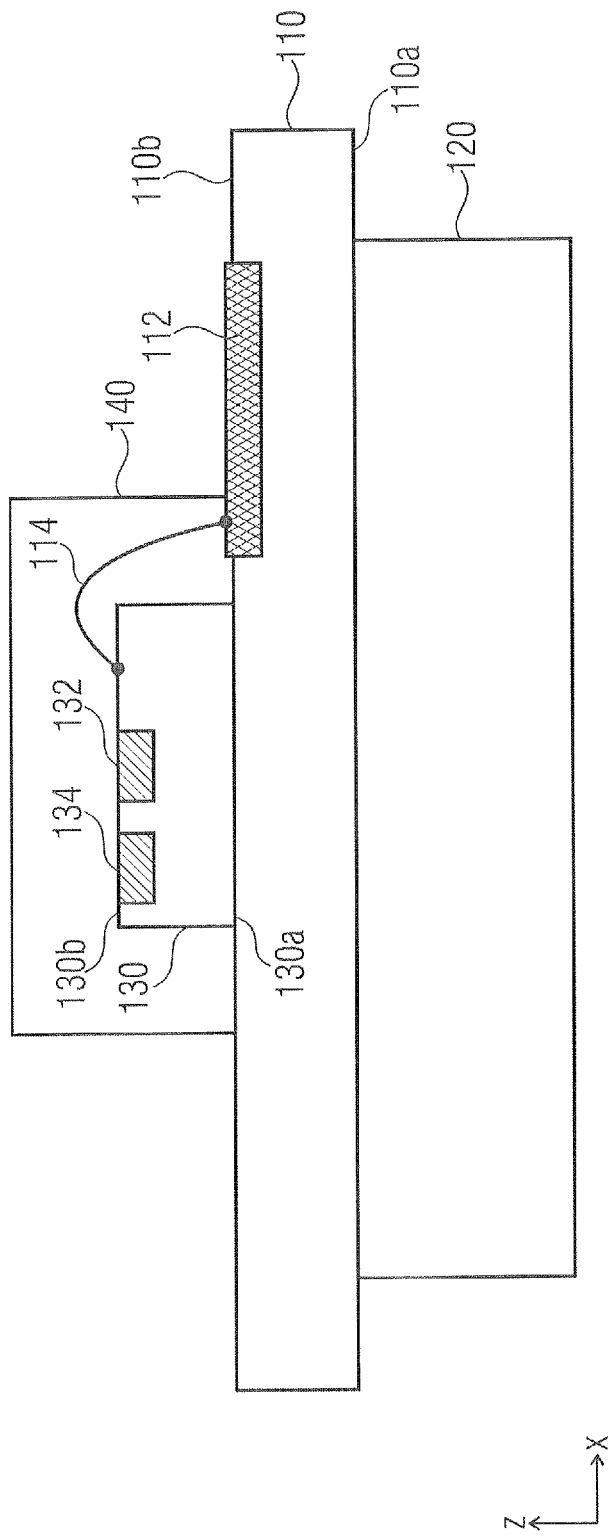
FIG. 4 illustrates a schematic cross-sectional view of an embodiment according to FIG. 1A with the sensor chip mounted face up on the printed circuit board package.

The magnetic field sensor 132 or the magnetic field sensors 132, 134 can be arranged on the top or the bottom surface of the sensor chip 130. If the magnetic field sensors are arranged on the bottom surface (see FIG. 3) they are exposed to a larger magnetic field than on the top (see FIG. 4), yet this typically involves a flip-chip mounting of the sensor chip or sensor die 130 onto the printed circuit board 110. In FIG. 3 the sensor chip 130 is mounted in a flip-chip style and contacted by thin conductive traces 112 on top of the printed circuit board. In FIG. 4 the sensor chip 130 is mounted with its front side containing the magnetic field sensors 132, 134 up and the contacts are made by bond wires 114.

FIG. 3 shows a schematic cross-sectional view of an embodiment of a sensor package with the sensor chip or semiconductor die 130 arranged face-down on the second main surface 110b of the printed circuit board, for example via flip-chip mounting. The printed circuit board 110 comprises besides the current conductor 120 on the first main surface, further conductor traces or conductive traces 112 on the second main surface 110b to electrically connect the sensor chip 130. As can be seen from FIG. 3, the magnetic field sensors 132, 134 are arranged on the main surface 130a of the sensor chip 130 facing towards the printed circuit board. In addition, the electrical contacts for connecting the sensor chip 130 or semiconductor die 130 to the conductive traces 112 arranged on the second main surface 110b of the printed circuit board (contacts not shown), are also arranged on the main surface 130a of the sensor chip facing toward the printed circuit board. Thus, the magnetic field sensors are as close as possible to the current conductor and at the same time, the electrical connection of the sensor chip, for example for power supply and for the output of the measured signals, can be efficiently and easily provided.

FIG. 4 shows a schematic cross-sectional view of a sensor package, wherein the magnetic field sensors 132, 134 and the electrical contacts for connecting the sensor chip 130 to the conductive traces 112 are arranged on a main surface 130b of the sensor chip facing away from the printed circuit board. The electrical contacts (not shown) of the sensor chip 130 are connected via bond wires 114 to the conductive traces 112. Compared to the flip-chip mounting of FIG. 3, the face up mounting of FIG. 4 facilitates increased reliability and reduced manufacturing costs.

The printed circuit board 110 holds the sensor chip 130 in position (in particular relative to the current conductor) and supports the sensor chip mechanically. Moreover, the printed circuit board establishes a voltage insulation between the sensor chip 130 and the current conductor 120 by the insulating section or area 110i of the printed circuit board. In certain embodiments the printed circuit board overlaps the sensor chip 130 along its entire perimeter (see for example FIGS. 1A and 1D), because even if the sensor chip is coated with some insulating polyimide, oxide or nitride-layer applied before dicing the semiconductor wafer to produce the sensor chip or semiconductor die, this insulation often shows cracks and/or defects along the sewing edge. To protect at least these sawing edges of the sensor chip 130 against the conductor the printed circuit board overlaps the semiconductor chip in each of the lateral dimensions (x-y plane as shown in FIG. 1D).

The alignment of the sensor chip 130 and the current conductor 120 is crucial because the magnetic field sensors 132, 134 have to be positioned precisely with respect to the current conductor and eventually with respect to the lateral notches within the patterned current conductor. The smaller, or the more pointed the ends of the slots in the current conductor according to FIG. 1B are the more the magnetic field will be concentrated near these ends. In other words, the smaller the reduced cross-section 129 and the shorter the length of the reduced cross-section in flow direction is, the higher the magnetic field and the higher the concentration of a magnetic field near the ends of the notches. Therefore, to obtain an optimum measurement sensitivity, it is vital to locate the magnetic field sensors 132, 134 exactly at these ends of the notches, as shown in FIG. 1B. However, with regard to the production, the precise alignment is difficult as the opaque printed circuit board is arranged between the current conductor and the sensor chip. Embodiments of the method for producing the sensor package, therefore, are adapted to include making visual marks on the top side 110b of the printed circuit board which help, for example an automated die-bonder to find its place and to arrange the sensor chip and the respective magnetic field sensors precisely above these notch ends. The use of printed circuit boards as mechanical carriers for the sensor package production can benefit here from the experience of printed circuit board manufacturers with regard to the manufacturing of multi-layer printed circuit boards with ultra-fine conductor traces where the alignment of various layers of the printed circuit board is crucial for a correct interconnection of the printed circuit board layers, e.g. through conductive vias.

Printed circuit board based sensor packages are also beneficial with regard to the production of finely patterned magnetic field producing regions 126 of the current conductor 120, which generates the magnetic field. Certain embodiments of the sensor package comprise a structure current conductor 120 with notches or slots 128 having, for example, radii of curvature of 50 μm to 200 μm. For example, in case the vertical dimension of the current conductor he is about 100 μm, the radius of curvature at the end of the notch is about 50 μm. In case the current conductor 120 has a vertical dimension he of about 400 μm, the radius of curvature is about 100 μm to 200 μm. Again, for the production of such structured magnetic field producing regions 126 one can make use of the existing know-how of printed circuit board manufacturers to manufacture such conductive layers 120, 126 with sufficient accuracy, for example via mechanical or chemical processes like milling or etching.

Figure 5:
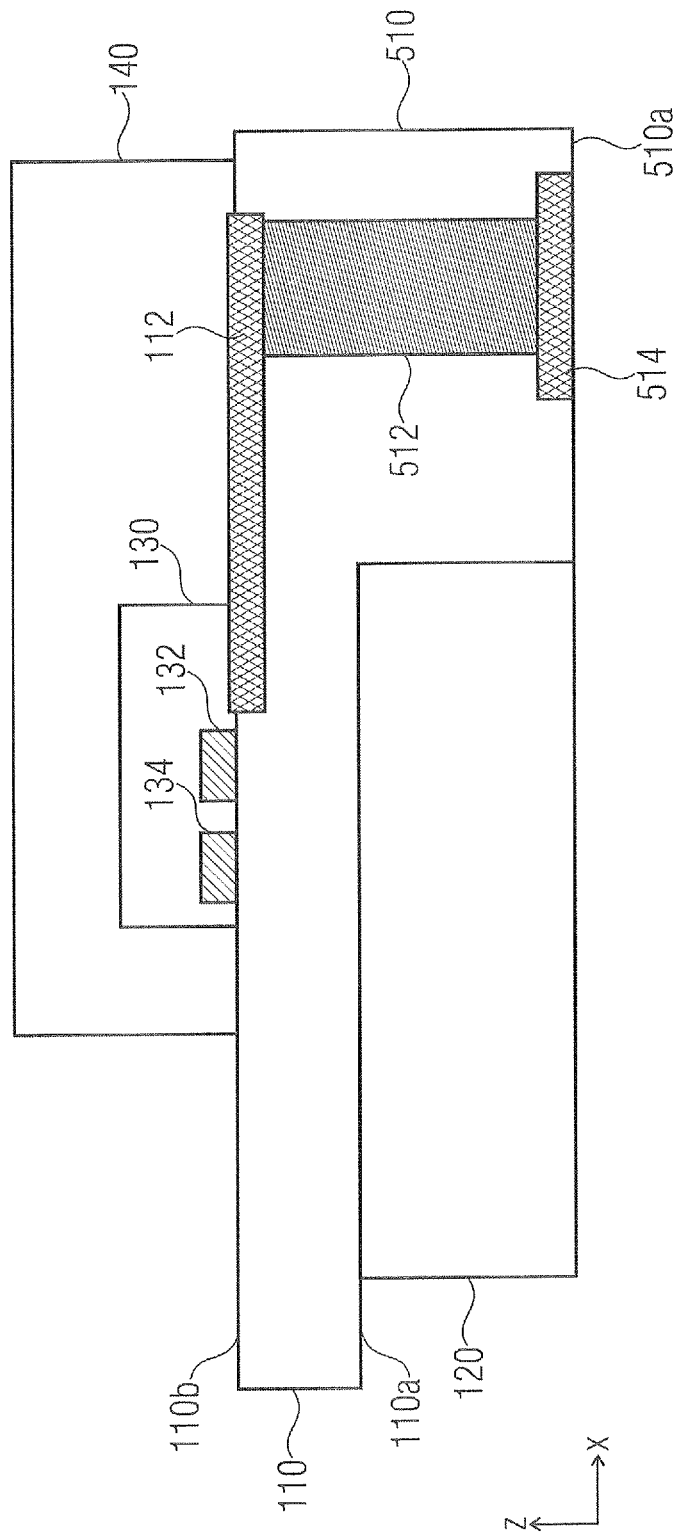
FIG. 5 illustrates a schematic cross-sectional view of an embodiment according to FIG. 1A with a via through the printed circuit board to connect the sensor chip on the same side as the current conductor.

Embodiments of the sensor package may further be adapted such that all contacts, the high current contacts for the current conductor and the small sense contacts and power supply contacts for the sensor chip, are available on the same surface or side of the package as shown in FIG. 5. FIG. 5 shows a schematic cross-sectional view of a sensor package comprising a printed circuit board 110 with a protruding part 510 protruding in vertical direction (z-axis). The protruding portion 510 protrudes in direction of the current conductor 120, or in other words, protrudes away from the sensor chip 130 and has, for example, the same vertical dimension as the current conductor 120. The conductive traces 112 connecting the sensor chip 130 are connected through conductive vias 512 arranged vertically in the printed circuit board 110 and the protruding portion 510 to the sense contacts 514 arranged on the first main surface 510a. The surface of the sense or sensor contacts 514 are arranged flush with the surface of the current conductor facing away from the printed circuit board.

The sensor chip 130 in FIG. 5 is arranged face-down, or in other words via a flip-chip mounting, on the second main surface 110b of the printed circuit board and is connected via contacts (not shown) arranged on the first main surface 130a of the sensor chip to conductive traces 112.

Figure 6B:
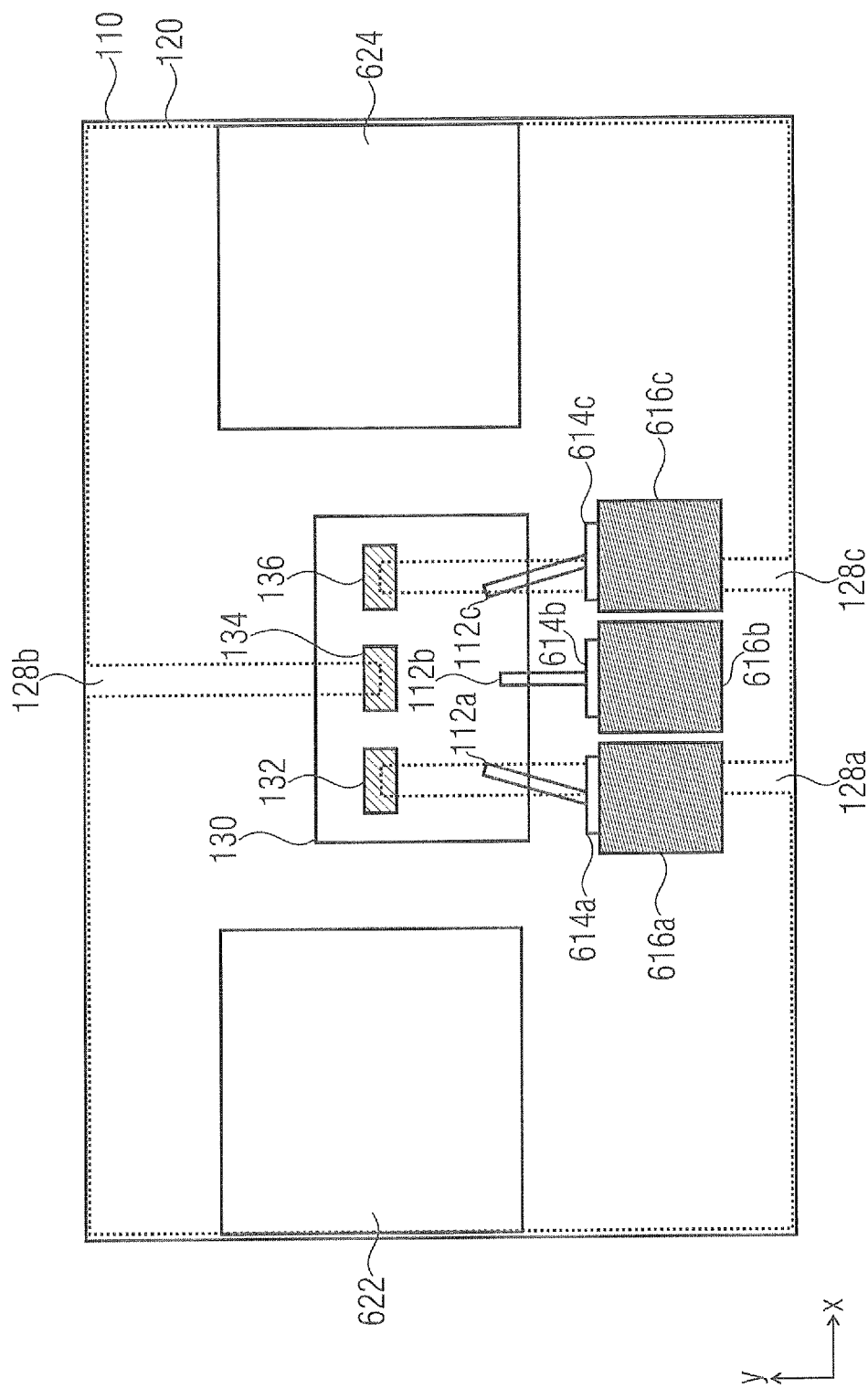

An alternative embodiment is described based on FIGS. 6A and 6B, wherein FIG. 6A shows a schematic cross-section view of the embodiment and wherein FIG. 6B shows a schematic top-view of the embodiment. FIG. 6B shows a top-view of the embodiment according to FIG. 6A with the additional printed circuit board layer 610 removed to give sight to the sensor chip. In this alternative embodiment the massive contacts for the primary current to be measured can be brought up to the top surface (orientation according to FIG. 6A) of the sensor package and the sensor package can be used, for example, upside down. The sensor chip in FIG. 6A is flip-chip mounted, or in other words, is mounted face-down, on the printed circuit board 110. Two magnetic field sensors 132, 134 and the electrical contacts for connecting the sensor chip 130 are arranged on the first main surface 130a of the sensor chip facing towards the printed circuit board 110. The electrical contacts of the sensor chip are connected to conductive traces 112 arranged on the second main surface of the printed circuit board. A further or upper printed circuit board layer 610, for example similar to the embodiment described based on FIG. 1C, is arranged on the printed circuit board 110 and the sensor chip 130 and completely seals and surrounds the sensor chip 130. Within the additional printed circuit board layer 610, a vertical electrically conducting via 614 is arranged and connects the conductive traces 112 to the sensor contacts 616 arranged on the main surface of the additional printed circuit board layer 610 facing away from the printed circuit board 110.

FIG. 6B shows the sensor chip 113 with three magnetic field sensors 132, 134, 136, for example three Hall plates arranged lateral to each other, wherein the sensor chip 130 is connected via three fine conductive traces 112a, 112b and 112c, arranged on the second main surface of the printed circuit board 110 to respective three vias 614a, 614b and 614c, which are again connected to three sensor contacts 616a, 616b and 616c. FIG. 6B additionally shows the massive contacts for the primary current contact 614 connected via the vertical via 622 to the first contact region 122 and a second primary current contact 634 connected via a second massive conductive via 624 arranged in an additional printed circuit board layer 610 and eventually also in the printed circuit board 110, to the second contact region 124 of the current conductor. Further embodiments may comprise instead of a single massive via a large number of smaller vias electrically connected in parallel and geometrically arranged in a matrix form.

The dotted line in FIG. 6B shows the edge or circumference of the conductive layer or current conductor 120. The current conductor 120 comprises three slots 128a, 128b and 128c arranged on opposite sides of the current conductor with regard to the current flow direction to define a "W" current flow. A plain view of one of the printed circuit board layers 110, 610 or of both printed circuit board layers may have a shape of an "H" (see FIG. 6B) in order to give a passage for the current to be measured.

Figure 6C:
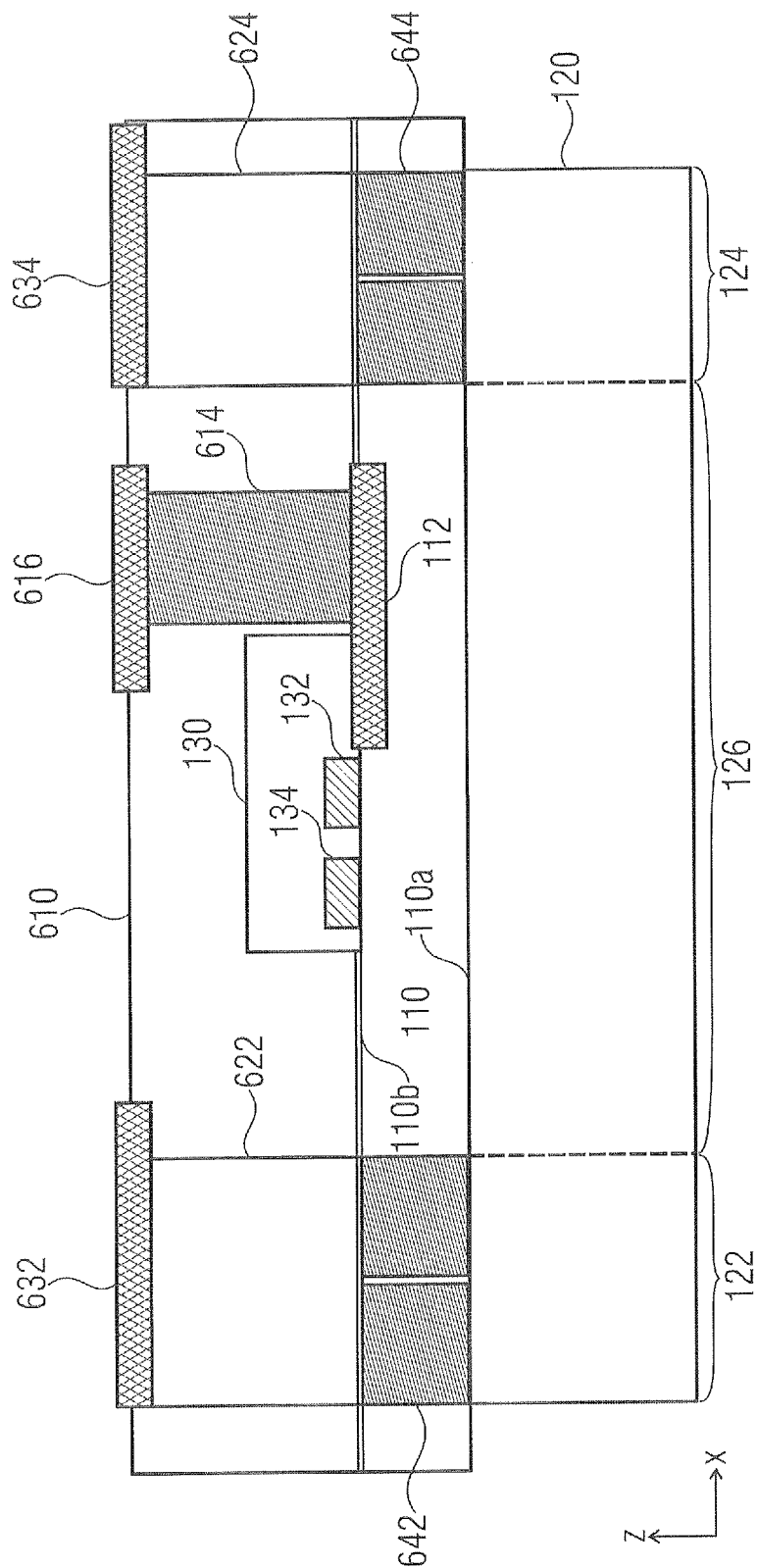

FIG. 6C shows an alternative embodiment to FIG. 6A, wherein the contacts 632, 634 for the current to be measured can be part of the additional printed circuit board layer 610 and are coupled to the lower conducting layer 120 by numerous vias 642 and 644 to pass the high current through.

Figure 7B:
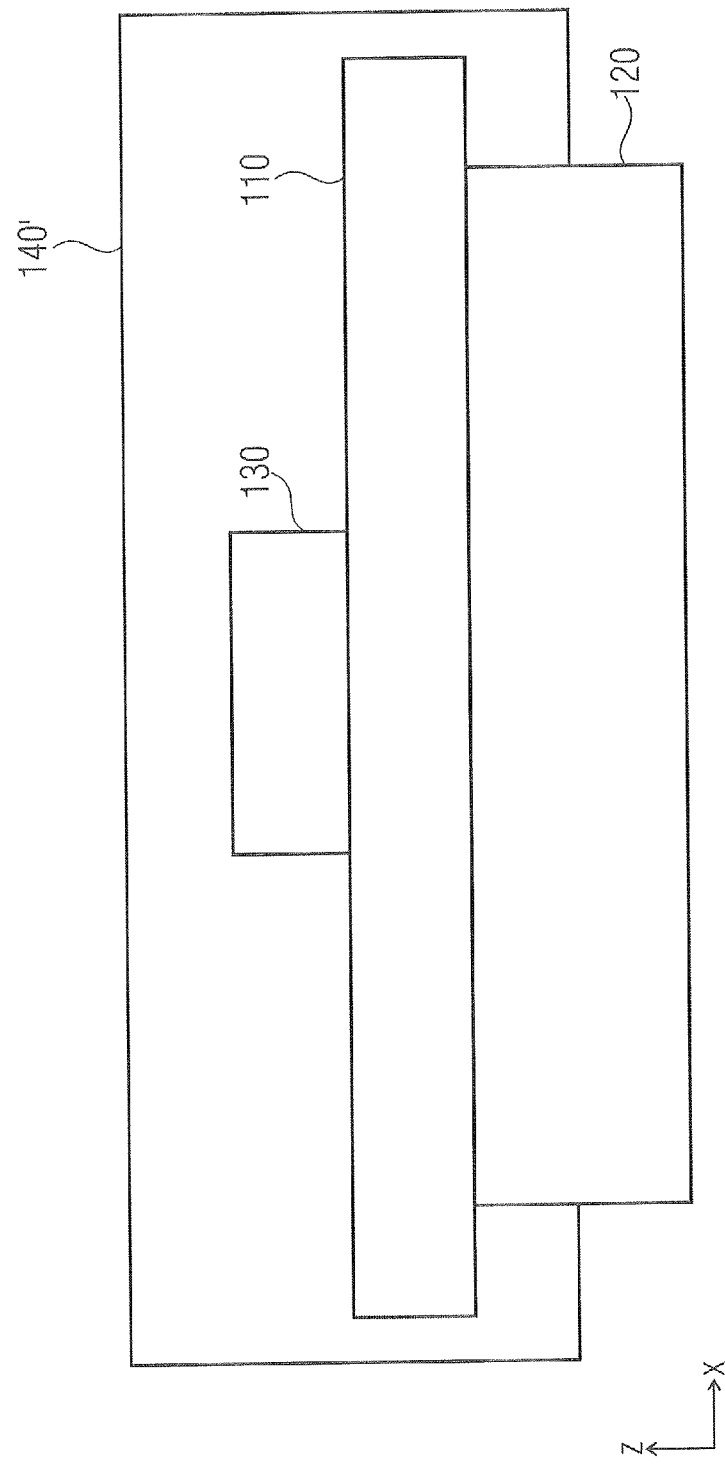

Environmental conditions may cause problems with regard to the sensor chip and its correct vertical and lateral positioning with regard to the current conductor 120, but may also affect other parts of the sensor chip. For example, lateral ingress of moisture into the printed circuit board 110 may cause major problems because the moisture may destroy the laminar structure of the printed circuit board or it may lead to dwelling of the printed circuit board thickness (e.g. its vertical dimension hp), which would cause a drift in the reading of the current, similar to the bending of the sensor chip alone. This is all the more severe as the sensor package is much smaller than ordinary printed circuit boards which hold and connect numerous devices and have e.g. 100 times longer migration paths for moisture compared to embodiments of the sensor package. Therefore, embodiments of the present invention comprise some isolation barrier against the moisture soaking of the printed circuit board. Such barriers can be, for example, a ring of wires, by coating the flush surfaces of the printed circuit board 110 with moisture-resistant varnish or grease 710 as shown in FIG. 7A, or by over-molding the entire printed circuit board as shown in FIG. 7B. FIG. 7B shows the mold body 140' not only hermetically sealing the sensor 130, but also the printed circuit board 110 from the environment. It is also possible to wrap up the printed circuit board with a moisture resistant foil or to cover its top surface with a foil, which overlaps the side walls, when it is wrapped around them. The foil can be fixed to the printed circuit board by adhesives.

It is possible to integrate further electronic components into embodiments of the printed circuit board package. In particular, it is favorable to connect a ceramic capacitor between supply pins of the sensor circuit 130, especially if the sensor circuit 130 is an active integrated circuit with a large digital part on it, which draws large currents at each clocking event. Since the rise time of the clocks is well below 10 ns, the tank capacitor needed to stabilize the supply needs to be as close as possible to the integrated circuit 130, otherwise it would be ineffective due to large series inductance caused by the long leads. On the other hand, most capacitors use at least partial magnetic materials. Thus, these capacitors would interfere with the magnetic field of the primary current to be measured and cause a measurement error. Therefore, moving the responsibility of selecting this sensitive device (the tank capacitor) and of trimming the entire sensor chip 130 after the package has been fully assembled to the semiconductor manufacturer allows to account for residual magnetism of the capacitor, to perform a calibration sequence of the whole current sensor and to provide a high sensitivity and accuracy current sensor by the manufacturer. Users of the sensor package do not have to deal with such aspects and the design-in of such sensor packages is facilitated.

Figure 8:
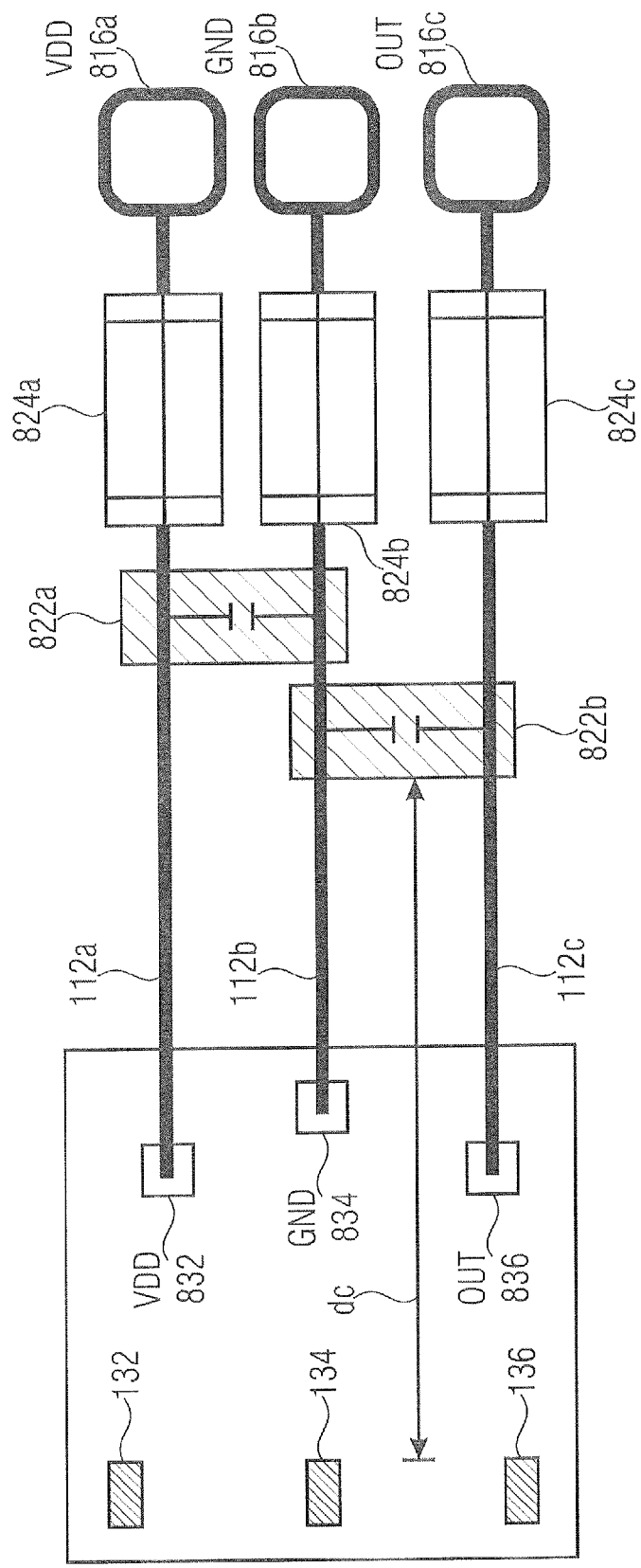
FIG. 8 illustrates a layout of an electrical connection of the sensor chip to the sensor contact pads.

Further embodiments of the sensor package comprise especially thin wires 112 to contact the sensor chip 130. Thus, in case of an accidental short-circuit between the primary current circuit and the semiconductor sensor, for example, due to malfunctioning of the insulating printed circuit board-layer 110 between the two, the thin wires 112 act as fuses and blow before transferring a lethal amount of charge to the pins of the sensor chip 130. Again, the use of a printed circuit board as a carrier for the sensor package is beneficial as it allows to produce fine long traces 112 on the second main surface of the printed circuit board to contact the sensor chip 130. Moreover, it is possible to connect a passive device such as a protection resistor or diode or a discrete fuse device into the supply and signal lines of the semiconductor die 130. An embodiment of the sensor package comprising some of the aforementioned features is shown in FIG. 8. FIG. 8 shows a layout of sensor chip 130 and its connection to connecting pads of the sensor package. FIG. 8 shows the sensor package comprising three magnetic field sensors 132, 134 and 136 and three contact pads 832, 834 and 836, wherein the contact pad 836 forms the out-pad (OUT) of the sensor package for outputting the measured current value, contact pad 834 (GND) forms the ground pad of the sensor package and contact pad 832 forms the voltage supply pad (VDD) for supplying power to the sensor chip 130. The out-pad 836 is connected via a fast fuse 824C to a contact pad 816c (OUT) of the sensor package. Ground pad 834 is connected via a conductive trace 112b and a second fast fuse 824b arranged in series to a connecting line 112b to a ground pad 816b (GND) of the sensor package. Power supply pad 832 is connected via a third conductive trace 112a and a third fast fuse 824a to a power supply pad 816a (VDD) of the sensor package. The fast fuses 824a,b,c blow in case of over-current, i.e. in case the current exceeds a certain threshold current. In particular embodiments of the sensor package all pins 832, 834 and 836 are protected by fuses or thin conductor traces, which act like fuses, to provide a save protection of the sense pins VDD, GND and OUT or 832, 834 and 836. In addition, a first voltage stabilizing capacitor 822a is connected between the conductive traces 112a and 112b and a second voltage stabilizing capacitor 822b is connected between the conductive traces 812c and 812b. In other words, the sensor chip 130 is connected via ample conductive traces 112a, 112b and 112c to a capacitor and a series fuse in each line, whereby the distance dc of the capacitor and the fuses to the sensor chip 130 is large enough to guarantee no magnetic interference onto the sensor operation. The conductive traces or bond wires are thick enough to have sufficiently small resistance and inductance. Other embodiments of the sensor package may comprise, besides the sensor chip, one or several discrete circuit elements, e.g. discrete circuit elements not integrated into the sensor chip, coupled between a pin or a contact of the sensor chips, for example, 832, 834 and 836, and an external contact or contact pad of the sensor package, for example, 816a, 816b and 816c. Typically such discrete circuit elements comprise lead frames and/or contacts with nickel (Ni) plating or other materials which are magnetic. To reduce disturbances of the measurement of the magnetic field of the current by magnetic fields caused by these discrete circuit elements or by magnetic materials used in their construction, one or all of these discrete circuit elements of embodiments of the sensor package comprise only material with a relative permeability of less than 1.1 or in case the discrete circuit elements comprise material with a relative permeability of 1.1 or more than 1.1 the discrete circuit elements are arranged spaced apart from the magnetic field sensor by at least 1.5 mm. In even further embodiments, the sensor package 100 does not comprise any discrete circuit elements with a relative permeability of more than 1.1 that is arranged in a distance smaller than 1.5 mm to any magnetic field sensor element of the sensor chip. The discrete circuit elements described above comprise, for example, capacitors, fuses and/or electrical conductors including the conductive traces 112 laminated on the printed circuit board.

Common printed circuit board materials can establish a voltage insulation of 4 kV at thicknesses or vertical dimensions (z-axis) of 150 µm. If, for example, even higher voltage insulation of up to 12 kV is needed, additional insulation layers like polyimide layers, for example comprising or made of Kapton, can be arranged between the printed circuit board 110 and the sensor chip 113. FIG. 9A shows an embodiment of a sensor package with a printed circuit board 110 comprising a cavity on a second surface 110b, in which the sensor chip 130 is arranged and, wherein between the sensor chip and the printed circuit board 110 an additional insulation layer 910 is arranged to increase the voltage insulation or dielectric strength. In contrast to the embodiment according to FIG. 2, the cavity has larger lateral and vertical dimensions than the sensor chip 130 and also a vertical dimension larger than a combined vertical dimension of the sensor chip 130 and the additional insulating layer 910, so that the mold body 140 is used to completely fill the cavity and to thus seal the sensor chip 130 from the environment. As can be seen from FIG. 9A, the main surface of the mold body 140 facing away from the current conductor has the same height level as the printed circuit board 110. For such embodiments the contacts to the sensor chip 130 can be made via thin traces of copper on the top surface of the additional insulating layer, for example a Kapton tape, if the sensor chip is mounted upside-down or via simple bond wires if the sensor chip 130 is mounted face-up.

Whereas FIG. 9A shows a schematic cross-sectional view of an embodiment of the sensor package with a flip-chip mounted sensor chip and an additional insulation layer between the sensor chip and the printed circuit board, FIG. 9B shows a schematic cross-sectional view of an alternative embodiment of the sensor package with a face-up mounted sensor chip and an additional insulation layer between the sensor chip and the printed circuit board. The term he refers to the vertical dimension of the magnetic field producing region vertical to the first main surface 110a of the printed circuit board 110, hp refers to the vertical dimension of the region 110i of the printed circuit board 110 arranged between the sensor chip 130 and the magnetic field producing region 126 of the current conductor 120 (see also FIG. 10 or 2), hi refers to the vertical dimension of the insulating layer or the region of the insulating layer arranged between the sensor chip 130 and the magnetic field producing region 126, and hd refers to the vertical distance between one or all magnetic field sensors associated to the current conductor and comprised in the sensor chip and the surface 110a of the current conductor facing towards the sensor chip or magnetic field sensor 132. As can be seen from FIG. 9A (top down mounting of the sensor chip), the vertical distance hd roughly corresponds (in case the magnetic field sensor is arranged near or at the surface 130a of the sensor chip facing towards the current conductor) to the vertical dimension of the printed circuit board hp (in case no other layers are arranged between the sensor chip and the current conductor, or to the total of the individual vertical dimensions, e.g. hi+hp, in case one or more insulating or dielectric layers are between the sensor chip and the current conductor. In case of face-up mounted sensor packages or sensor packages, wherein the magnetic field sensor is arranged near or at the surface 130b of the sensor chip facing away from the current conductor (see FIG. 9B), the distance of the magnetic field sensor to the surface 130a of the sensor chip is also included in the vertical distance hd.

It is possible to add another conductor at the bottom of the package, for example, by arranging the current conductor 120 onto this additional conductor. FIG. 10 shows a schematic cross-sectional view of an embodiment of the sensor package with an additional current conductor 1020 arranged on the main surface 120*a* facing away from the sensor chip 130. The vertical dimension of this additional current conductor 1020 is larger than the vertical dimension of the current conductor 120. Thus, a series resistance of the additional current conductor 1020 is smaller than a series resistance of the current conductor 120. This keeps the dissipation low and allows to reduce the dissipation considerably while keeping the magnetic field produced by the magnetic field producing region 126 still high. In certain embodiments the vertical dimension of the additional conductor layer is 2 times larger than the vertical dimension he of the current conductor, or 5 times larger. The layer 1020 can be a coarsely patterned thick conducting layer 120 and the layer 120 a finely patterned thin conducing layer.

FIG. 11 shows a further embodiment of the current conductor 120, wherein the magnetic field producing region 126 comprises two notches 1028 and 1028' arranged opposite to each other with regard to the current flow direction such that the two notches 1028 and 1028' define a central reduced cross-section, wherein additionally three slits 128, 128' and 128" are arranged on opposite sides of the reduced cross-section to bend the current flow according to a "W"-shape (see arrow D). The reduced cross-section and the additional bending of the current by the slots increases the magnetic field at the slots and provides basis for a high sensitivity current measurement by magnetic field sensors arranged above the ends of the slots 128, 128', 128". The two slots 128 and 128' reach from the top downwards (with regard to the orientation of FIG. 11) and the central slot 128' reaches from the bottom up (with regard to the orientation of FIG. 11).

FIG. 12 shows a schematic top-view of a sensor package with a current conductor similar to the one shown in FIG. 11 (with three slots, two on one side and the central slot on the opposite side with regard to the flow direction). FIG. 12 shows the three slots 128, 128' and 128", the sensor chip 130 with contact pads 1232, 1234 and 1236, wherein the contact pads 1232 of the sensor chip 130 are connected via bond wires 114*a* to conductive traces 112*a* and the contact pads 1234 and 1236 of the sensor chip 130 are connected by bond wires 114*b* to conductive traces 112*b*. For demonstration purposes only one transparent varnish was used as insulation layer between the current conductor and the sensor chip 130.

Figure 13:
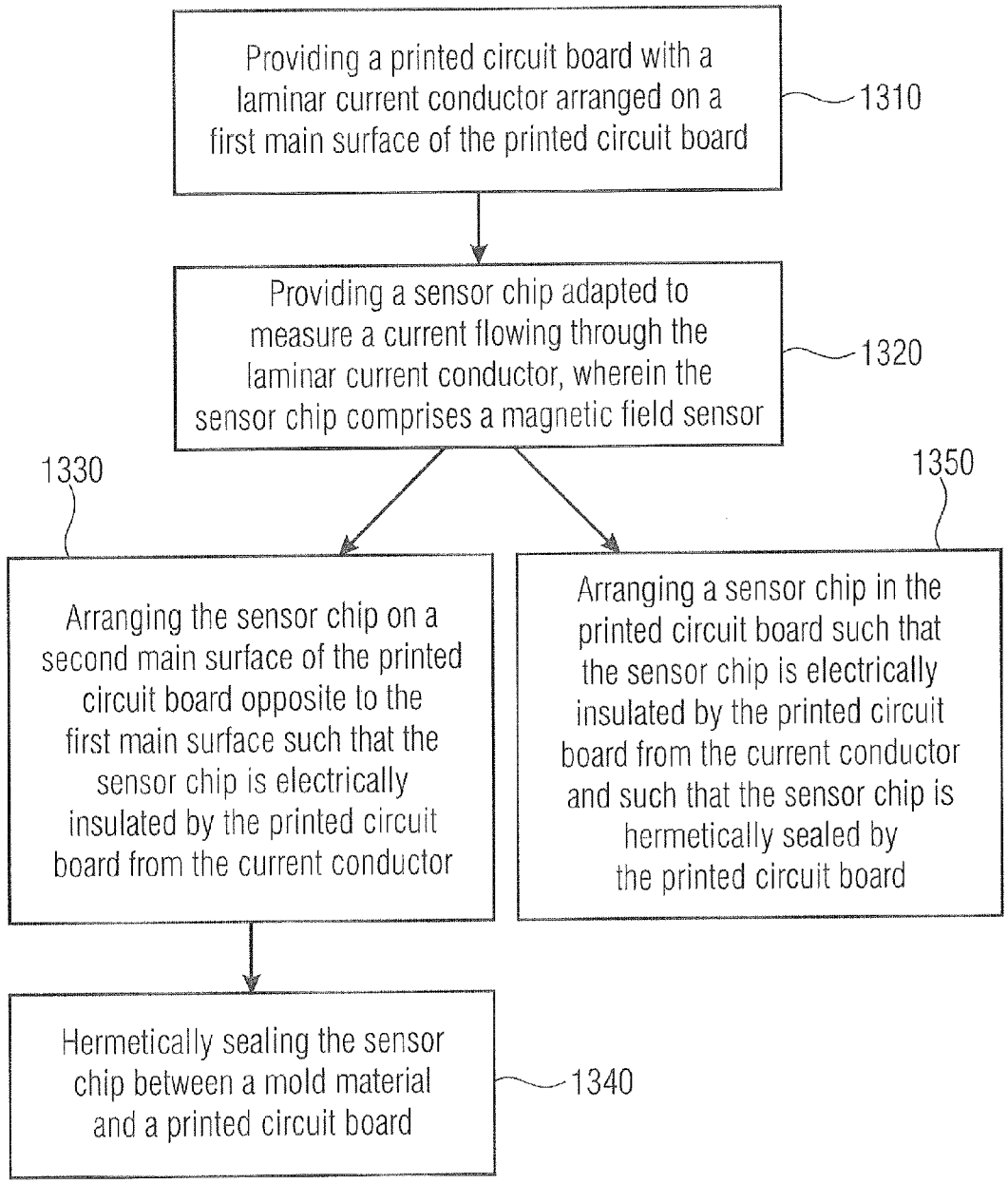
FIG. 13 illustrates a flow-chart of an embodiment of a method for producing an embodiment of the sensor package.

FIG. 13 shows a flow chart of a method for producing a sensor package. The method for producing a sensor package comprises, providing 1310 a printed circuit board with a laminar current conductor arranged on a first main surface of the printed circuit board, and providing 1320 a sensor chip adapted to measure a current flowing through the laminar current conductor, wherein the sensor chip comprises a magnetic field sensor. According to a first embodiment, the method further comprises arranging 1330 the sensor chip on a second main surface of the printed circuit board opposite to the first main surface such that the sensor chip is electrically insulated by the printed circuit board from the current conductor, and hermetically sealing 1340 the sensor chip between a mold material and a printed circuit board.

According to a second alternative embodiment of the method, the method comprises arranging 1350 a sensor chip in the printed circuit board such that the sensor chip is electrically insulated by the printed circuit board from the current conductor and such that the sensor chip is hermetically sealed.

Further embodiments of the method comprise arranging the sensor chip on the second main surface of the printed circuit board using alignment structures or alignment marks arranged on the second main surface.

Even further embodiments comprise producing the sensor chip in a printed circuit board panel comprising a plurality of sensor chips, wherein one or all of the steps of producing and testing are performed with the sensor chip arranged in the printed circuit board panel. In addition, the sensor package can be isolated from the printed circuit board panel after an end-of-line test, wherein the sensor chip is tested individually (in parallel or in series) from other sensor chips of the printed circuit board panel.

Further embodiments of the method comprise calibrating the sensor package, e.g. before isolating the sensor chip from the circuit board panel. The calibration comprises applying a current of a known intensity to the current conductor, measuring the current or obtaining the signal of the magnetic field sensor or the sensor chip associated to the current, comparing the known intensity of the current with the measured intensity of the current and determining a deviation between the known intensity of the current and the measured intensity of the current and applying a correction of the measured value to reduce the deviation so that after the calibration the evaluation unit outputs the correct current intensity value. The correction can be performed by the evaluation unit, e.g. by mapping the signal provided by the magnetic field sensor and/or mapping a value obtained based on this value to an output value provided in a mapping table (calibration table) or calculated based on a mapping function (calibration function).

In certain embodiments the calibration is performed after the complete sensor chip has been packaged, e.g. after the sensor chip and any other optional discrete circuit element has been sealed by the printed circuit board and/or the sealing material, and only the external contacts or pads, e.g. 816*a*, 816*b*, 816*c*, of the sensor package remain for electrically connecting the sensor chip. Thus, any production variation, e.g. with regard to the electrical characteristics of the sensor chip, the one or more magnetic field sensors comprised in the sensor chip and the individual discrete circuit elements and/or any production variation, e.g. with regard to assembling and structuring variations like the position, structure and dimensions of the current conductor and the relative position of the magnetic field sensors with regard to the current conductor and the optional notches or slits, can be corrected using calibration information stored in the sensor chip or sensor package to obtain a reliable and high accuracy current sensor package at low cost.

The printed circuit board packages have a lower thermal mass than lead frame packages and, thus, smaller thermal settling times and shorter calibration times, in particular, when calibrating the sensor package at different temperatures. Thus, the production of PCB current sensor packages, as described above, have lower production costs compared to conventional lead frame based current sensor packages.

Further embodiments of the sensor package can comprise a housing or package for an integrated circuit 130 with one or several magnetic field sensor elements 132, which measures the electric current flowing through the current conductor 120 by measuring the magnetic field coupled to the current. These packages 100 comprise a current conductor 120, a printed circuit board or printed circuit board intermediate layer 110 and an integrated semiconductor chip 130 hermetically sealed by the printed circuit board or by the printed circuit board and molding material.

Further developments of such embodiments may comprise a current conductor 120 with a laminar shape, i.e. the lateral dimensions of the current conductor in both extension directions (x and y axis) are considerably larger than the vertical dimension (z-axis) of the current conductor.

In further developments of such embodiments the current conductor may comprise two contact regions 122, 124 and a magnetic field producing middle area 126 arranged in-between the two contact regions, wherein each of the contact regions and also the magnetic field producing region 126 comprises a larger area (extension with regard to the lateral dimensions) than the semiconductor chip 130, and/or wherein the magnetic field producing region 126 has a vertical dimension (z-axis) larger than the printed circuit board intermediate layer 110.

In further developments of such embodiments the printed circuit board intermediate layer 110 can be arranged such that a dielectric strength of at least 1000 V is accomplished and/or the printed circuit board intermediate layer 110 can be adapted to have no magnetic components and no conducting areas for large circular eddy currents, for example, eddy currents with a diameter of more than 1 mm.

In further developments of such embodiments the printed circuit board forms a means to mechanically support and electrically connect electronic components via conductive traces, for example, etched from copper sheets laminated onto a non-conductive board comprising an insulating or dielectric composite material. The composite materials used for circuit board production are, for example, made up of two or more different materials which remain separate and distinct on a microscopic level within the finished structure. Typically two categories of materials of producing composite material are distinguished, matrix material and reinforcement material, wherein the enforcement material reinforces the matrix material to provide the rigid composite material or composite structure. Matrix materials are often polymeric materials, also referred to as resin solutions, whereas for reinforcement materials often fibers, but also woven sheets of paper are used. Well-known composite materials used for printed circuit boards are, for example, FR-2 (phenolic cotton paper) FR-3 (cotton paper and epoxy), FR-4 (woven glass and epoxy), FR-5 (woven glass and epoxy), G-10 (woven glass and epoxy), CEM-1 (cotton paper and epoxy), CEM-2 (cotton paper and epoxy), CEM-3 (woven glass and epoxy), CEM-4 (woven glass and epoxy), CEM-5 (woven glass and polyester). In particular the FR composites are commonly used due to their flame-retardness (FR-flame retardant).

Typically, a layer of copper is coated or laminated over the entire substrate, on one side or on both sides. To produce the wanted conductive traces or conductors, e.g. the conductive carrier 120 or the conductive traces 112, the unwanted core parts are removed. Besides these subtractive methods also additive processes are known for producing the conductive traces. Thin conductive traces can, for example, be galvanically treated to produce conductors with larger vertical dimensions or thicknesses. Several printed circuit boards can be stacked to form multi-layer printed circuit boards. The conductors of the different printed circuit boards within a multi-layer printed circuit board can be connected to each other through conductive vias.

Laminar current conductors allow to bring the current close enough to the sensor on one hand and at the same time to keep the internal resistance of the conductor minimal, to optimize the thermal coupling between the current conductor and the sensor chip and to provide a strong mechanical connection through a large bonding surface which remains stable within a micrometer range over the whole lifetime of the sensor package.

The contact regions 122 and 124 have a major influence on the internal resistance of the current conductor. In certain embodiments the contact regions 122 and 124 are arranged such that the current is bent only to a minimum extent when passing from the first current conductor to the magnetic field producing region (current input) and when passing from the magnetic field producing region to a second contact region (current output). Additionally, the contact regions typically do not change the magnetic field at the position of the magnetic field sensors even in case the exact geometry of the contact positions varies, for example because the contacts are not soldered all over or the current providing conductor is not soldered at the center of the first or second contact region.

In further embodiments, the magnetic field producing region comprises at least one slot or one diminution, or in other words at least one feature at which the current lines are bent strongly and/or the current density is increased considerably.

The circuit for a semiconductor chip 130 for measuring the magnetic field of a conductor can require, e.g. about 7 mm.sup.2. Embodiments of the sensor package with current sensors for currents in a range between 20 A and 500 A, thus, can comprise internal resistances within a range of 20 µΩ to 200 µΩ. The sensor chip may, for example, have lateral dimensions of 2.6 mm×2.6 mm or 2 mm (dimension in x-direction)×3.5 mm (dimension in y-direction or flow direction). The sensor packages comprising such sensor chips may comprise magnetic field producing regions with a lateral dimension of 3 mm in flow direction (x-direction) and at least 4 mm in a lateral dimension perpendicular to the flow direction of the current (y-direction). In case the magnetic field-producing region has a vertical dimension (thickness) of 0.1 mm, the resistance of the magnetic field-producing area is about 20 µΩ (for copper). Due to the reduced cross sections, the resistance is increased to roughly 30 µΩ to 50 µΩ depending on the form and number of the notches and slits. In addition, the contact regions have an additional own resistance and there is a further resistance portion, because the current flow from the larger contact region to the smaller magnetic field-producing region is compressed. Therefore, current conductors with a vertical thickness of 0.1 mm to 0.4 mm have resistance values of about 20 µΩ to 2 mΩ or 3 mΩ.

Further embodiments of the magnetic field-producing region have, for example, lateral dimensions of 5 mm×5 mm. The contact regions for 20 A-current sensors are smaller, for 200 A-current sensors, each of the contact regions again covers roughly an area of 25 mm$^2$, however, typically not quadratic, but with a shorter lateral dimension in the flow direction and a longer lateral dimension perpendicular to the current flow direction.

A vertical dimension of the magnetic field producing region 126 defines how strong the magnetic field drops or decreases with an increase of the vertical distance from the current conductor surface. Therefore, the vertical dimension of the current conductor is, e.g., chosen to be larger than the vertical dimension of the insulating layer, for example the printed circuit board intermediate layer 110 or 110*i*, or any combination of or a stack of insulating layers so that sufficient magnetic field couples over the insulating layer to the magnetic field sensor.

Therefore, in one implementation the printed circuit board 110 has, e.g., a minimum vertical dimension of 100 µm, no conductive vias between the opposite main surfaces in the region below and right next to the chip and overlaps the borders of the sensor chip 130 by at least 0.2 mm.

Copper laminations used in conventional circuit boards are often plated using nickel. However, in the neighborhood of the magnetic field sensors, for example within the distance of less than 1.5 mm, materials with a coercive force of more than 1 A/m are often avoided so as to not disturb the measurement of the magnetic field.

Further embodiments of the sensor package comprise a first and a second contact region 122, 124 which are not covered by the printed circuit board intermediate layer 110. In other words the contact regions 122 and 124 are directly accessible from both sides. This is prevalent in some instances, for example, if the sensor package is bolted to massive bus bars or welded using an ultrasonic nozzle to external conductors. Further, external conductors can be welded to the contact regions using an ultrasonic nozzle, for example.

Further embodiments of the sensor package comprise a magnetic field producing region 126 with at least one structural element that effects a strong inhomogenity of the current density, for example through an increase by 150% or more (with 100% referring to the average current density at the contact area), or a strong bending of the current lines, for example by more than +/−40° compared to a main current direction or a virtual direct connection between the first contact region and the second contact region, and wherein the magnetic field sensor element is arranged right above this cavity or slot with a tolerance of +/−1.2 mm.

According to a further embodiment, a sensor chip 130 comprises a memory means for storage of calibration information, for example an EEPROM-memory (EEPROM— electrically erasable programmable memory) or some kind of analog memory like laser-trimming of resistors and the sensor package is produced in a printed circuit board panel so that a cost efficient calibration in mass production through a test-in-strip-handler (perhaps even at several temperatures) is possible. One aspect of this embodiment is that each device or sensor package has its own, individual calibration information, which accounts for position tolerances of the current conductor with respect to the magnetic field sensor elements.

According to another embodiment, the sensor package 130 is produced in a printed circuit board panel such that the PCB-panel can be isolated after an end-off-line-test, by punching or snapping the individual packages out of the PCB-panel. It should be noted that conventional sensor-packages are produced and tested in a copper panel. However, in these conventional sensor-packages the copper is too thick for isolating the individual packages easily, for example by punching. In addition, the copper forms an electric coupling of the individual devices in the copper-panel so that the individual devices cannot be powered or tested individually and independently from each other. In contrast thereto, some aspects of this disclosure use a printed circuit board as carrier for the production and producing the sensor package within a printed circuit board panel, such that the individual sensor packages cannot only be easily isolated but also individually tested within a printed circuit board panel.

According to another embodiment, the printed circuit board intermediate layer 110 is sealed at its periphery so that a dwelling of the laminar structure due to humidity or a delamination due to life cycle stress, for example cycle stress, can be avoided or limited. A sealing of the printed circuit board can be performed by finish, coating via spraying or with a foil, evaporation or molding.

According to another embodiment, the printed circuit board 110 comprises on a main surface on which the sensor chip is arranged, a thin conductor layer, for example a copper lamination, which either serves as an electrostatic shield or as contact for the sensor chip or as means for bonding the sensor chip via soldering, in particular via diffusion soldering.

According to another embodiment, the printed circuit board 110 comprises on a first main surface in which the current conductor 120 is arranged, a thin conductor layer, for example a copper lamination, which is electrically connected to the current conductor, for example by soldering, e.g. diffusion soldering, or bonding within conductive adhesive. The thin conductor layer or conductor layer can provide a particularly stable, also temperature stable, mechanical connection or can be used to self-center the printed circuit board layer relative to the current conductor through the surface tension of the solder or the adhesive.

According to another embodiment the printed circuit board 110 comprises a thin conductive layer on the second main surface on which the sensor chip is mounted, for example a copper lamination, serving as contact means for the sensor chip, wherein the integrated circuit or sensor chip is mounted face-down on the printed circuit board such that bond paths of the sensor chip are contacted to the copper lamination via solder balls, solder bumps or conductive adhesive.

According to another embodiment a printed circuit board intermediate layer 130 comprises a thin conductive layer, for example a copper lamination, on the second main surface of the chip upon which the sensor chip is mounted, wherein the sensor chip is mounted face-up on the printed circuit board and the electrical connection between the bond paths and the conductive traces on the printed circuit board is realized via bond wires. According to another embodiment, the printed circuit board intermediate layer comprises means for centering upon the current conductor, for example mating boreholes or grooves.

According to another embodiment all contact regions of the printed circuit board do not comprise a lamination with permeable materials with a relative permeability of more than 1.1 or are arranged in a distance of at minimum 1.5 mm to the magnetic field sensor elements.

According to another embodiment the contact regions of the current conductor and the contacts of the sensor chip are arranged in one plane such that the sensor package is suitable for a surface mount assembly.

According to another embodiment, the magnetic field producing region of the current conductor has a vertical dimension at its thinnest section of at least 0.2 mm.

According to a further embodiment the dielectric strength of the printed circuit board intermediate layer 130 is strengthened by a laminated polyimide layer, for example a Kapton foil, for example with a vertical dimension smaller than 0.2 mm, and in particular within a range of 50 µm to 125 µm.

According to another embodiment the sensor chip is completely surrounded by printed circuit board material. In other words, the sensor chip 130 is laminated into the printed circuit material such that the printed circuit board is not only arranged between the sensor chip and the current conductor but the sensor chip is also covered by the printed circuit board on the remaining top main surface facing away from the current conductor.

To reduce or avoid eddy currents, particular embodiments of the sensor package as described based on FIGS. 1A to 12 only comprise the printed circuit board or other dielectric layers or material between the sensor chip 130 and the magnetic field-producing area 126 and do not comprise any electrically-conductive layers, in particular, no massive conductive layers with particular dimensions of more than 100 µm (unlike typical lead frame packages). Therefore, embodiments of the sensor package with face-up mounted sensor chips, as shown in FIG. 4, do not comprise any electrically conductive layers or structures between the sensor chip 130 and the current conductor 120 and, in particular, not between any of the magnetic field sensors 132, 134 (associated to the current conductor and the magnetic field-producing region 126) and the magnetic field-producing region 126. Therefore, certain embodiments of the sensor package comprising a flip-chip mounted or top-down mounted sensor chip 130, as shown in FIG. 3, only comprise thin lateral conductive traces to connect the sensor chip, for example, to connect the power supply pins, control pins and output pins of the sensor chip 130 to other discrete electric components integrated in the sensor package or to the contact pads for the external connection of the sensor package, between the sensor chip 130 and the current conductor 120 and do not comprise any further conductive structures or layers between the sensor chip and the current conductor. In addition, these thin lateral conductive traces are not arranged between the magnetic field sensors and the magnetic field producing region.

Further embodiments of the sensor package may comprise an insulation arranged on a surface of the current conductor or additional current conductor covering a part of the surface or the entire surface. This insulation can be, e.g., a further printed circuit board layer or a solder stopping layer.

In contrast to the embodiments described above in various embodiments of FIGS. 1-13, a container separate from a circuit board may be used to separate the sensing semiconductor chip from the source of the measurement (e.g., current rail for a current sensor). The isolating container may be formed using materials best suited for improving the sensitivity of the sensor without compromising the integrity of the semiconductor package. FIGS. 14-22, and 24 illustrate sensor packages having such an isolating container in various embodiments of the invention. FIG. 23 illustrates embodiments of fabricating the semiconductor package. The sensors could be any type of sensor such as thermal sensor, current sensor, magnetic sensor, radiation sensor including ion and electron sensors, electromagnetic waver sensors including photo-electric sensors.

Figure 14A:
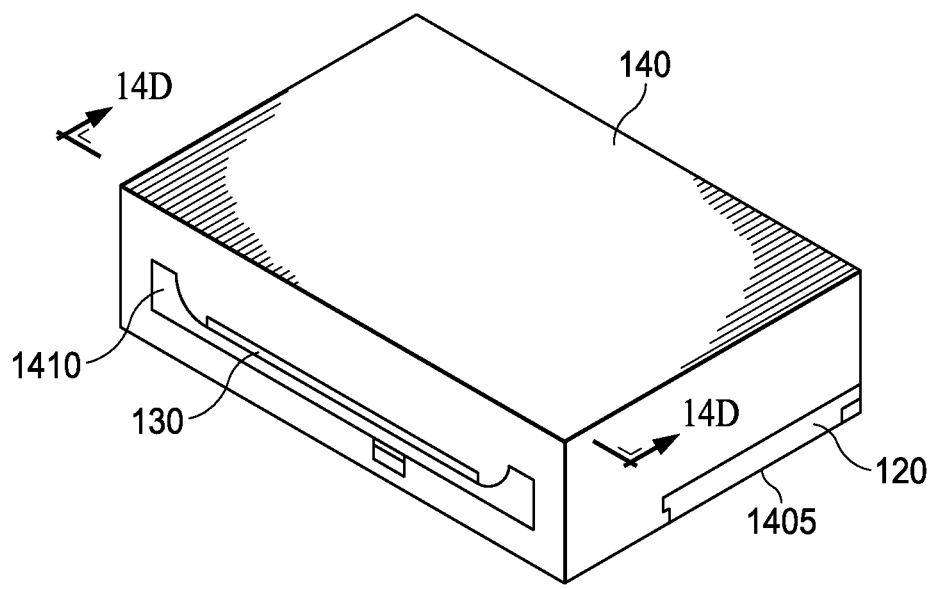
Figure 14B:
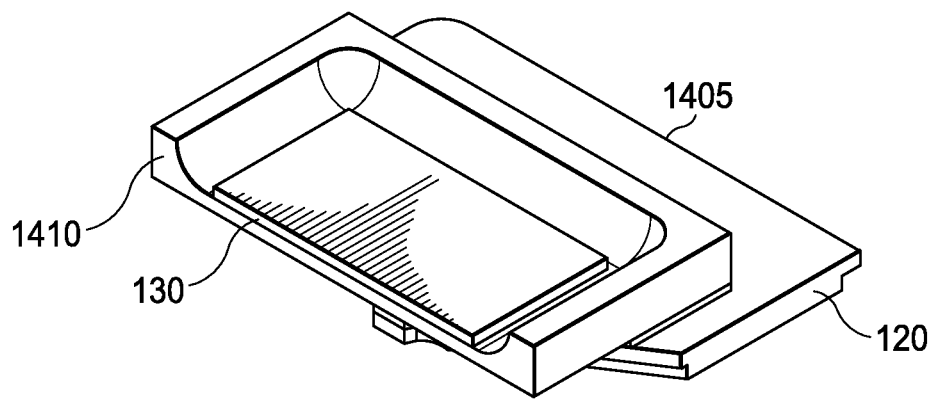
Figure 14C:
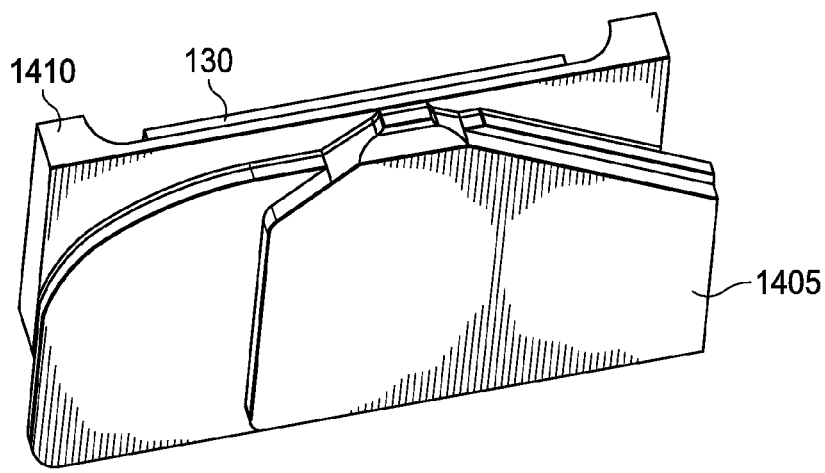
Figure 14D:
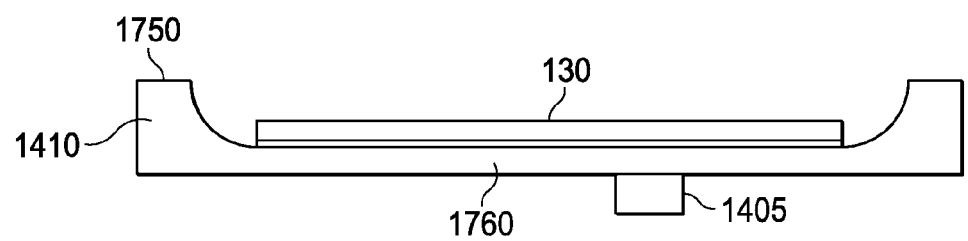
Figure 14E:
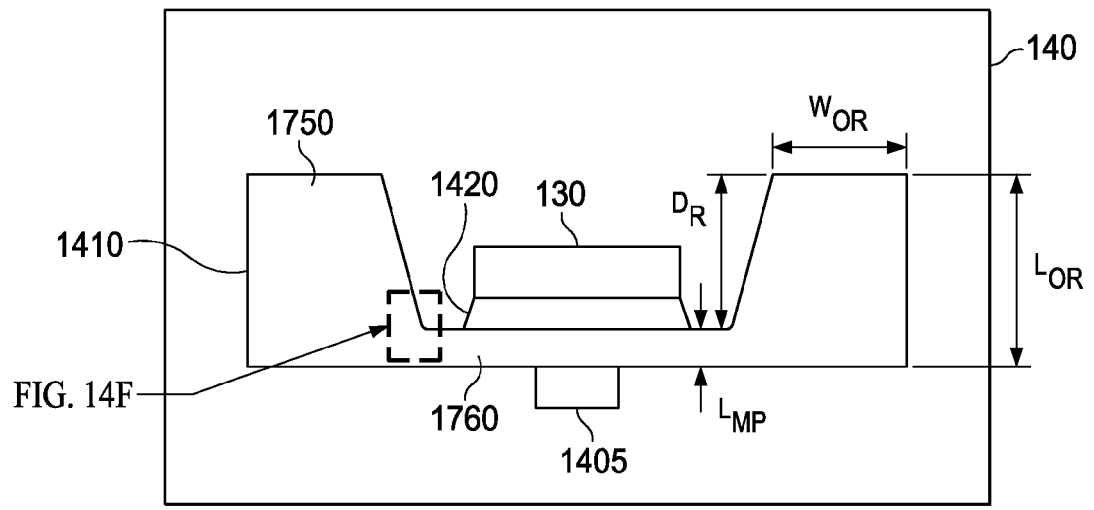
Figure 14F:
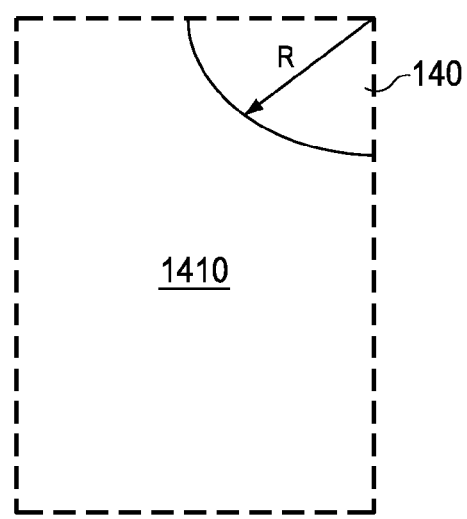

FIG. 14, which includes FIGS. 14A-14F, illustrates a sensor package comprising an isolating container in accordance with an embodiment of the invention, wherein FIGS. 14A-14C illustrate various projection views, wherein FIGS. 14B and 14C illustrate projection views from different angles without the mold body, and FIGS. 14D-14F illustrate cross-sectional views.

A sensor chip 130 is disposed within a mold body 140. The mold body 140 may be a mold compound, an encapsulant not formed using a mold compound, a sealant not formed using a mold compound, or other materials. Further, the mold body 140 is optional in various embodiments and is used for illustration purposes. Unlike the prior embodiments of FIGS. 1-13, the sensor chip 130 is disposed on an isolating container 1410. The isolating container 1410 separates the sensor chip 130 from a backplane 1405 (e.g., conductor 120). The sensor chip 130 may be attached to the isolating container 1410 using a chip adhesive layer 1420 (FIG. 14D). The backplane 1405 could be a part of a leadframe and die paddle as illustrated in FIG. 15.

In various embodiments, the backplane 1405 may have different shapes to improve the sensitivity of the sensor within the sensor chip 130. Examples of the backplane 1405 include the shapes described in various embodiments in FIG. 1-13, including the "I," "U," "S" shapes described in FIGS. 1B and 1D. The backplane 1405 may be mechanically weak due to such patterning. Therefore, the backplane 1405 may be attached to the isolating container 1410, which advantageously provides mechanical stability to the backplane 1405. In various embodiments, the backplane 1405 may be attached to the isolating container 1410 using a solder element, an adhesive, a bolt, or may be snapped into place etc. The backplane 1405 may be attached to the isolating container 1410 using a foil in one embodiment.

In various embodiments, the sensor chip 130, the isolating container 1410, and the backplane 1405 are encapsulated within a mold body 140.

As illustrated in FIGS. 14B and 14D, the isolating container 1410 has a recess surrounded by a thick outer rim. Thus, the isolating container 1410 has a thin membrane portion 1760 under the bottom of the recess while having a large thickness at the outer rim portion 1750.

In various embodiments, the thin membrane portion 1760 may have a thickness $L_{MP}$ of about 10 μm to about 150 μm, and about 50 μm in one embodiment. The reduced thickness of membrane portion provides excellent sensitivity by improving the coupling with the backplane 1405. In various embodiments, the total distance between the sensor chip 130 and the backplane 1405 is as small as possible, preferable 100 μm or less.

The thicker outer rim portion 1750 provides mechanical stability during handling and fabrication of the semiconductor package. Without the outer rim, the thin membrane would be susceptible to breakage due to mechanical failure. In various embodiments, the outer rim portion 1750 may have a thickness $L_{OR}$ of about 100 μm to about 500 μm, and about 300 μm in one embodiment. In various embodiments, the outer rim portion 1750 may have a lateral width $W_{OR}$ of about 200 μm to about 500 μm, and about 300 μm in one embodiment.

Advantageously, the size of the recess is large enough to accommodate the sensor chip 130. However, the depth of the recess $D_R$ must not be too large to avoid forming voids during molding. In one embodiment, the depth of the recess $D_R$ is less than about 300 μm, and about 150 μm to about 250 μm. In various embodiments, the ratio of the depth of the recess $D_R$ to the thickness of the thin membrane portion $L_{MP}$ is about 4:1 to about 6:1. In various embodiments, the depth of the recess $D_R$ depends on the processing capability and requirements.

The sensor chip 130 may comprise a thickness between about 30 μm to about 500 μm while the back plane may have a thickness between about 100 μm to about 5 mm.

In various embodiments, the recess is bowl shaped or may have curved sidewalls. This may be because of forming the recess using an isotropic etch process. As illustrated (e.g., FIG. 14E), in one or more embodiments, the recess has a sidewall that is inclined away from the normal to the bottom surface of the recess. In other words, in the cross-sectional view illustrated in FIG. 14E, the recess has trapezoidal shaped sidewalls.

Further, in various embodiments, the corners of the sidewalls are rounded as illustrated in FIG. 14F, which is a magnified cross-sectional view of a region of FIG. 14E. The rounded corners may be produced using isotropic etching as described in FIG. 21. The radius R of the corner thus produced may be around 10 nm to about 1000 nm in various embodiments, and about 100 nm to about 300 nm in one embodiment.

The isolating container 1410 comprises glass in one or more embodiments. In various embodiments, different type of glasses may be selected. In one or more embodiments, the isolating container 1410 comprises a borosilicate glass in one embodiment. Borosilicate glass having boron oxide and silica has a high voltage of insulation of over 10 kV at thickness or vertical dimensions of 150 μm. Therefore, the thin membrane portion 1760, which has a thickness of only about 10 μm to about 150 μm, can support voltages upto and even more than 10 kV in various embodiments. In case of current and magnetic sensors, the glass is chosen to be free from magnetic materials such as iron and nickel etc. Other types of glass such as fused glass, quartz may be used in other embodiments.

In various embodiments, the type of glass selected may depend on the desired insulation property. For example, for current sensors, the material of the glass is chosen to withstand large electrical fields without breakdown. In one or more embodiments, for current sensors, any type of glass having a large band gap (e.g., >8 eV) and high dielectric strength (e.g., >$10^6$ V/cm) may be used for forming the isolating container 1410. Glass based materials, unlike organic materials used as printed circuit board materials, have higher dielectric breakdown and therefore the isolating container 1410 may be used under high electric fields than otherwise possible using printed circuit board materials.

Alternatively, in case of thermal sensors, the material of the glass is chosen to withstand large thermal gradients. In one or more embodiments, the material of the glass must have high thermal conductivity so that a time independent thermal profile is established within the glass rapidly. Thermal sensors may be electromagnetic wave (optical) sensors, i.e., measuring the radiation emitted from the object to be sensed. In such embodiments, the material of the glass must be chosen to have excellent properties in that particular range of wavelength.

In various embodiments, the material of the isolating container 1410 is chosen provide dielectric breakdown immunity (described above), mechanical stability during production, handling, lifetime, patterning ability (e.g., forming recess using cost effective and mass production enabling processes), chemical inertness, lifetime stability at elevated operational temperatures (e.g., 150° C. to about 250° C.), good wettability with adhesives and molding compound. In one or more embodiments, the material of the isolating container 1410 is chosen to have suitable physical properties, e.g., being non-magnetic and non-conductive for current sensors, or being optically non-absorbing for photo sensors.

Further, the recessed shaped isolating container 1410 has many advantages over a planar isolation material. For example, compared to a planar isolation material having the same foot print (e.g. bottom surface area), the isolating container 1410 increases the outer isolation length and thereby reduces the risk of delamination around the sidewalls of the sensor chip 130. In contrast, the planar isolation material may obtain similar protection only by increasing the thickness or increasing the lateral width, which increases production costs and/or reduces the sensitivity of the sensor.

In various embodiments, the backplane 1405 may comprise a heat sink, a thermally conductive slab for a temperature sensor, a current rail for a current sensor, and may comprise copper in one embodiment. In other embodiments, the backplane 1405 may comprise other electrical or heat conducting materials.

The semiconductor package keeps the sensor chip 130 in close proximity to the backplane 1405 to remove heat from the sensor chip 130, e.g., in power semiconductors, in one embodiment. In another embodiment, the semiconductor package keeps the sensor chip 130 in close proximity to a backplane to measure the temperature of a structure coupled to the backplane 1405. In another embodiment, the backplane 1405 may be used to conduct current (e.g., conductor 120) and the sensor chip 130 comprises magnetic field sensor elements which measure the magnetic field associated with the current flow. In another embodiment, the backplane 1405 may be used as a key in a keyboard and the sensor of the sensor chip 130 may detect the change in resistance or capacitance as well as impedance for alternating current between separate parts of the backplane 1405 or between the backplane 1405 and a reference potential such as ground potential.

Accordingly, in various embodiments, the sensor chip 130 is rigidly mounted with respect to the backplane 1405 in order to have a low thermal resistance path between the sensor chip 130 and the backplane 1405 or in order to have a stable calibration in case of a sensor within the sensor chip 130.

In various embodiments, the sensor chip 130 is accurately mounted with respect to the backplane 1405 in order to have well a defined capacitive, thermal, or magnetic coupling between the backplane 1405 and the sensor chip 130.

In various embodiments, the semiconductor package establishes several contacts between the sensor chip 130 and contacts such as pins or bumps and contact areas on the surface of the package. These contacts may supply the sensor chip 130 with electric power and input and output signals to and from the die.

In various embodiments, the thermal and/or electro-magnetic coupling between the backplane 1405 and the sensor chip 130 is stable over the lifetime of the package. In various embodiments, the semiconductor package is robust against delamination and the insulation between the backplane 1405 and protects the sensor chip 130 from humidity from ambient (which might cause a change in dielectric properties or lead to a change in thickness due to swelling).

In various embodiments, the packaging (e.g., molding of the mold body 140) provides hermetic sealing and protects the sensor chip 130 from environmental influences (e.g., mechanical, chemical, moisture, light exposure, soft radiation). In one or more embodiments, in case of sensors, the semiconductor package does not contain large conducting parts close to the sensor chip 130 or between the sensor chip 130 and the backplane 1405 to avoid disturbing the magnetic or capacitive coupling between the backplane 1405 and the sensor chip 130.

Figure 15A:
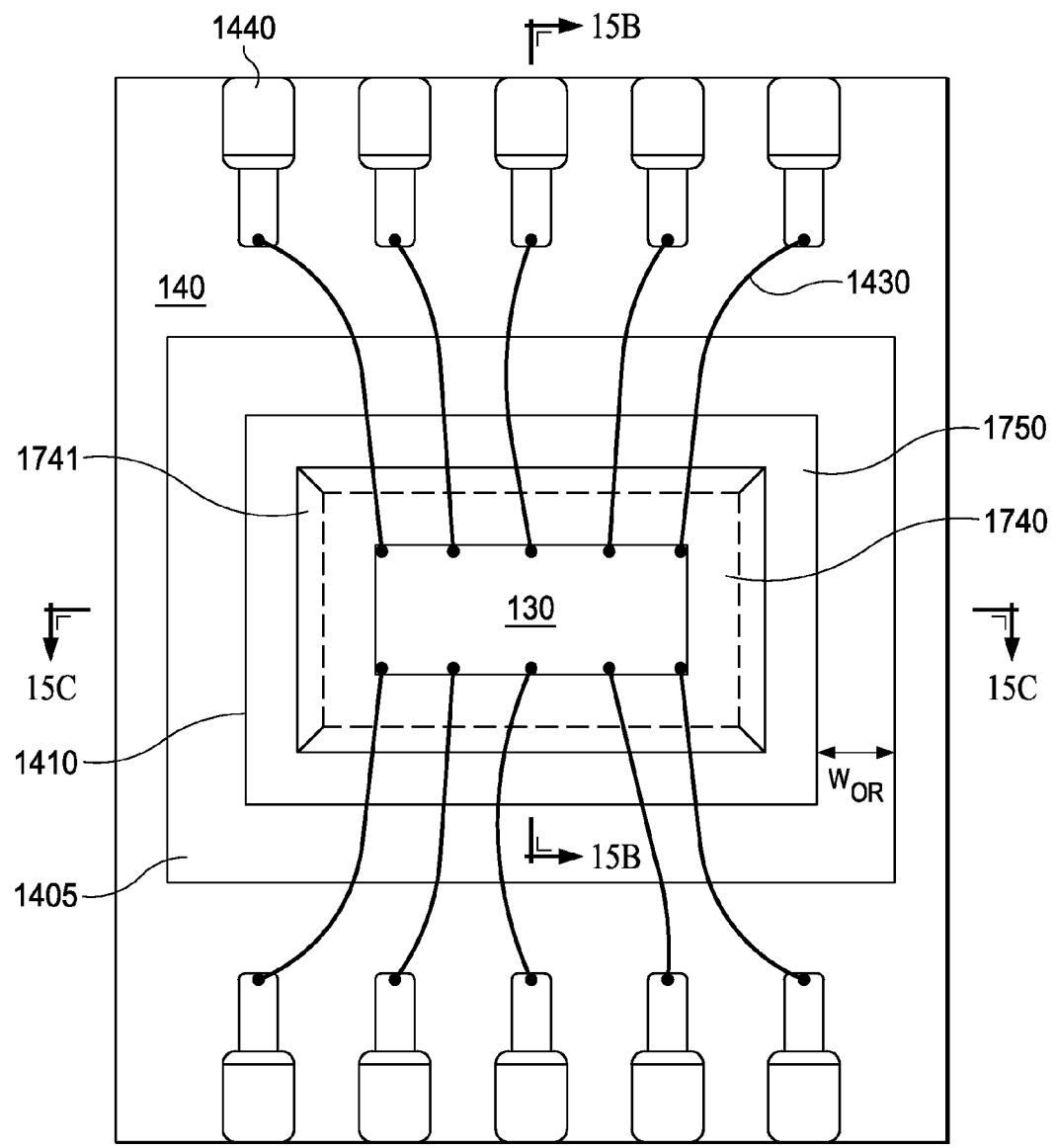
Figure 15B:
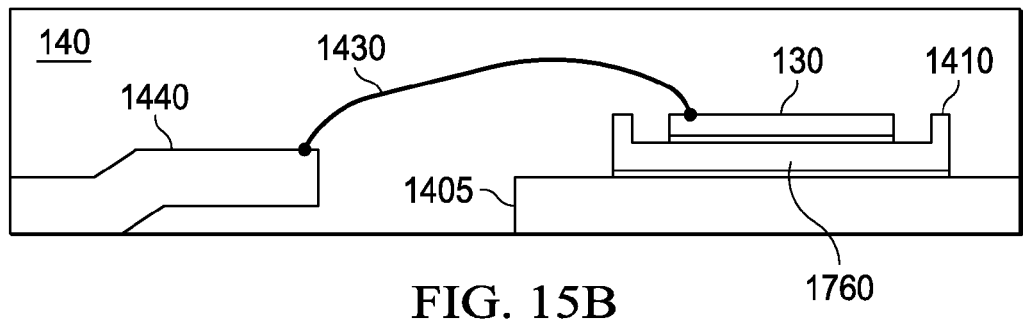
Figure 15C:
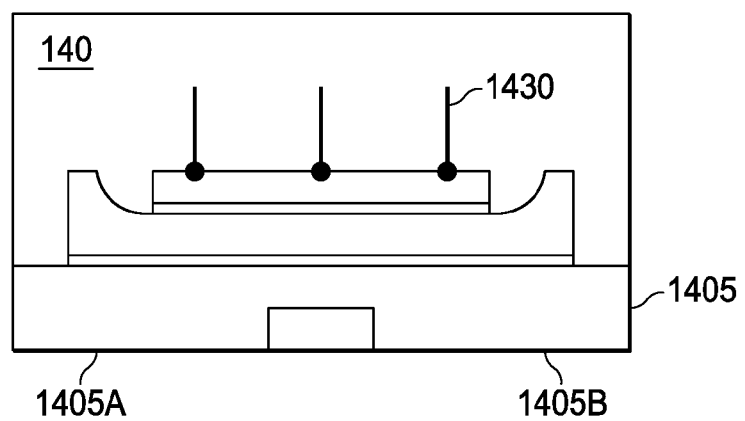

FIG. 15, which includes FIGS. 15A-15C, illustrates an embodiment of a semiconductor package having an isolating container, wherein FIG. 15A illustrates a top view and FIGS. 15B and 15C illustrate cross-sectional views.

In various embodiments, a lead frame package is shown only as an illustration. Embodiments of the invention also include other type of packages including ceramic packages and any other type of package.

Referring to FIG. 15A, a sensor chip 130 is placed over an isolating container 1410. The isolating container 1410 is disposed over a leadframe comprising a plurality of leads 1440 and a backplane 1405 (e.g., a die handle or die paddle). The isolating container 1410 has the shape and composition as described using FIG. 14. Similarly, the backplane 1405 may have any suitable shape, for example, as in FIG. 14 and/or FIG. 1. The sensor chip 130 is coupled to the plurality of leads 1440 through wire bonds 1430. Input and output signals are provided to the sensor chip 130 through the plurality of leads 1440.

The sensor chip 130, the isolating container 1410, the leadframe (backplane 1405 and plurality of leads 1440) and wire bonds 1430 are encapsulated within a mold body 140 as in the prior embodiment.

In one embodiment, the plurality of leads 1440 is arranged on one side of the sensor chip 130. In various embodiments, the plurality of leads 1440 is arranged on more than one side, and on all sides of the sensor chip 130. The sensor chip 130 is disposed in a recess 1740 forming an outer rim portion 1750 with a lateral width $W_{OR}$ and a thin membrane portion 1760 (see FIG. 15B). The sidewall 1741 of the recess 1740 may have a bowl shaped or a trapezoidal shape in one embodiment (FIG. 15A) or alternatively may have a vertical sidewall (FIG. 15B).

Referring to FIG. 15B, the plurality of leads 140 may be raised relative to the bottom surface of the lead frame. For example, this enables to reduce the length of the wire bonds 1430 thereby reducing the parasitic inductances of the wires.

In one embodiment, the plurality of leads 1440 is arranged on two sides as in FIG. 15A while the backplane leads 1405A and 1405B, which are leads for the backplane 1405, are arranged along the perpendicular direction to the plurality of leads 1440 as in FIG. 15C. FIG. 15C also illustrates the backplane 1405, which may include thinner portions to increase the current or thermal density locally under the sensor chip 130, as described previously, e.g., FIG. 1B.

FIG. 16 illustrates a semiconductor package including an isolating container with a conductive layer in accordance with an embodiment of the invention.

FIG. 16 is similar to the embodiments described above with respect to FIGS. 14 and 15 but includes an additional conductive layer over the isolating container.

Although the thin membrane portion 1460 of the isolating container 1410 has a high dielectric strength, adjacent regions under high electric fields may still be susceptible to breakdown. This is because voids may be present in a number of regions around the isolating container 1410. For example, voids may exist in adjacent mold body 140, within glue regions such as in the chip adhesive layer 1420, or in delaminated regions (e.g., sensor chip 130 with the mold body 140). When these voids are subjected to a high electric field, a phenomenon called partial glow discharge may occur. The gases contained within these voids may become ionized and may be accelerated by the large electric field. If a large number of ions are created, these ions may cause an ion avalanche, which can expand the voids further by burning through the material in which the void exists. Over the lifetime of the device, the void growth may breakdown the isolation region above the thin membrane portion 1460 of the isolating container 1410. Further, other breakdown mechanisms may operate at high electric fields, especially slow processes that may be difficult to identify over typical accelerated field tests, which are performed over a short period of time.

The embodiments of FIGS. 16-20 avoid high field regions above the thin membrane portion of the isolating container 1410.

Figure 16A:
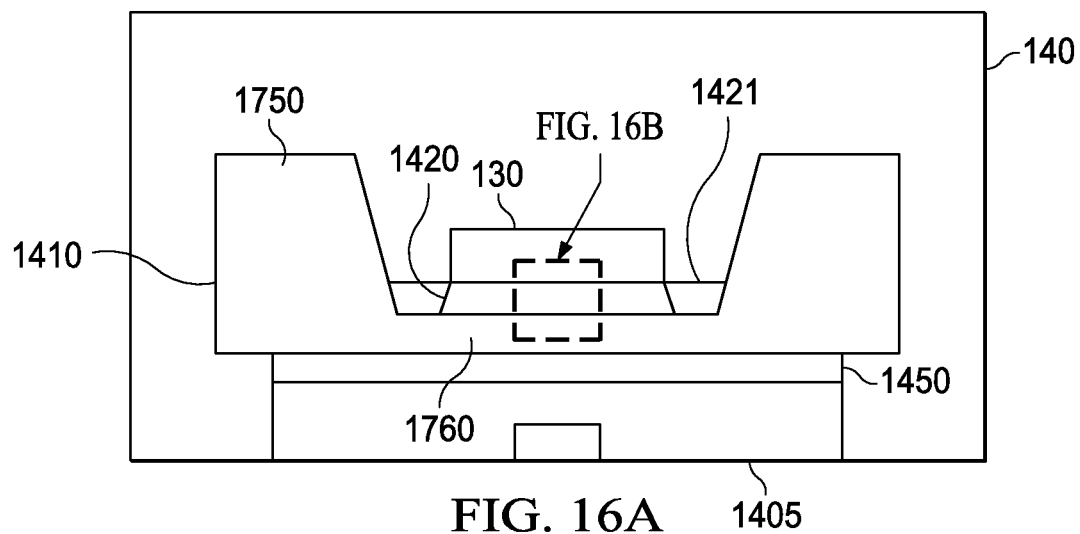
FIG. 16 illustrates a semiconductor package including an isolating container with a conductive layer in accordance with an embodiment of the invention.

As illustrated in FIG. 16A, the back surface of the isolating container 1410 is coated with a bottom conductive film 1450. The bottom conductive film 1450 is disposed between the thin membrane portion of the isolating container 1410 (alternatively over the entire back surface as in FIG. 16) and the backplane 1405. Further, the top surface of the thin membrane portion of the isolating container 1410 is coated with an annular conductive film 1421. Also, the chip adhesive layer 1420 may be a conductive material so that the entire top surface of the membrane portion of the isolating container 1410 is coated with a conductive material. In one or more embodiments, the chip adhesive layer 1420 is the same material as the annular conductive film 1421, and may be formed at the same time.

Figure 16B:
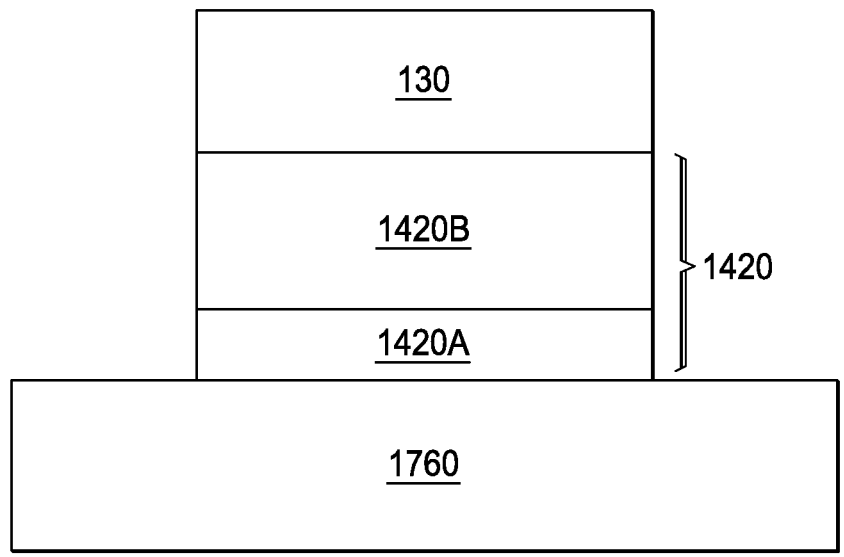

As illustrated in the magnified cross-sectional view of the chip adhesive layer 1420 in FIG. 16B, in one or more embodiments, the top surface of the isolating container 1410 and the bottom surface of the isolating container 1410 are coated with a conductive layer 1420A such as a thin metal line. In particular, in various embodiments, no other material layer is disposed between the conductive layer 1420A and the isolating container 1410, i.e., no regions susceptible to breakdown exists in the high electric field regions under the conductive layer 1420A. The conductive layer 1420A is coupled to the low voltage node of the sensor chip 130 so that the bulk of the potential drop between the sensor chip 130 and the backplane 1405 occurs within the isolating container 1410. As a consequence, the electric field above the conductive layer 1420A is significantly reduced. For example, any voids in the top portion 1420B of the adhesive layer do not undergo partial glow discharge because of the lowered electric fields.

Similarly, the bottom conductive film 1450 is coupled to the potential of the backplane 1405 avoiding high electric field regions in the mold body 140 under the isolating container 1410. The structure of the bottom conductive film 1450 may be similar to the chip adhesive layer 1420 illustrated in FIG. 16B. For example, the bottom conductive film 1450 may comprise a metal/conductive line such as the conductive layer 1420A contacting the isolating container 1410 and an adhesive material such as the top portion 1420B under the conductive layer. The contacts from the backplane 1405 and from the sensor chip 130 may be formed using wire bonds in one embodiment. In various embodiments, the top portion 1420B of the adhesive layer may also be conductive.

The material for forming the conductive surfaces must be permeable to magnetic field in case of magnetic field sensors such as Hall sensors, which sense the magnetic field from the backplane 1405. Therefore, materials with high magnetic permeability may be chosen in some embodiments. In various embodiments, ferromagnetic materials such as nickel, cobalt and iron are not part of the conductive surfaces. In various embodiments, the conductive surface may comprise a diamagnetic such as copper, gold, silver or a paramagnetic material such as molybdenum, lithium, tantalum, and magnesium. In one or more embodiments, the conductive surface may comprise aluminum, titanium nitride, and poly-silicon.

In various embodiments, the chip adhesive layer 1420, the annular conductive film 1421, and the bottom conductive film 1450 comprises a material with sufficient conductivity to be anti-static, i.e., permit the flow of electrons. The chip adhesive layer 1420, the annular conductive film 1421 (as well as the sidewall conductive film 1422, the top conductive layer 1423 described below), and the bottom conductive film 1450 may not be a low resistance material, i.e., may be a high resistance material, and may even be a semiconductor such as silicon in some embodiments. In one or more embodiments, the chip adhesive layer 1420, the annular conductive film 1421, and the bottom conductive film 1450 comprises a metal layer such as silver, platinum, gold, and may have a thickness of about 20 nm to about 100 nm.

Further, in various embodiments, the chip adhesive layer 1420, the annular conductive film 1421, and the bottom conductive film 1450 may comprise an adhesive layer coated over a conductive layer. Alternatively, the chip adhesive layer 1420, the annular conductive film 1421, and the bottom conductive film 1450 may be a single adhesive conducting layer.

Figure 17:
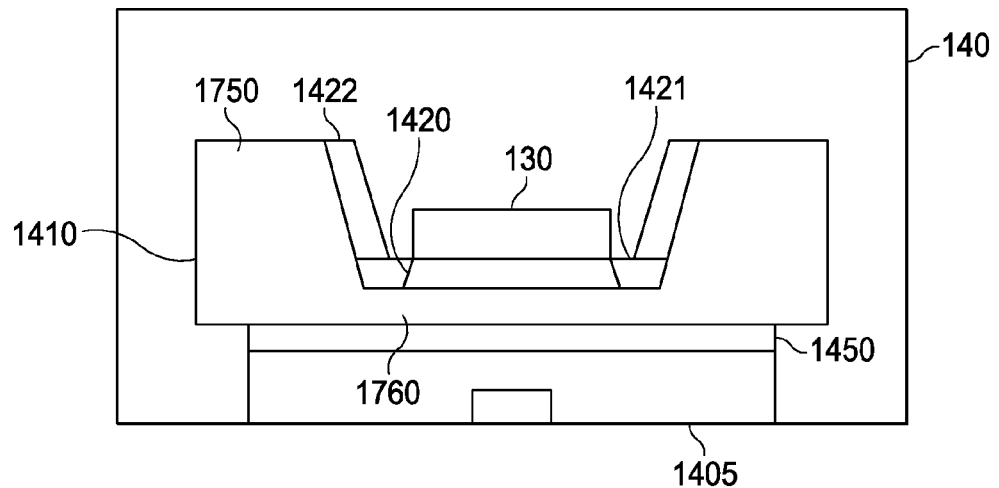
FIG. 17 illustrates an embodiment of a semiconductor package having conductive surfaces over the sidewalls of a recess in the isolating container.

FIG. 17 illustrates an embodiment of a semiconductor package having an isolating container with conductive surfaces over the sidewalls of the recess.

FIG. 17 is similar to the embodiment of FIG. 16 in having conductive surfaces. Unlike FIG. 16, in FIG. 17, the sidewalls of the recess are also covered with a sidewall conductive film 1422, which is a conductive material.

Advantageously covering the sidewalls of the recess with a sidewall conductive film 1422 pushes the high electric field region further away from the thin membrane portion 1760 into the thicker outer rim portion 1750 of the recess. Thus, this embodiment further protects the susceptible regions around the thin membrane portion 1760 from electric field associated breakdown mechanism.

Figure 18A:
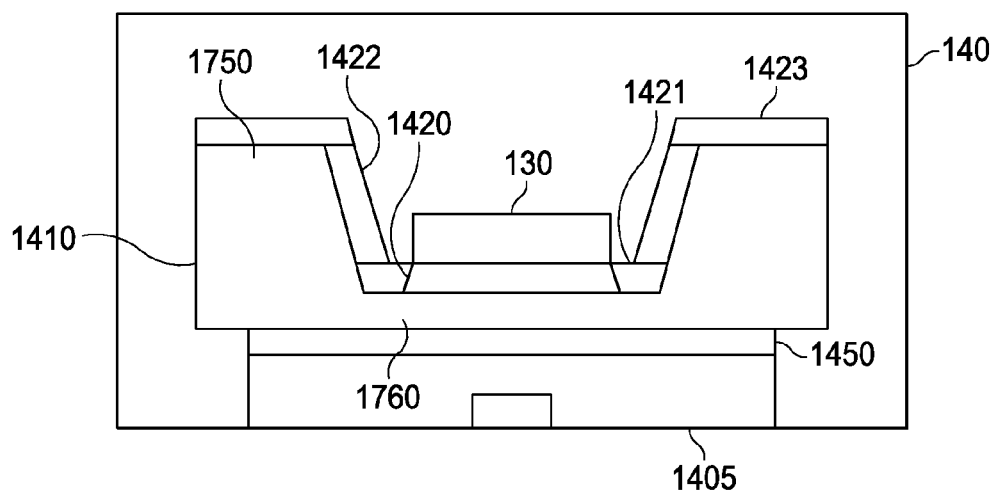
FIGS. 18A and 18B, illustrates a semiconductor package having an isolating container with conductive coating covering the top surface, in accordance with an embodiment of the invention.
Figure 18B:
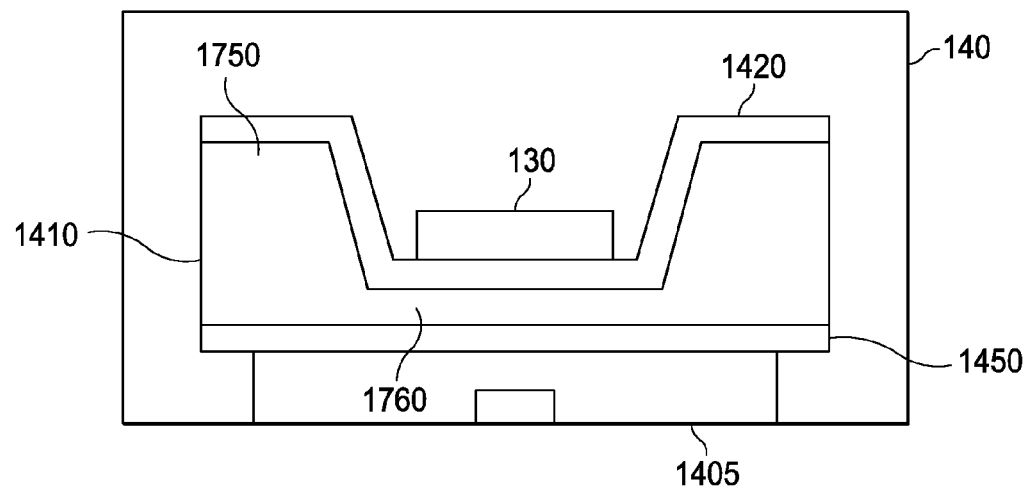

FIG. 18, which includes FIGS. 18A and 18B, illustrates a semiconductor package having an isolating container with conductive coating covering the top surface, in accordance with an embodiment of the invention.

In FIG. 18A, the top surface of the outer rim portion 1750 of the isolating container 1410 is also covered with a conductive coating, a top conductive layer 1423. As illustrated in the alternative embodiment of FIG. 18B, the top conductive layer 1423 may be formed at the same time as the chip adhesive layer 1420, the annular conductive film 1421, and the sidewall conductive film 1422. Hence, the chip adhesive layer 1420 may cover all of the top surface of the outer rim, the sidewalls, and the top surface of the thin membrane portion as illustrated in FIG. 18B. The embodiment of FIG. 18B is simpler to fabricate as the conductive layer does not have to be patterned thus avoiding fabrication steps (e.g., saving a mask). Further, in one or more embodiments as illustrated in FIG. 18B, the entire bottom surface of the isolating container 1410 may be covered with a conductive material (bottom conductive film 1450).

When the conductive material covers the complete top surface of the isolating container 1410 (as in FIG. 18), the entire voltage drops over the sidewalls of the isolating container 1410. Thus, the thickness of the outer rim of the isolating container 1410 is adjusted (increased if necessary) to avoid any breakdown within this region.

Figure 19:
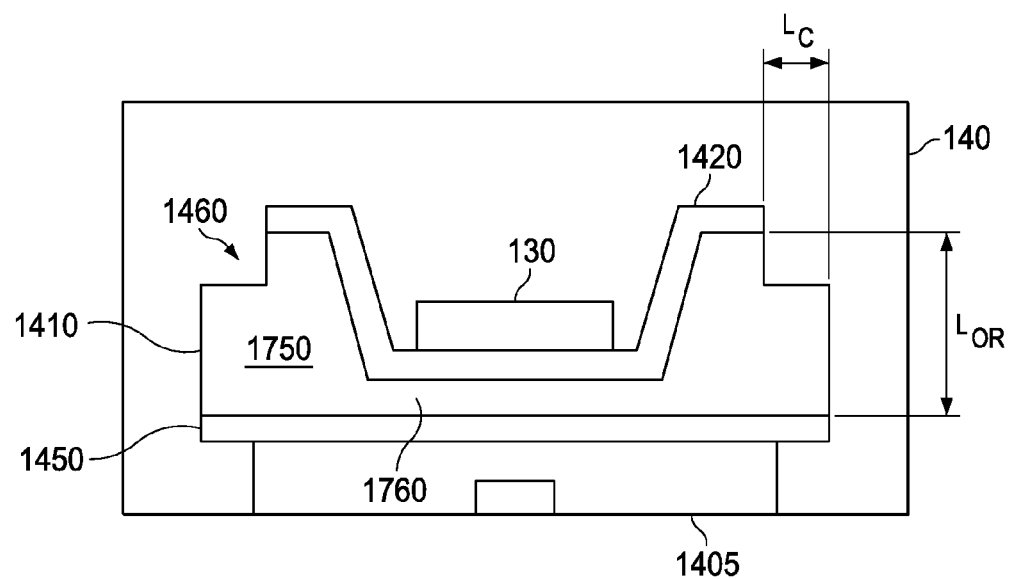
FIG. 19 illustrates an additional feature of the isolating container to prevent delamination in accordance with an embodiment of the present invention.

FIG. 19 illustrates an additional feature of the isolating container to prevent delamination in accordance with an embodiment of the present invention.

The backplane 1405 may be larger than the sensor chip 130 in various embodiments. In particular, in one embodiment, the backplane 1405 overlaps at least parts of the sawing edge along the circumference of the sensor chip 130. This poses a special problem to reliable galvanic isolation in conventional packages, because even oxide, nitride, or polyimide isolation layers suffer from cracks and chipping along the sawing edge. Such delamination can result in further failure under high electric fields. However, as illustrated in the various embodiments, the use of the isolating container 1410 with or without conductive surfaces eliminates this issue.

As described previously with respect to FIG. 18B, large electric fields are present along the outer sidewalls of the outer rim portion of the isolating container 1410. If a delamination develops between this vertical outer sidewalls of the isolating container 1410 and the mold body 140, the delamination may grow quickly under the high electric fields. Therefore, in some embodiments, the isolating container 1410 is patterned as illustrated in FIG. 19. In particular, in various embodiments, the isolating container 1410 includes one or more steps or channels 1460. The channels 1460 prevent propagation of the delamination thereby reducing the risk of electrical glow discharge resulting in breakdown of the isolating material. Thus, the delamination does not propagate beyond the corners of the channels 1460. This is because the electric field is relatively low along the lateral direction and therefore does not propagate the delamination laterally. In one or more embodiments, the length of the channels $L_C$ is at least 10% of the length of the outer rim portion $L_{OR}$, and about 20% to about 50% in one embodiment. The channels 1460 may be fabricated without significant cost increase during dicing as described further in FIG. 23.

Figure 20A:
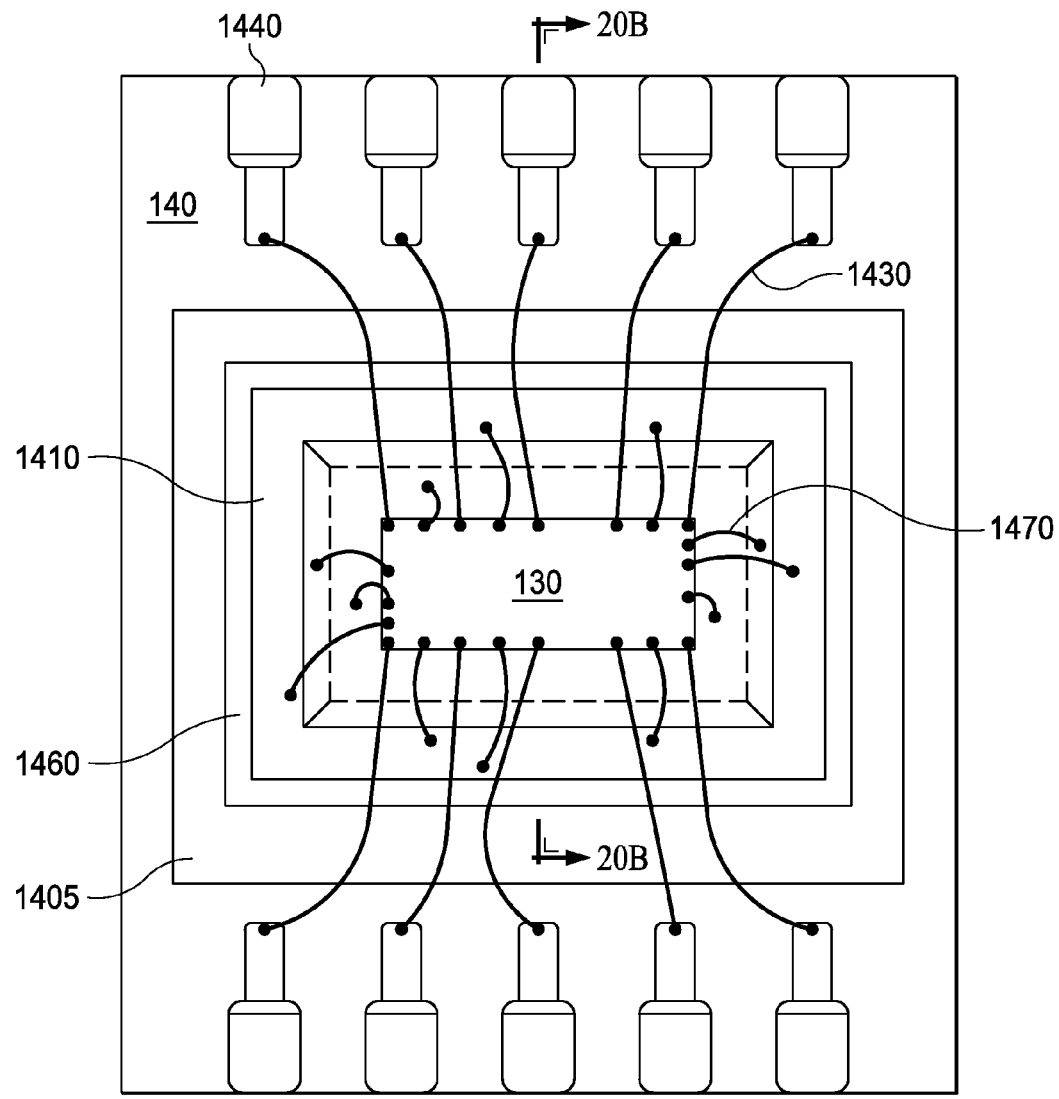
Figure 20B:
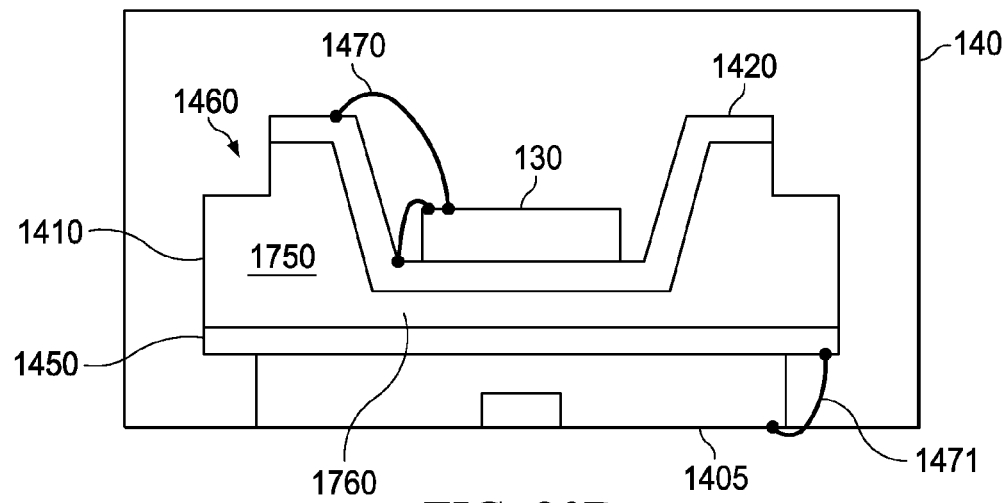

FIG. 20, which includes FIGS. 20A and 20B, illustrates another embodiment of the semiconductor package having an isolating container with a conductive layer coupled to a constant potential node through a semiconductor chip, wherein FIG. 20A illustrates a top view and FIG. 20B illustrates a cross-sectional view.

FIG. 20 includes the features of FIG. 19 such as the channels 1460 and the continuous covered conducting layer described with respect to FIG. 18B (also illustrated in FIG. 19). FIG. 20 also includes the other features described in prior embodiments such as the trapezoidal sidewall (FIGS. 15-19), the bottom conductive film 1450 (FIGS. 16-19), the plurality of leads 1440 (FIG. 15).

Additionally, the top and bottom conductive layers are coupled to a constant potential node through the sensor chip 130 and also to the backplane 1405. For example, FIG. 20A illustrates constant node wires 1470 coupling the various portions of the continuous chip adhesive layer 1420. FIG. 20B shows the backplane wires 1471 to couple to the backplane 1405. Thus, the dedicated constant node wires 1470 and the backplane wires 1471 prevent the occurrence of plasma glow discharge in regions surrounding the thin membrane portion 1760 of the isolating container 1410.

Advantageously, the embodiments described in FIGS. 17-20 (as well as FIGS. 21-22 describe below), may be formed using materials other than glass. In some embodiments, other materials such as printed circuit board material, sintered ceramic, and materials having high dielectric breakdown may be used in forming the isolating container 1410. When the potential difference across the isolating container 1410 is lower, materials with lower dielectric breakdown than glass (e.g., printed circuit board material) may be used.

Figure 21A:
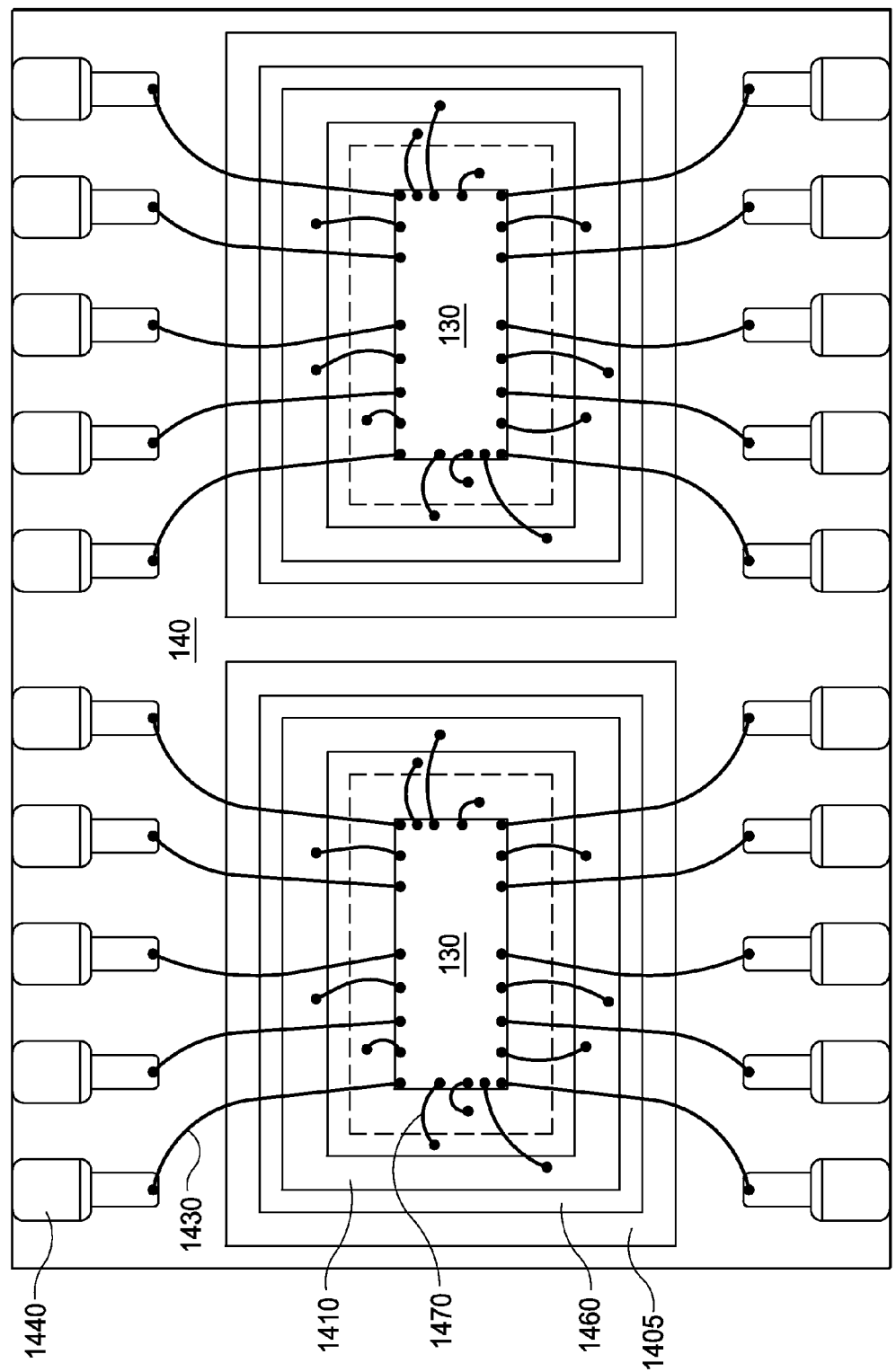
FIGS. 21A and 21B, illustrates alternative embodiment of the present invention having a plurality of chips in a single semiconductor package.
Figure 21B:
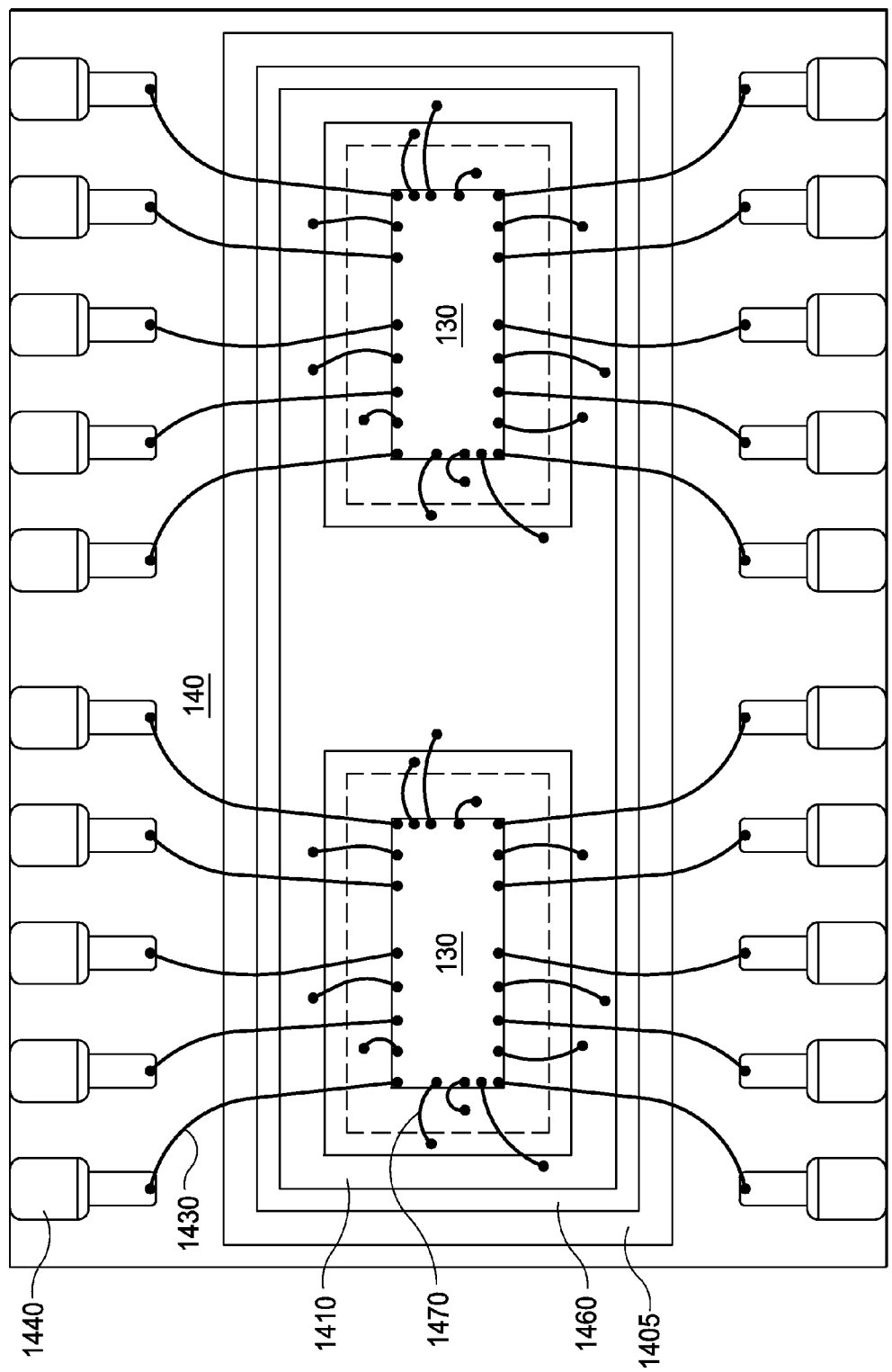

FIG. 21, which includes FIGS. 21A and 21B, illustrates an alternative embodiment of the present invention having a plurality of chips in a single semiconductor package.

FIG. 21A illustrates packaging a plurality of chips in a single package. In one embodiment, two separate isolating container 1410 may be used for isolating each of the chips. In one embodiment, both the chips are sensor chips 130. However, in another embodiment, only one of the chips is a sensor chip 130. The other chip may be any other type of chip such as general purpose processor or a special purpose microcontroller as well other types of circuits such as analog, memory etc.

FIG. 21B illustrates packaging a plurality of chips in a single package as in FIG. 21A while using a single isolating container 1410. The isolating container 1410 may be patterned to include two recesses so that each of the chips may be placed within each recess. Each of the recess may have the structure described in prior embodiments. Further, in various embodiments, the backplane 1405 underneath each of the sensor chip 130 may be used for a different purpose and therefore may be coupled to a different physical parameter. For example, in one example, a first backplane under a first chip may be coupled to a current rail while a second backplane under an adjacent second chip may be coupled to a thermal source.

Alternatively more than two recesses may be patterned within the isolating container 1410 for holding a plurality of chips. Further, in some embodiments, each recess may hold more than one chip.

In other respects, the embodiment of FIG. 21 may be similar to the embodiments described above with respect to FIG. 14-20.

Figure 22:
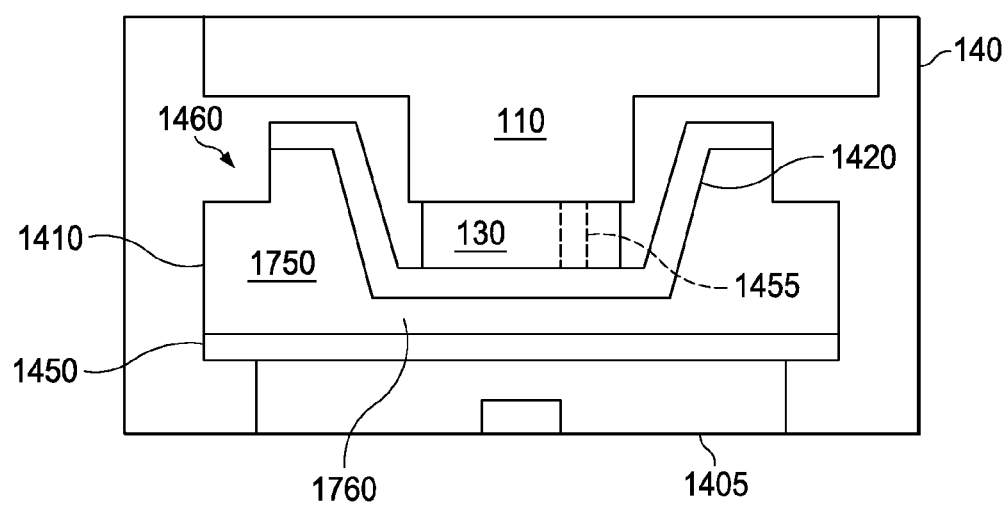
FIG. 22 illustrates a semiconductor package including an isolating container and a circuit board in accordance with an embodiment of the present invention.

FIG. 22 illustrates a semiconductor package including an isolating container and a circuit board in accordance with an embodiment of the present invention.

The embodiments described in FIGS. 14-21 do not include a separate circuit board. However, further embodiments may also include a circuit board 110. In one example embodiment, a circuit board 110 is placed over the sensor chip 130 (opposite to the side facing the isolating container 1410). The circuit board may directly contact with the sensor chip 130 if the active area of the sensor chip 130 are adjacent the side facing the circuit board 110. However, if the active areas on the sensor chip 130 face the isolating container, the circuit board may be coupled using through substrate vias 1455 within the sensor chip 130. As illustrated, the circuit board 110 may include a protruding portion to contact the sensor chip 130.

In other respects, the embodiment of FIG. 22 may be similar to the embodiments described above with respect to FIG. 14-21.

In various embodiments, the embodiments described in FIGS. 14-22 may be combined together. For example, in some embodiments, a plurality of chips may be placed within a single isolating container 1410 (as in FIG. 21B), and the plurality of chips may be coupled to a circuit board (FIG. 22). Consequently, the plurality of chips may be coupled to each other through the circuit board. Further, in various embodiments, one or more embodiments of FIGS. 14-22 may be combined with the embodiments of FIGS. 1-13.

Figure 23A:
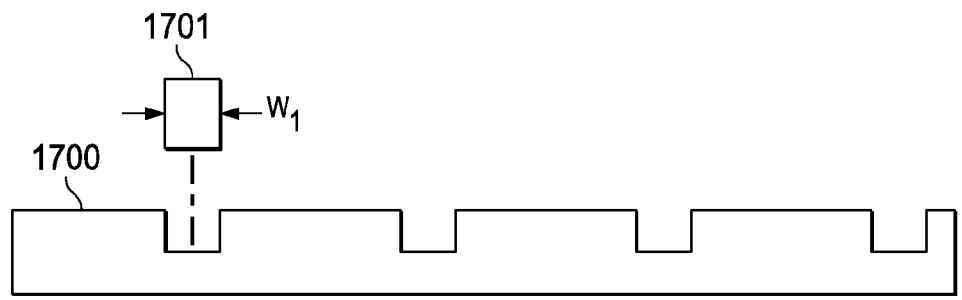
Figure 23B:
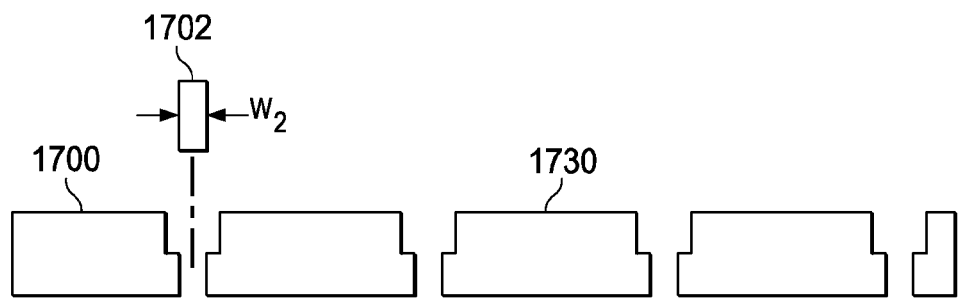
Figure 23C:
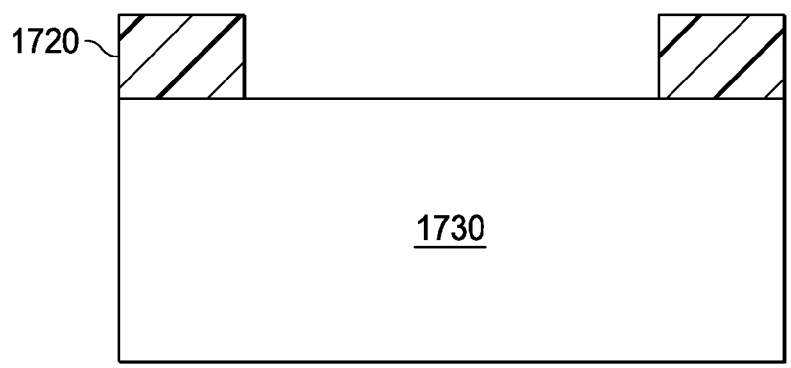
Figure 23D:
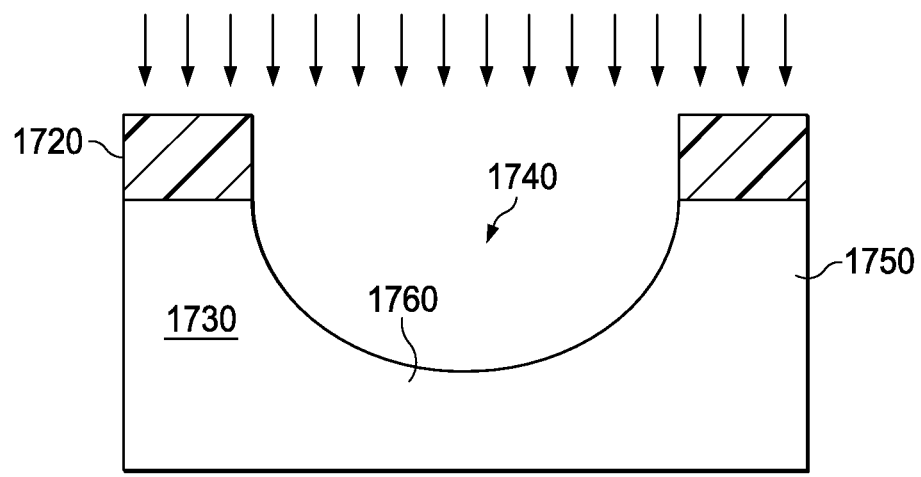

FIG. 23, which includes FIGS. 23A-23G, illustrates various stages in fabricating a semiconductor package in accordance with embodiments of the invention, wherein FIGS. 23A-23B show dicing steps and FIGS. 23C-23D illustrate steps forming the isolating container.

The dicing steps (FIGS. 23A-23B) may be performed prior to or after the process steps of FIGS. 23C-23F in various embodiments. In one embodiment, the process steps of FIGS. 23C-23F are performed prior to dicing so that wafer level processing techniques may be used. In another embodiment, the process steps of FIGS. 23C-23F are performed after dicing reducing processes complexity but also reducing throughput rate.

Referring to FIG. 23A, a wafer 1700 is provided. The wafer 1700 has the same composition as the desired isolating container described previously in various embodiments. In various embodiments, the wafer 1700 is a glass wafer of the desired composition.

The wafer 1700 is diced into a plurality of units (substrate 1730 described further in FIG. 23C). In one embodiment, the wafer 1700 is diced in a single step with a dicing tool having a first width $W_1$.

In another embodiment, the wafer 1700 is diced in multiple steps. In a first step a first dicing tool 1701 having a first width $W_i$ partially dices the wafer 1700 forming trenches 1705. After the first step, a second tool 1702 having a second width $W_2$ completes the singulation. The second width is narrower than the first width and therefore forms channels 1460 (e.g., FIG. 19) in one embodiment as illustrated in FIG. 23B. This may be accomplished by changing the sawing blade width of a same dicing tool.

Further, in alternative embodiments, the dicing steps described in FIGS. 23A and 23B may be performed from both sides so as to form channels 1460 on both sides of the isolating container 1410.

FIGS. 23C-23D illustrate the structuring processes for the isolating container in accordance with various embodiments of the invention.

Referring to FIG. 23C, a mask pattern 1720 is first formed over a substrate 1730. The substrate 1730 is a portion of the wafer 1700 illustrates in FIG. 23A and comprises the same material as the desired isolating container.

As illustrated in FIG. 23D, the substrate 1730 is patterned. In one embodiment, the substrate 1730 may be patterned chemically, for example, using a wet etching. In one or more embodiments, an isotropic etch or partially isotropic etch may be used to form a bowl shaped recess as illustrated.

In another embodiment, an anisotropic etch may be used to form a trapezoidal shaped recess (as illustrated in FIG. 14E), for example, using a plasma etch process. An additional isotropic etch may be performed at the end of the etching to improve corner rounding (as illustrated in FIG. 14F) thus avoiding sharp corners which can become regions of high electric fields. The patterned substrate 1730 is the isolating container 1410 described above in various embodiments.

As illustrated in FIG. 23D, after etching (arrows), the substrate 1730 has a recess 1740 and a thin membrane portion 1760 and an outer rim portion 1750.

Figure 23E:
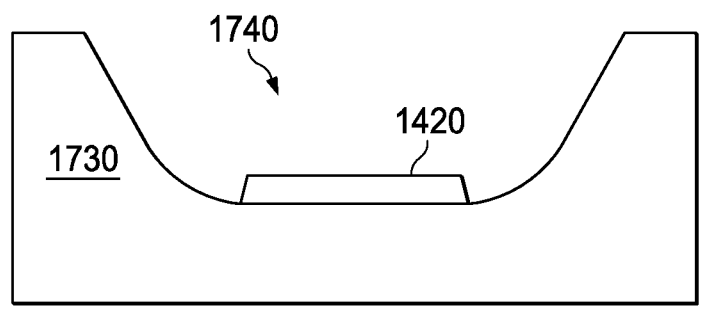

Next, a chip adhesive layer 1420 is coated and patterned as shown in FIG. 23E. Alternatively, the chip adhesive layer 1420 is coated over a central portion of the thin membrane portion 1760. The chip adhesive layer 1420 may be a conductive layer in one embodiment. In another embodiment, the chip adhesive layer 1420 may be formed in a plurality of steps. A conductive layer may be coated followed by the deposition of an adhesive layer thereby forming the chip adhesive layer 1420.

Figure 23F:
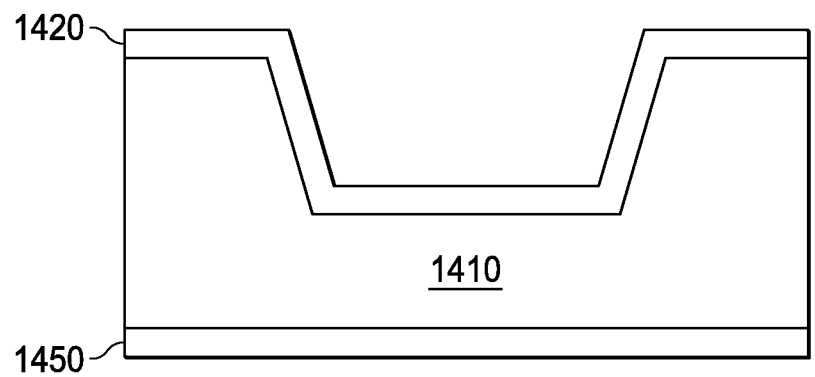

In an alternative embodiment, as illustrated in FIG. 23F, the chip adhesive layer 1420, which comprises a conductive material, is coated over the entire surface of the isolating container 1410. The bottom surface of the isolating container 1410 is coated with a bottom conductive film 1450. In one embodiment, the chip adhesive layer 1420 may be formed in two steps: first a metal layer is coated and then an adhesive is coated over the metal layer.

In various embodiments, the bottom conductive film 1450 and the chip adhesive layer 1420 may be deposited using conventional metal deposition techniques such as vapor deposition, sputter deposition, electro-chemical deposition etc. The bottom conductive film 1450 and the chip adhesive layer 1420 may have a thickness of about 20 nm to about 100 nm and may comprise metals such as silver, gold, platinum, copper etc.

Figure 23G:
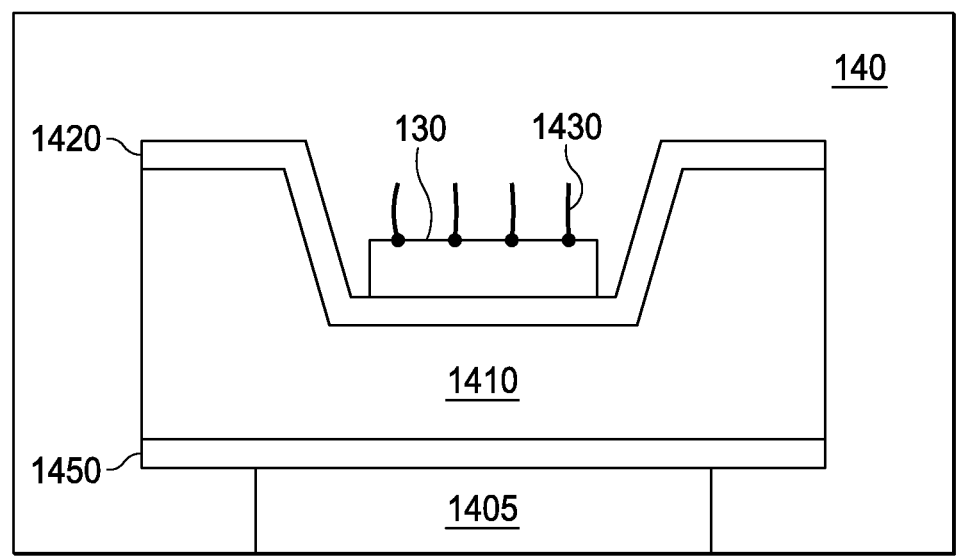

As next illustrated in FIG. 23G, the sensor chip 130 is placed over the isolating container 1410. A lead frame including a plurality of leads and backplane 1405 may be placed under the isolating container 1410. The backplane 1405 may be attached securely to the isolating container 1410, for example, by a soldering process. Wire bonds 1430 are formed by wire bonding or other suitable process to couple the sensor chip 130 with the leads. The package is placed within mold cavity and covered with a mold compound, which after curing forms the mold body 140.

As discussed above, the semiconductor package advantageously does not require expensive processing and is therefore cost effective. The manufacturing process for fabricating the semiconductor package complies with existing package assembly lines. In particular, it may be used in a test-in-strip-handler, which handles a number of devices contained in a single strip or panel in order to increase throughput.

Figure 24:
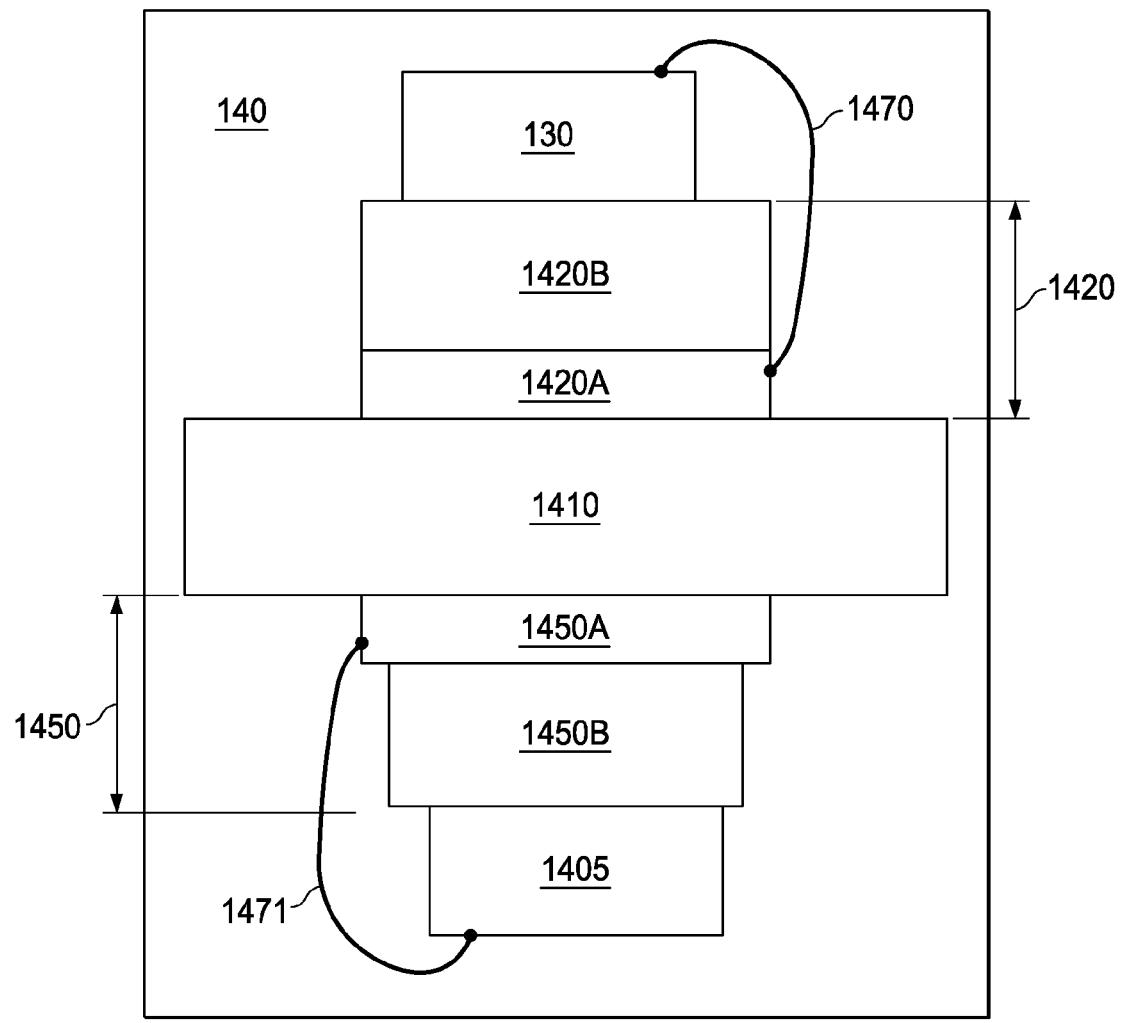
FIG. 24 illustrates a semiconductor package including a planar isolating container in accordance with an alternative embodiment of the invention.

FIG. 24 illustrates a semiconductor package in accordance with an alternative embodiment of the invention.

In this embodiment, as in prior embodiments, the semiconductor package has an isolating container 1410, a sensor chip 130 above the isolating container 1410, a chip adhesive layer 1420 on the top surface of the isolating container 1410, constant node wires 1470 for coupling the chip adhesive layer 1420 to a potential node on the sensor chip 130 and a backplane 1405 under the isolating container 1410. As described previously, the chip adhesive layer 1420 includes a conductive layer 1420A and an adhesive top portion 1420B.

As illustrated, the package may include a bottom conductive film 1450 on a bottom surface of the isolating container 1410 and backplane wires 1471 for coupling the bottom conductive film 1450 to a backplane potential node on the backplane 1405. The bottom conductive film 1450 may comprise a bottom conducting film portion 1450A contacting the isolating container 1410 and an adhesive bottom portion 1450B. The bottom conducting film portion 1450A may be conductive, for example, may be a metal layer or a silicon layer. The adhesive top portion 1420B and/or the adhesive bottom portion 1450B may also be conductive in or more embodiments. An encapsulant, such as a mold body 140 may be disposed around the isolating container 1410, the sensor chip 130, and the backplane 1405. As illustrated, the top surface of the isolating container 1410 may be planar (not structured) with no patterns or recesses.

Embodiments of the invention may be applied to any type of package for semiconductors, in particular to such packages, where a semiconductor die is placed close to a backplane (e.g., electrically or thermally conducting) while requiring a strong isolation between the semiconductor die and the backplane. For example, embodiments of the invention may be used, in case of thermal or current sensors, where a backplane is placed close to the sensor to improve sensitivity but may cause mechanical issues. Embodiments of the invention overcome these mechanical issues while retaining the sensitivity by the use of special structured container.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package comprising:
   a first isolating container comprising a dielectric material, the first isolating container having a first recess thereby forming an inner membrane portion and an outer rim portion, the rim portion being thicker than the membrane portion;
   a first semiconductor chip disposed in the first recess;
   a first backplane disposed under the membrane portion of the first isolating container; and
   an encapsulant disposed around the first isolating container, the first semiconductor chip, and the first backplane, wherein the encapsulant is a different material from the dielectric material of the first isolating container.

2. The package of claim 1, wherein the first isolating container comprises a glass.

3. The package of claim 1, wherein the first isolating container comprises a material selected from the group consisting of organic material, sintered ceramic, and quartz.

4. The package of claim 1, further comprising a top conductive layer disposed on a top surface of the first isolating container between the first semiconductor chip and the first isolating container and a connection coupling the top conductive layer to a potential node on the first semiconductor chip.

5. The package of claim 4, further comprising an adhesive layer disposed between the top conductive layer and the first semiconductor chip.

6. The package of claim 5, wherein the adhesive layer is conductive.

7. The package of claim 4, wherein the top conductive layer is disposed on a top surface of the membrane portion but not a top surface of the rim portion.

8. The package of claim 4, wherein the top conductive layer is disposed on a top surface of the membrane portion and a top surface of the rim portion.

9. The package of claim 4, wherein the top conductive layer is disposed on a top surface of the membrane portion and sidewalls of the first recess but not a top surface of the rim portion.

10. The package of claim 1, further comprising a bottom conductive layer disposed on a bottom surface of the isolating container between the first backplane and the first isolating container and a connection coupling the bottom conductive layer to a backplane potential node on the first backplane.

11. The package of claim 1, wherein the encapsulant comprises a mold compound, and wherein a portion of the mold compound is disposed within the first recess between the first semiconductor chip and the first isolating container.

12. The package of claim 1, wherein the first recess of the first isolating container has bowl shaped sidewalls.

13. The package of claim 1, wherein the first recess of the first isolating container has trapezoidal sidewalls, wherein sidewalls of the first recess of the first isolating container have rounded corners.

14. The package of claim 1, wherein the semiconductor chip comprises a sensor.

15. The package of claim 1, wherein the first isolating container has a step or channel on an outer sidewall.

16. The package of claim 1, further comprising:
   a second isolating container having a second recess;
   a second semiconductor chip disposed in the second recess; and
   a second backplane disposed under the second isolating container.

17. The package of claim 1, further comprising:
   a second recess disposed in the first isolating container;
   a second semiconductor chip disposed in the second recess; and
   a second backplane disposed under the first isolating container.

18. The package of claim 17, wherein the first backplane is coupled to a first current rail node, and wherein the second backplane is coupled to a different current rail node from the first current rail.

19. The package of claim 1, further comprising a circuit board coupled to the first semiconductor chip.

20. The package of claim 1, wherein the dielectric material of the first isolating container has a higher dielectric strength than the encapsulant.

21. The package of claim 1, wherein the dielectric material of the first isolating container has a larger band gap than the encapsulant.

22. The package of claim 1, wherein the dielectric material of the first isolating container has a larger band gap and a higher dielectric strength than the encapsulant.

23. The package of claim 1, wherein the dielectric material of the first isolating container has a higher thermal conductivity than the encapsulant.

24. A semiconductor package comprising:
a glass container having a first recess thereby forming an inner membrane portion and an outer rim portion, the rim portion being thicker than the membrane portion;
a first semiconductor chip disposed in the first recess;
a first backplane disposed under the membrane portion of the glass container; and
an encapsulant disposed around the glass container, the first semiconductor chip, and the first backplane, wherein the glass container has a larger band gap and a higher dielectric strength than the encapsulant.

* * * * *